United States Patent
Chaji et al.

(10) Patent No.: US 12,322,732 B2
(45) Date of Patent: Jun. 3, 2025

(54) CIRCUIT AND SYSTEM INTEGRATION ONTO A MICRODEVICE SUBSTRATE

(71) Applicant: VueReal Inc., Waterloo (CA)

(72) Inventors: Gholamreza Chaji, Waterloo (CA); Ehsanollah Fathi, Waterloo (CA); Bahareh Sadeghimakki, Kitchener (CA); Hossein Zamani Siboni, Waterloo (CA)

(73) Assignee: VueReal Inc., Waterloo (CA)

( * ) Notice: Subject to any disclaimer, the term of this patent is extended or adjusted under 35 U.S.C. 154(b) by 382 days.

(21) Appl. No.: 16/542,026

(22) Filed: Aug. 15, 2019

(65) Prior Publication Data

US 2020/0013761 A1    Jan. 9, 2020

Related U.S. Application Data

(63) Continuation-in-part of application No. 15/892,523, filed on Feb. 9, 2018, now abandoned.
(Continued)

(51) Int. Cl.
*H10H 20/856* (2025.01)
*H01L 25/075* (2006.01)
(Continued)

(52) U.S. Cl.
CPC ......... *H01L 25/0753* (2013.01); *H10D 86/40* (2025.01); *H10D 86/60* (2025.01);
(Continued)

(58) Field of Classification Search
CPC ............. H01L 25/0753; H01L 27/1214; H01L 33/505; H01L 33/60; H01L 33/62; H01L 2933/0041; H01L 2933/0058; H01L 2933/0066; H01L 27/32; H01L 27/3206; H01L 27/322; H01L 27/3248; H01L 27/3251; H01L 27/326; H01L 27/3276;
(Continued)

(56) References Cited

U.S. PATENT DOCUMENTS 5,501,990 A    3/1996  Holm
7,064,356 B2   6/2006  Stefanov et al.
(Continued)

FOREIGN PATENT DOCUMENTS

DE    102008003423 A1    7/2009

OTHER PUBLICATIONS

International Search Report and Written Opinion in International Application No. PCT/IB2019/059903, mailed Feb. 24, 2020 (19 pages).

*Primary Examiner* — Eduardo A Rodela
(74) *Attorney, Agent, or Firm* — NIXON PEABODY LLP

(57) ABSTRACT

An integrated optical display system includes a backplane with appropriate electronics, and an array of micro-devices. A touch sensing structure may be integrated into the system. In one embodiment, an integrated circuit and system is integrated on top of micro-devices transferred to a substrate. Openings in a planarization layer (or layers) may be provided to connect the micro-devices with electrodes and other circuitry. Light reflectors may be used to redirect the light, and color conversion layers or color filters may be integrated before the micro-devices or on the substrate surface opposite to the surface of micro-devices.

2 Claims, 49 Drawing Sheets

Related U.S. Application Data

(60) Provisional application No. 62/808,578, filed on Feb. 21, 2019, provisional application No. 62/768,812, filed on Nov. 16, 2018, provisional application No. 62/746,300, filed on Oct. 16, 2018, provisional application No. 62/482,939, filed on Apr. 7, 2017, provisional application No. 62/456,739, filed on Feb. 9, 2017.

(51) Int. Cl.
*H10D 86/40* (2025.01)
*H10D 86/60* (2025.01)
*H10H 20/851* (2025.01)
*H10H 20/857* (2025.01)
*H10H 20/01* (2025.01)

(52) U.S. Cl.
CPC ...... *H10H 20/8514* (2025.01); *H10H 20/856* (2025.01); *H10H 20/857* (2025.01); *H10H 20/0361* (2025.01); *H10H 20/0363* (2025.01); *H10H 20/0364* (2025.01)

(58) Field of Classification Search
CPC ... H01L 27/3295; H01L 33/346; H01L 33/44; H01L 33/48; H01L 33/50; H01L 33/507
See application file for complete search history.

(56) References Cited

U.S. PATENT DOCUMENTS

| | | | |
|---|---|---|---|
| 7,482,667 B2 | 1/2009 | Guidotti | |
| 7,700,960 B2 | 4/2010 | Kim et al. | |
| 7,723,737 B2 | 5/2010 | Lee et al. | |
| 7,884,543 B2 | 2/2011 | Doi | |
| 8,552,436 B2 | 10/2013 | Bibl et al. | |
| 8,680,552 B2 | 3/2014 | Cho | |
| 8,780,023 B2 | 7/2014 | Ootorii | |
| 9,111,464 B2 | 8/2015 | Bibl et al. | |
| 9,111,949 B2 | 8/2015 | Yu | |
| 9,190,451 B2 | 11/2015 | Hung | |
| 9,263,639 B2 | 2/2016 | Aoki et al. | |
| 9,543,490 B2 | 1/2017 | Seo et al. | |
| 9,865,832 B2 | 1/2018 | Bibl | |
| 9,978,728 B2 | 5/2018 | Lin et al. | |
| 9,991,163 B2 | 6/2018 | Bower | |
| 10,026,722 B1 | 7/2018 | Lo et al. | |
| 10,069,038 B2 | 9/2018 | Kim et al. | |
| 10,084,009 B2* | 9/2018 | Kim | H01L 33/44 |
| 10,395,594 B1 | 8/2019 | Charisoulis | |
| 10,437,402 B1* | 10/2019 | Pan | H01L 23/5387 |
| 10,593,743 B2* | 3/2020 | Son | H01L 25/0753 |
| 10,606,393 B2* | 3/2020 | Cheng | G09G 3/32 |
| 10,707,265 B2* | 7/2020 | Lee | H01L 25/0753 |
| 10,818,819 B2 | 10/2020 | Tsai et al. | |
| 10,902,756 B2* | 1/2021 | Choi | H01L 25/0753 |
| 11,205,677 B2 | 12/2021 | Zou et al. | |
| 11,641,008 B2 | 5/2023 | Lee et al. | |
| 2004/0184270 A1 | 9/2004 | Halter | |
| 2007/0029554 A1 | 2/2007 | Nakamura | |
| 2007/0035241 A1 | 2/2007 | Abe | |
| 2007/0176863 A1 | 8/2007 | Oh | |
| 2007/0284752 A1 | 12/2007 | Lin | |
| 2009/0115705 A1 | 5/2009 | Miller | |
| 2011/0297914 A1 | 12/2011 | Zheng et al. | |
| 2012/0074441 A1 | 3/2012 | Seo et al. | |
| 2012/0256814 A1 | 10/2012 | Ootorii | |
| 2014/0367633 A1 | 12/2014 | Bibl | |
| 2015/0362165 A1 | 12/2015 | Chu | |
| 2016/0276329 A1 | 9/2016 | Bono | |
| 2016/0293586 A1 | 10/2016 | Ghosh | |
| 2016/0372514 A1 | 12/2016 | Chang | |
| 2017/0269749 A1 | 9/2017 | Bok | |
| 2017/0345867 A1 | 11/2017 | Chaji et al. | |
| 2017/0358505 A1* | 12/2017 | Chang | H01L 25/167 |
| 2018/0145225 A1 | 5/2018 | Perzlmaier | |
| 2018/0212051 A1 | 7/2018 | Wu | |
| 2018/0315738 A1 | 11/2018 | Bono | |
| 2018/0374994 A1 | 12/2018 | Ebbecke et al. | |

* cited by examiner

CIRCUIT AND SYSTEM INTEGRATION ONTO A MICRODEVICE SUBSTRATE

CROSS REFERENCE TO RELATED APPLICATIONS

This application is a continuation-in-part of, and claims priority from, U.S. application Ser. No. 15/892,523 filed on Feb. 9, 2018, which claims priority to and the benefit of U.S. Provisional Patent Application Ser. Nos. 62/456,739 filed on Feb. 9, 2017, and 62/482,939 filed on Apr. 7, 2017, each of which application is incorporated herein by reference in its entirety.

This application also claims priority from U.S. Provisional Patent Application Ser. No. 62/746,300 filed on Oct. 16, 2018, Application Ser. No. 62/808,578 filed on Feb. 21, 2019 and Application Ser. No. 62/768,812 filed on Nov. 16, 2018 which are incorporated herein by reference in their entirety.

FIELD OF THE INVENTION

The present disclosure relates to the integration of circuits and systems into a microdevice substrate. Few embodiments of the present disclosure also relates to the integration of color conversion layer(s) into the micro device substrate. Some embodiments of the present disclosure also relates to expanding an area of micro devices or a bonding area of micro devices.

BACKGROUND

One method to improve the system performance is to integrate microdevices into a system substrate. The challenge is transferring millions of these devices and integrating them with circuits for every pixel with proper yield.

An objective of the present invention is to overcome the shortcomings of prior art by providing microdevices integrated with circuits.

SUMMARY

A few embodiments of this description are related to integration of circuits and systems in microdevice substrate. The microdevice substrate may comprise micro light emitting diodes (LEDs), organic LEDs, sensors, solid state devices, integrated circuits, MEMS (microelectromechanical systems), and/or other electronic components.

One embodiment includes light sources sandwiched between two reflective layers with at least one patterned reflective layer. The patterned reflective layer may have a profiled pattern to improve the light output uniformity. There may be other layers between the device and reflective layers.

The receiving substrate may be, but is not no limited to, a printed circuit board (PCB), thin film transistor (TFT) backplane, integrated circuit substrate, or, in one case of optical micro devices such as LEDs, a component of a display, for example a driving circuitry backplane. The micro device donor substrate and receiver substrate patterning may be used in combination with different transfer technologies, including but not limited to pick and place with different mechanisms, e.g. electrostatic transfer head and elastomer transfer head, or direct transfer mechanisms, such as dual function pads and more.

BRIEF DESCRIPTION OF THE DRAWINGS

The invention will be described in greater detail with reference to the accompanying drawings which represent preferred embodiments thereof, wherein.

Use of the same reference numbers in different figures indicate similar or identical elements.

Figure 1:
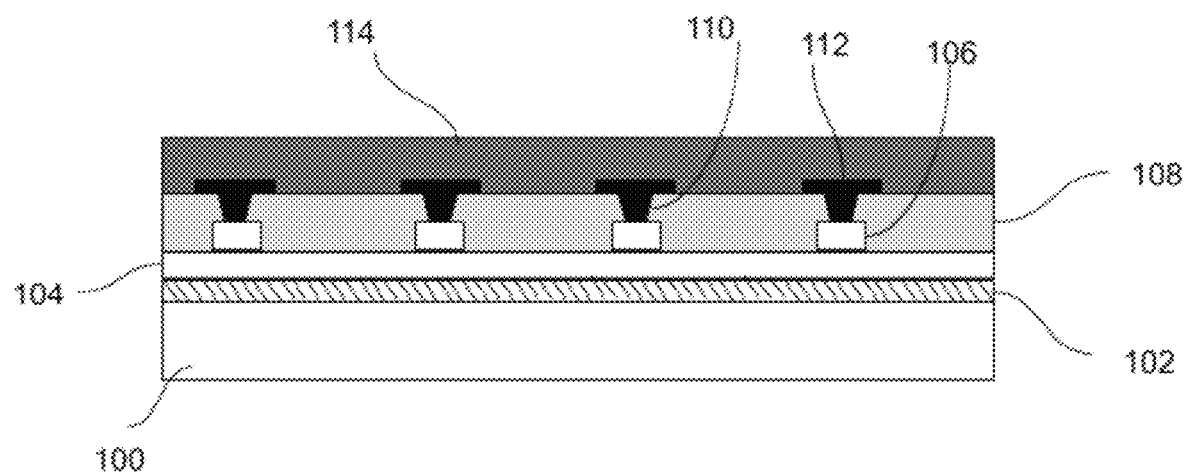
FIG. 1 is a schematic cross-sectional diagram illustrating a system based on integration of circuit to a receiver substrate with integrated micro devices, in accordance with an embodiment of the invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

In this disclosure, pads in a receiver substrate may refer to a designated area in a receiver substrate where a microdevice is transferred to. The pads may be conductive to prepare a connection between the microdevice and the pixel circuits or connections where the pixel circuits may be underneath the pad or on the side of the pad. The pad may have some form of bonding materials to hold the micro device permanently. The pad may be stack of multiple layers to offer a more mechanically stable structure and also better functionality, such as bonding and conductivity capability.

The pads in this description may provide an electrical connection, a mechanical connection, or just a defined area to transfer microdevices. The shape of the pads used in the embodiments are for illustration purpose and may have any arbitrary shape. The position of pads in respect to the pixels may be changed without any effect on the embodiments. The orientation of the group of pads in the pixel may be changed. For example, they may be rotated, shifted or moved to a different position. The pads may have a complex structure comprising different conductive, semiconductor, and/or dielectric layers. The pads may be positioned on top of other structures, such as transistors, in the receiver substrate. Also, the pads may be beside other structures on the receiver substrates.

The shape of light sources used in the embodiments are illustration purposes and devices may have different shapes. The light source devices may have one or more pads on side that will contact the receiver substrate. The pads may be mechanical, electrical, or a combination of both. The one or more pads may be connected to a common electrode or row/column electrodes. The electrodes may be transparent or opaque. The light sources may have different layers. The light sources may be comprised of different materials such as organic, inorganic, or a combination of them.

With reference to FIG. 1, an embodiment of the present invention comprises a substrate 100, a bottom electrode 104, microdevices 106, top electrodes 112, and an integrated circuit layer 114. A buffer layer 102 may be deposited between the substrate 100 and the bottom electrode 104. The buffer layer(s) 104 may be used as delamination layer, as well as to separate the fully integrated system from the substrate 100. The buffer layer 102 may be eliminated, especially when the stacked microdevices 106 and the circuit layer structure 114 remain on the substrate 100. The bottom electrode 104 may be deposited on the substrate 100, and may be patterned for individual microdevices 106 or be used as a common electrode for all of the micro-devices 106. Some extra layers may be deposited on top of the bottom electrode 104 to create bonding places for the microdevices 106. Prior to the microdevices 106 being transferred onto the substrate 100, a planarizing layer 108 is developed over the bottom electrode 104, and over and around the microdevices 106. It is possible that the planarizing layer 108 is comprised of a few different layers and materials, e.g. a dielectric layer. Openings 110 are then formed, e.g. etched, into the planarizing layer 108 down to each microdevice 106. The backplane may then be mounted on the microdevice structure by first disposing or forming top electrodes 112 in the openings 110, whereby the top electrodes 112 may be connected to the micro device 106. The top electrodes 112 may then be used to connect the micro device 106 to an integrated circuit layer 114 interconnecting each of the micro devices 106, via the top electrodes 112, to external power and control systems. The integrated circuit layer 114 may be either TFTs, CMOS chiplet, or another type of integrated circuit. The common electrode 104 may be ignored, if there is no connection for the microdevice 106 to a common voltage level. Before or after depositing buffer layer 102, a touch sensing structure may be placed over the micro-devices 106. The touch sensing structure may be separated from the microdevices 106 and/or their electrode(s) 112 by a dielectric layer. The touch structure may be in the same plane as the micro devices 106. The touch structure may comprise any type, such as capacitive, resistive, pressure, optical, or a combination thereof.

Figure 2A:
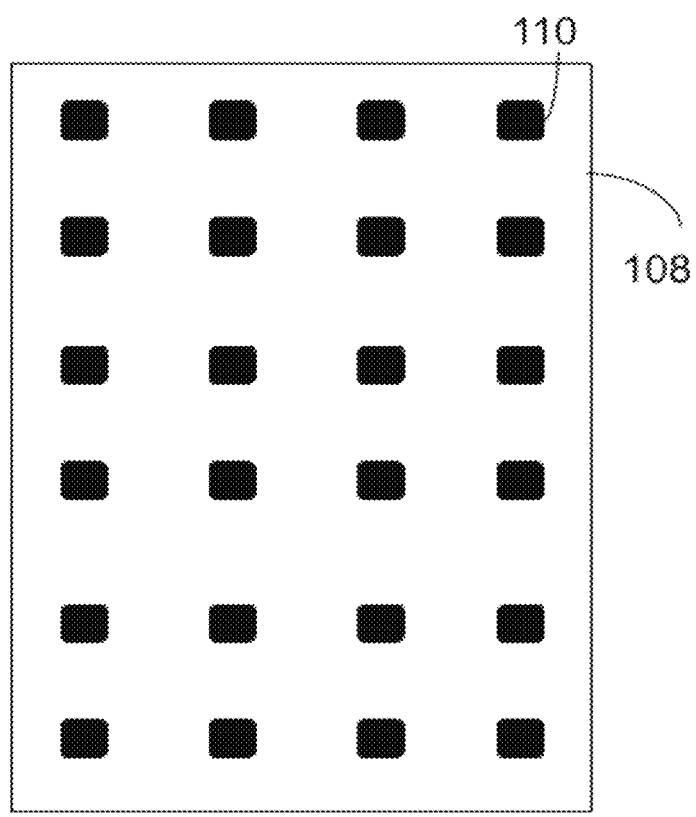
FIG. 2A shows a top view of the receiver substrate with openings to the micro devices, in accordance with an embodiment of the invention.

FIG. 2A illustrates a top view of the planarizing layer 108. The openings 110 that extend through the planarizing layer 108 may be used to receive the top electrodes 112 to connect to the microdevices 106 to the integrated circuit layer 114. The number of openings 110 for each microdevice 106 depends on the number of connections required between the microdevice 106 and the integrated circuit layer 114.

Figure 2B:
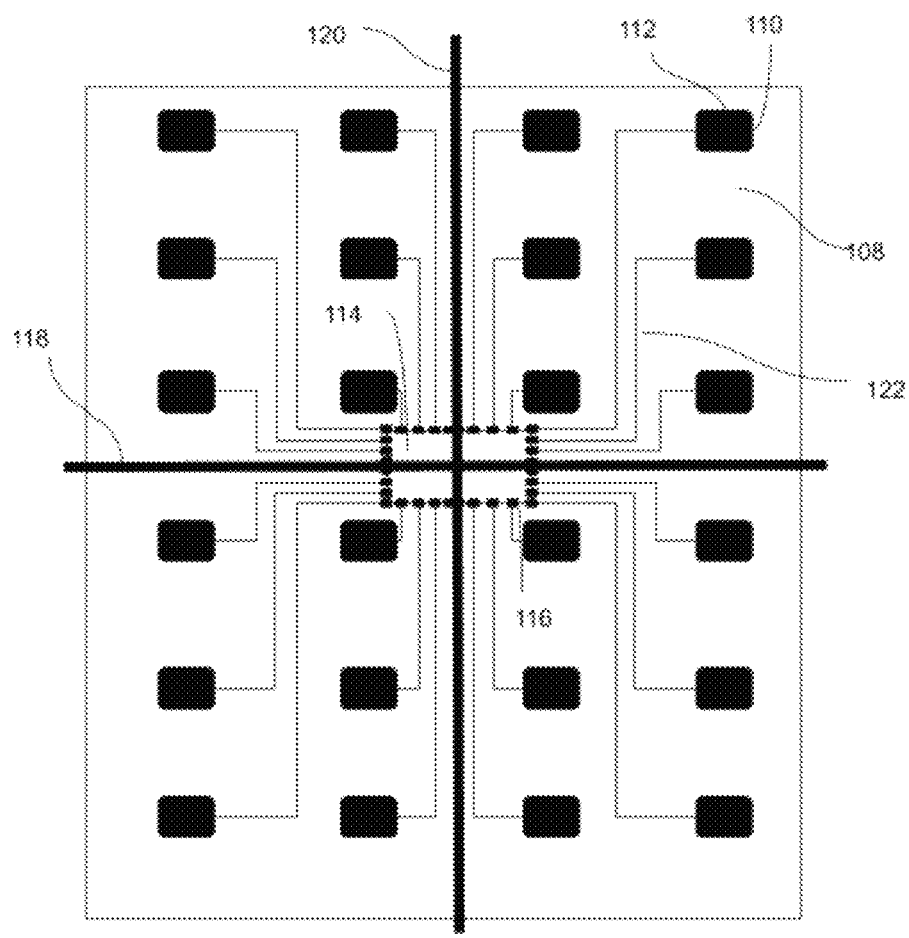
FIG. 2B shows a receiver substrate with micro devices and integrated circuits, in accordance with an embodiment of the invention.

FIG. 2B illustrates connection between the backplane, i.e. the integrated circuit layer 114, and the microdevices 106. Trace circuits 122 extend from the top electrodes 112 in the openings 110 to a pad 116 in the integrated circuit layer 114. There may be common electrodes, e.g. electrodes 120 and 118. The common electrodes 118 and 120 may be directly connected to the top electrodes 112 or the circuit may extend through the trace circuits 122 to avoid any short in the crossing. The integrated circuit layer 114, e.g. the backplane, may be fabricated after the planarizing layer 108, and the backplane may be comprised of a TFT layer.

In alternative embodiments, other layers, such as color conversion, color filter, or other devices may be included, e.g. deposited, between the substrate 100 and the micro device 106. In another embodiment, light distribution layers may be integrated between the micro-devices 106 and the other layers, e.g. integrated circuit layer 114, on top of the micro-devices 106. In another embodiment, other structures, such as a color conversion layer, color filter or other devices may be placed on the underside of substrate 100, opposite to the side where the micro-devices 106 are located. In another embodiment, the bottom electrode 104 may be a distribution layer.

Figure 3:
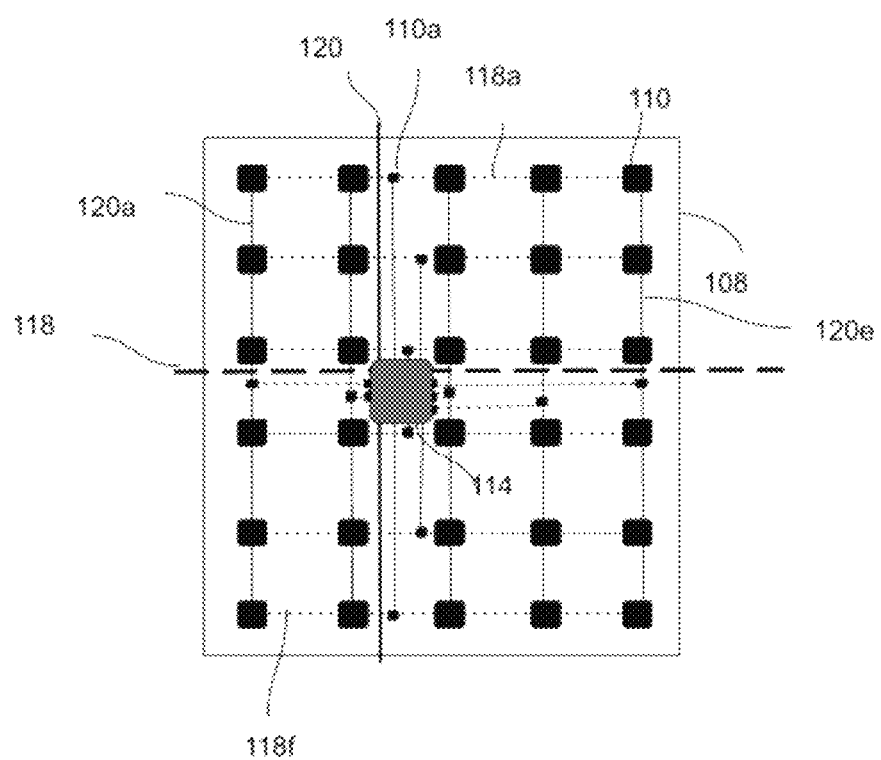
FIG. 3 shows another exemplary structure of integrating circuits into the receiver substrate with micro devices, in accordance with an embodiment of the invention.

With reference to FIG. 3, a receiver structure 108 includes a plurality of the micro devices 106 formed into an array of rows and columns, which are connected with row electrodes 118a to 118f and column electrodes 120a to 120e. The driving and controlling integrated circuit 114 is connected to the columns 120a to 120e and rows 118a to 118f to drive the micro devices 106. The connection is made down through connection via openings 110a in the planarizing layer 108. There may also be general column electrodes 120 and row electrodes 118 for the driving integrated circuit layer 114.

Figure 4A:
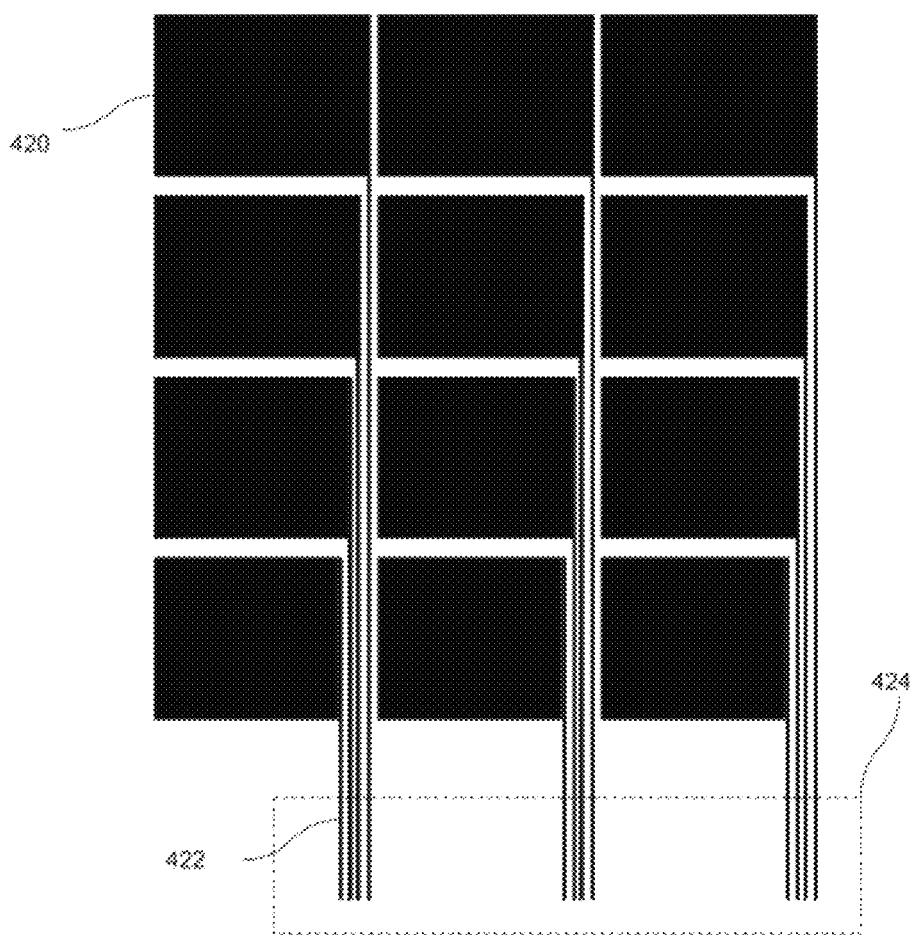
FIG. 4A shows an exemplary structure of connecting devices in a localized integration area to a circuit in an opening, in accordance with an embodiment of the invention.
Figure 4B:
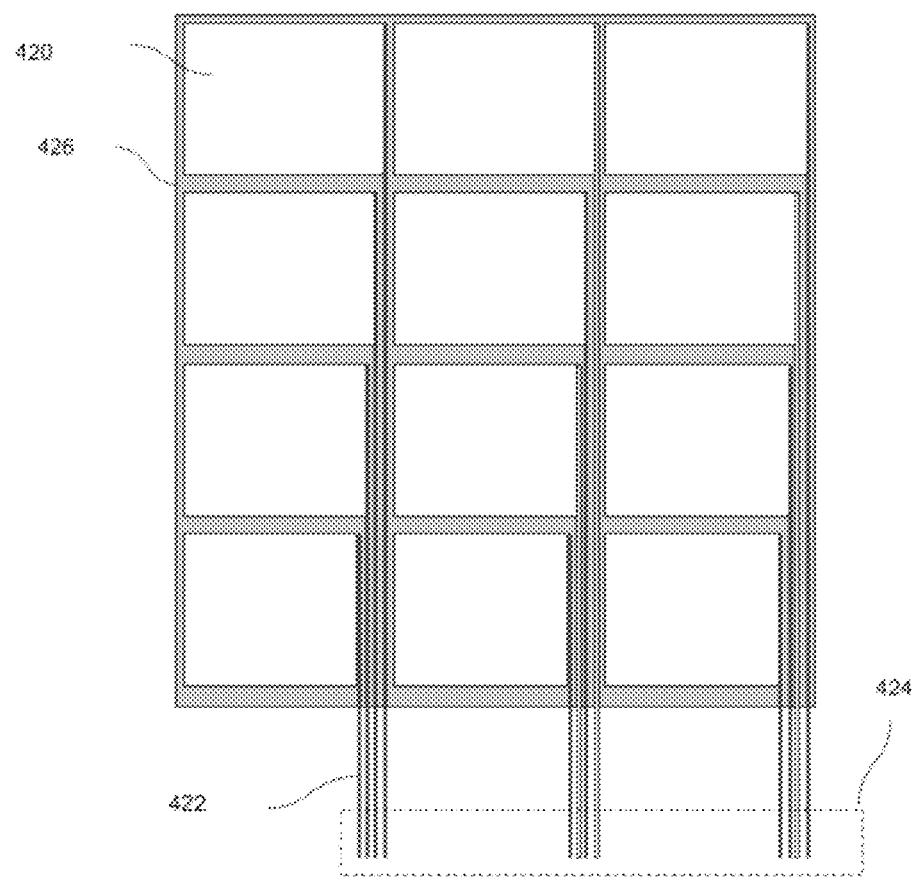
FIG. 4B shows an exemplary structure of connecting devices in a localized integration area to a circuit in an opening which incorporates a reflective layer, in accordance with an embodiment of the invention.

FIG. 4A illustrates a floor plan to integrate microdevices 106 into a backplane integrated circuit layer 114, and to provide access to a controllable electrode for the micro devices 106. The floor plan includes an integration area 420 which can include pads, a landing area, and other structures, and at least one controllable electrode 422. In one embodiment, the controllable electrode 422 and the integration area 420 are transparent to enable light to pass through them for use in particular optoelectronic devices. In another embodiment, for certain optoelectronic devices, the controllable electrode 422 is extended between two columns (rows or adjacent micro devices 106) to an open area 424, where a driver may be integrated. Here, the controllable electrode 422 may be reflective to direct light toward and through the bottom layers, e.g. transparent bottom electrode 104. Although this structure is useful for some applications, such as integrating microLED for lighting, it may be a challenge due to structural non-uniformity for applications, such as backlight units for display applications. FIG. 4B illustrates a structure including an additional continuous reflector layer 426 on top of the integrated circuit layer 114, and a patterned transparent integration area 422. The continuous reflector layer 426 enables more uniform light extraction.

Figure 4C:
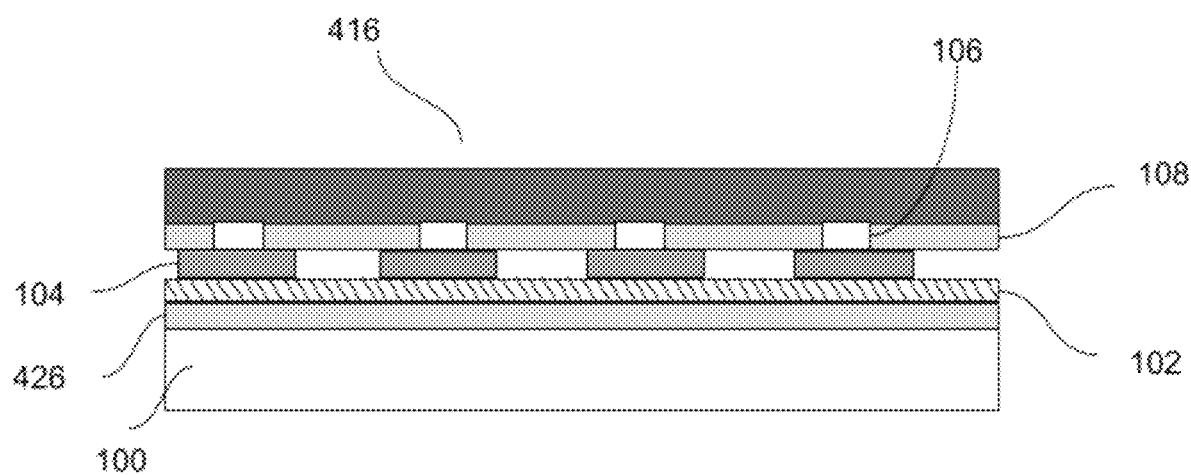
FIG. 4C is a schematic cross-sectional diagram illustrating micro devices and reflective layers, in accordance with an embodiment of the invention.
Figure 4D:
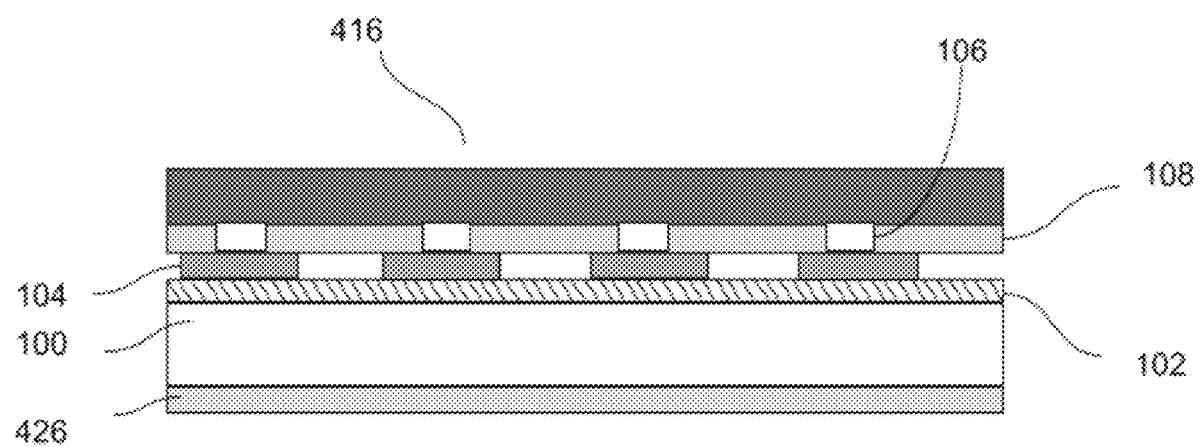
FIG. 4D is a schematic cross-sectional diagram illustrating micro devices and reflective layers, in accordance with an embodiment of the invention.
Figure 4E:
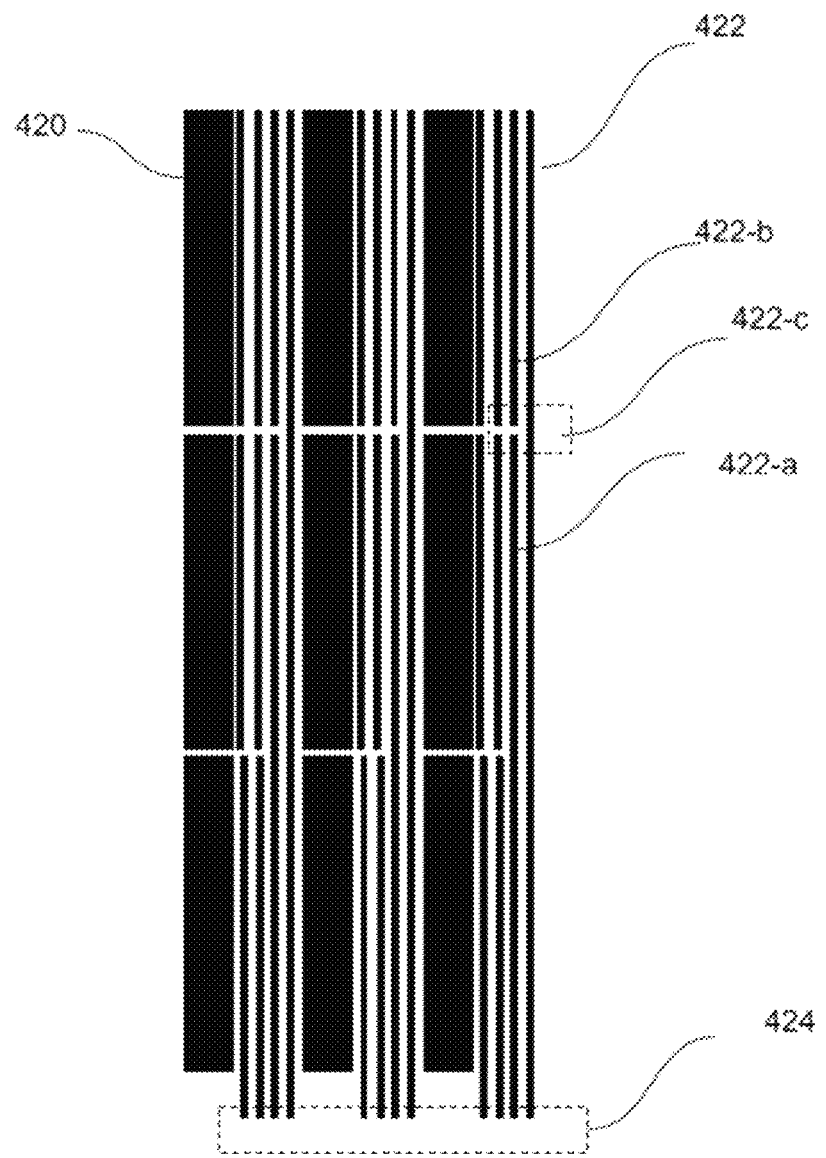
FIG. 4E shows another example with a balanced optical structure, in accordance with an embodiment of the invention.

FIG. 4C illustrates a cross sectional view of one exemplary embodiment of FIGS. 4A-4B. The reflective layer 426 may be deposited or transferred onto the substrate 100 and then the buffer (or dielectric) layer 102 may be deposited on top of the reflective layer 426. Another buffer layer(s) or other structures may be deposited before the reflective layer 426. In the exemplary embodiment of FIG. 4D, the reflective layer 426 may be deposited on the other side of the substrate 100, i.e. opposite the bottom electrodes 104 and microdevices 106. In the illustrated embodiments of FIGS. 4C and 4D, the bottom electrodes 104 are patterned for each microdevice 106, while the top electrode 416 is a single common electrode, either of which may be transparent or reflective. On both the structures of FIGS. 4C and 4D, other layers may be deposited after the micro device 106 integration, such as the filler or planarizing layer 108 around the microdevices 108, and the top electrode 416. Other layers may be included in the top electrode layer 416, such as color conversion. In an exemplary structure, illustrated in FIG. 4E, the integration area 420 and the electrodes 422 are shaped the same across all areas. Here, the electrodes 422 are extended across the active area and to avoid shorting the devices 106, some electrode have at least one opening 422-c to disintegrate the active 422-a part of the electrode from the inactive part 422-b, which is there for uniformity. Accordingly, active and inactive electrodes 422-a and 422-b, respectively, are used to balance the optical uniformity of the local array and control electrode structure.

Figure 5A:
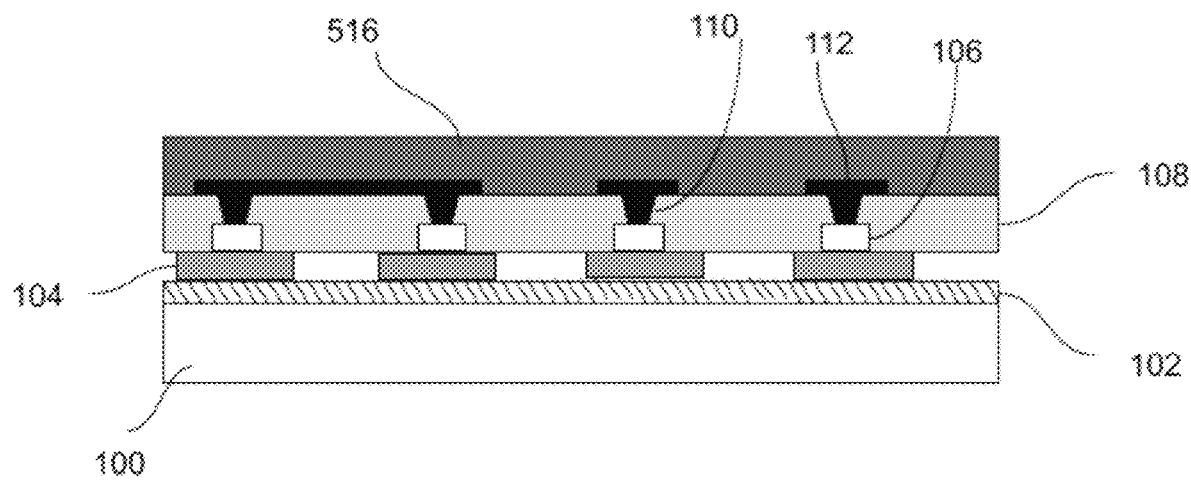
FIG. 5A-5D show cross section of a top structure integrated to the receiver substrate with the microdevices, in accordance with an embodiment of the invention.
Figure 5B:
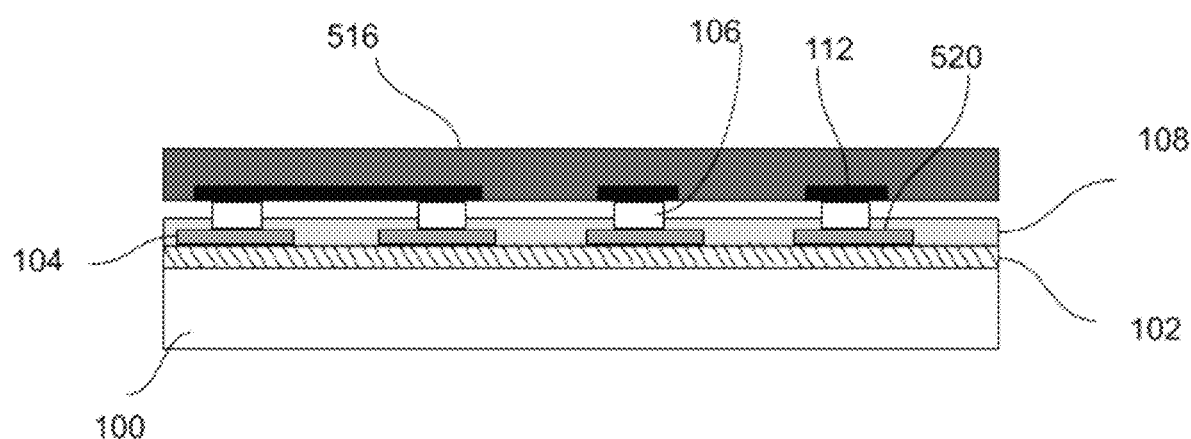
Figure 5C:
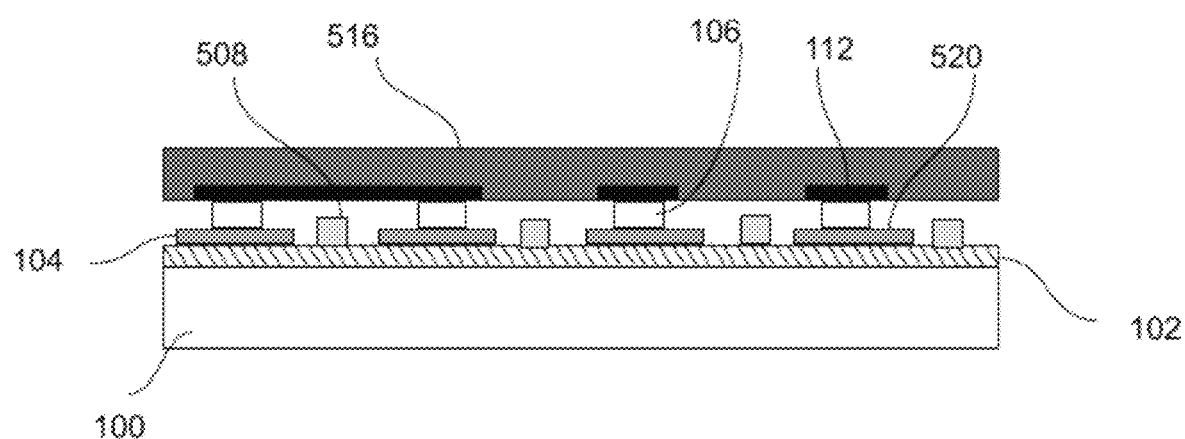
Figure 5D:
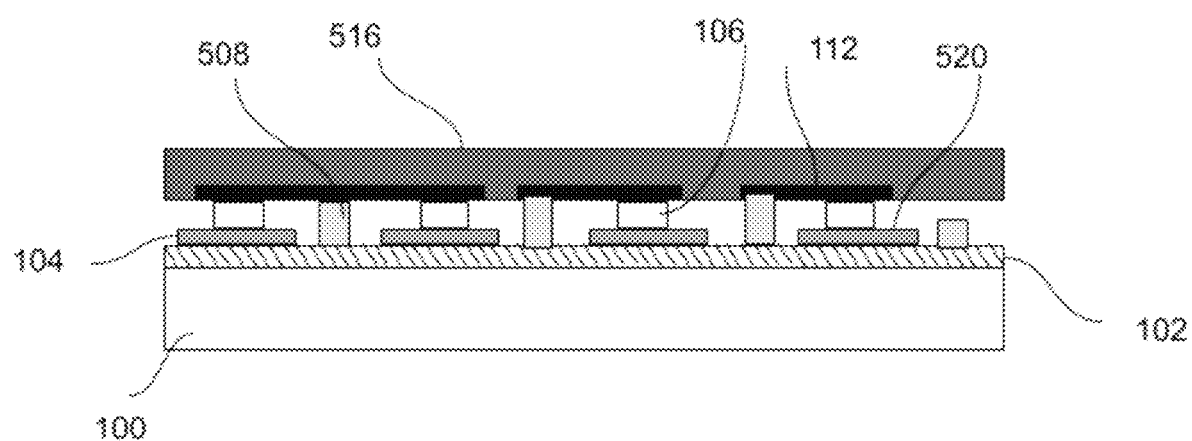

A challenge for a low cost application is the integration of other structures, such as top electrodes 112, into the receiver substrate 100 with integrated micro devices 106. One method of integration is the deposition process as shown in FIG. 5A, as hereinbefore discussed with reference to FIGS. 1 and 4. However, this process may be expensive and require expensive and large equipment. Another method is printing. FIG. 5B illustrates a structure to laminate the top structure 516 including the top electrodes 112. Here, the top structure 516 is fabricated separately with different methods. The receiver substrate 100 with integrated micro devices 106 may be insulated with a filler layer 108, but the filler layer 108 does not cover the microdevices 106, so the exposed microdevices extend upwards from the filler layer 108, eliminating the need for openings 110, and enabling connection to the top electrodes 112. The top structure 516 may then be laminated to the receiver substrate 100. The pads 520 on the receiver substrate 100 or the top structure 516 have layers to provide electrical contact due to pressure and temperature applied during lamination. The materials may be alloyed or annealed to create the electrical conduction pads 520. In another embodiment, further annealing steps may be used after the lamination process. The filler layer 108 may be either deposited or printed onto the receiver substrate 100. In another exemplary structure, demonstrated in FIG. 5C, individual spacers 508 are used on the receiver substrate 100 between micro devices 106, instead of a full filler layer 108. The spacers 508 may include a dielectric or insulating material, thereby eliminating the possibility of shorting the structures on the top structure 516 to unwanted areas on the receiver substrate 100. As illustrated in FIG. 5D, the spacers 508 may extend to the same height of the micro devices 106, e.g. the same height as the bottom electrode 104 and the micro-devices combined, whereby the spacers 508 extend upwardly from the substrate 100 substantially the same distance as the micro-devices 106, so that the spacers 508 may also support the top structure 516. Here, the position of top structure 516 and bottom substrate 100 may be changed without affecting the performance.

Figure 6A:
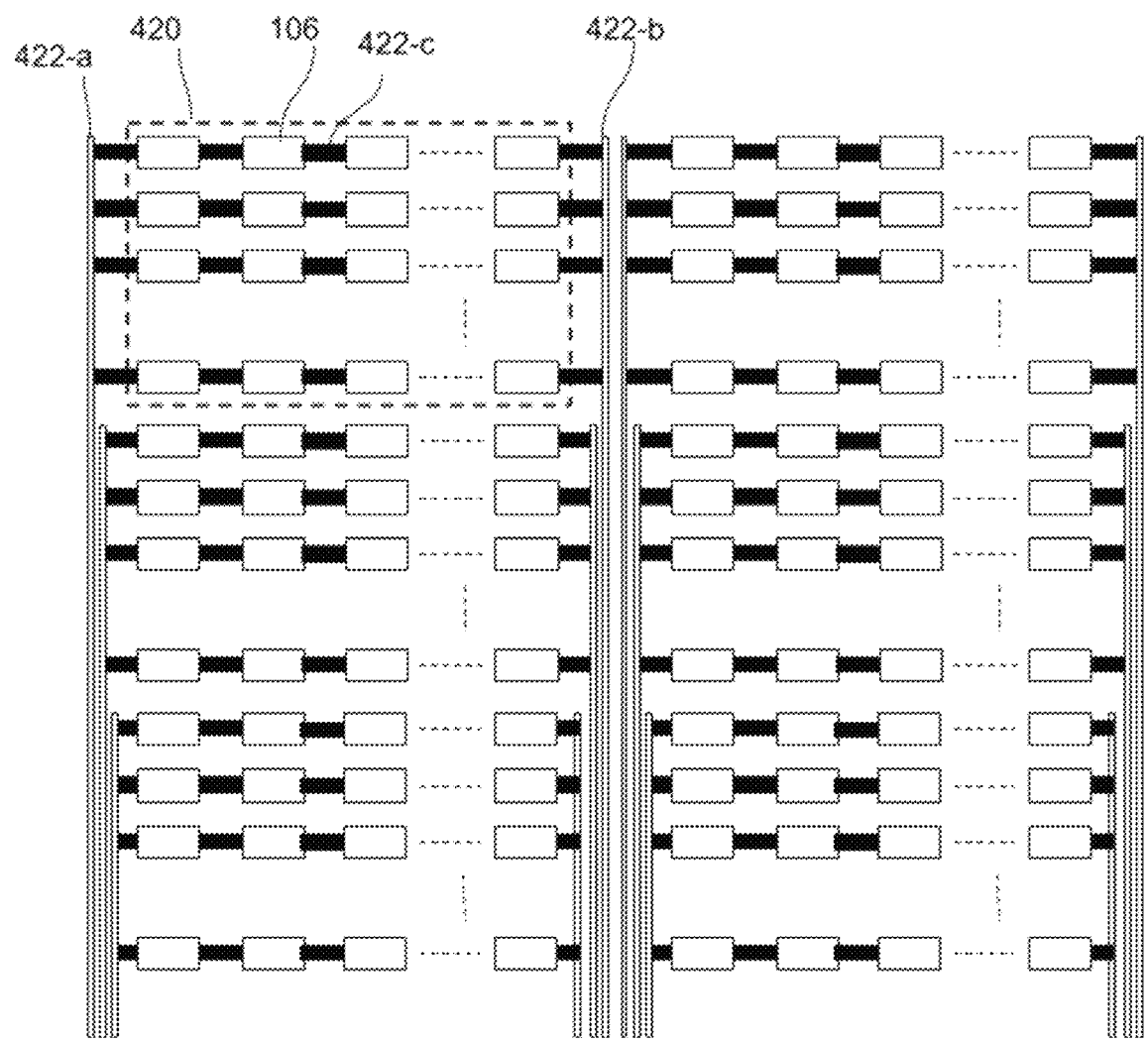
FIG. 6A shows a floor plan of a local array and global array with connections for microdevices that have connections on one side, in accordance with an embodiment of the invention.
Figure 6B:
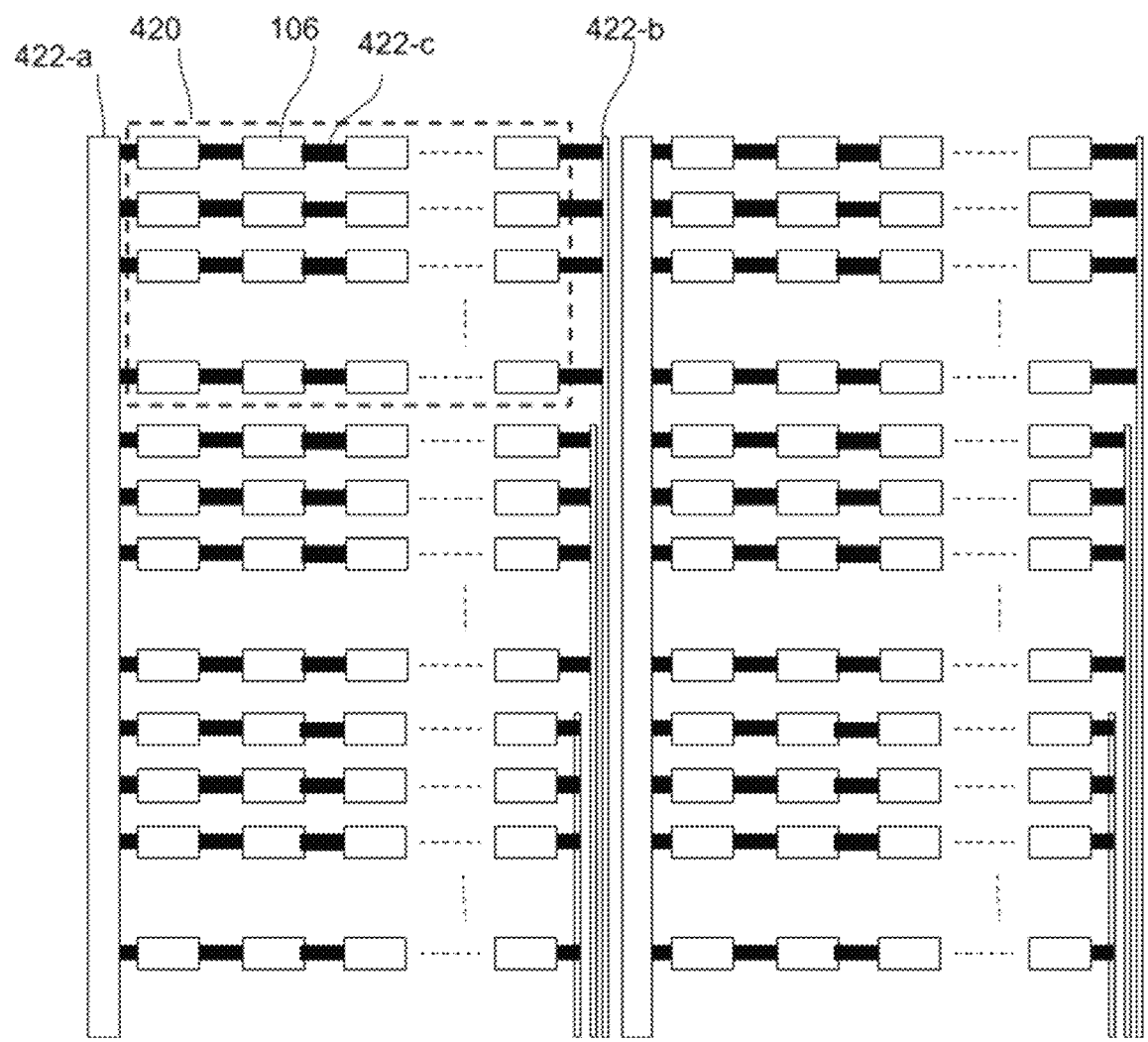
FIG. 6B-6D show another floor plans of a local array and global array with connections and common electrode for microdevices that have connections on one side, in accordance with an embodiment of the invention.
Figure 6C:
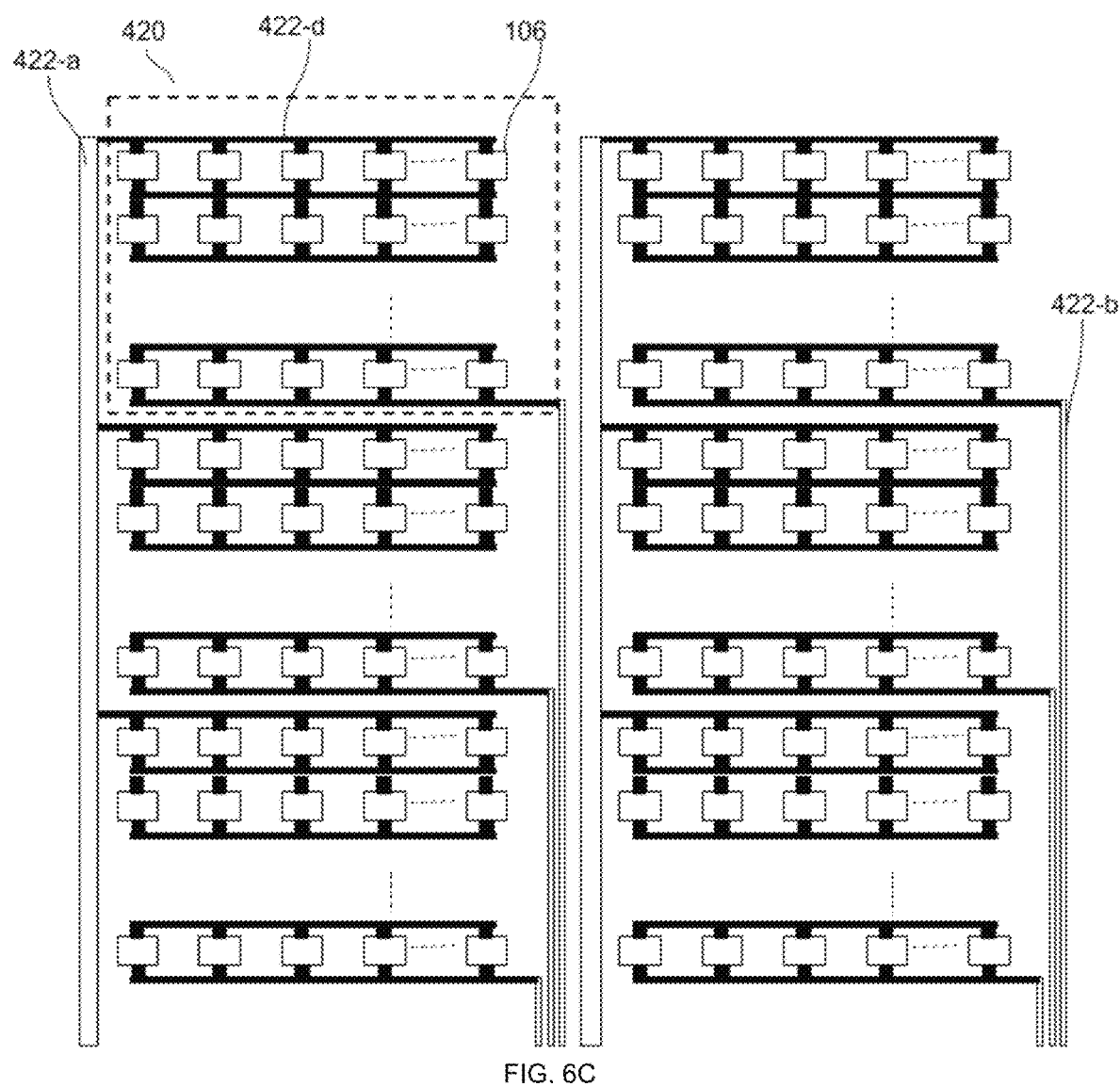
Figure 6D:
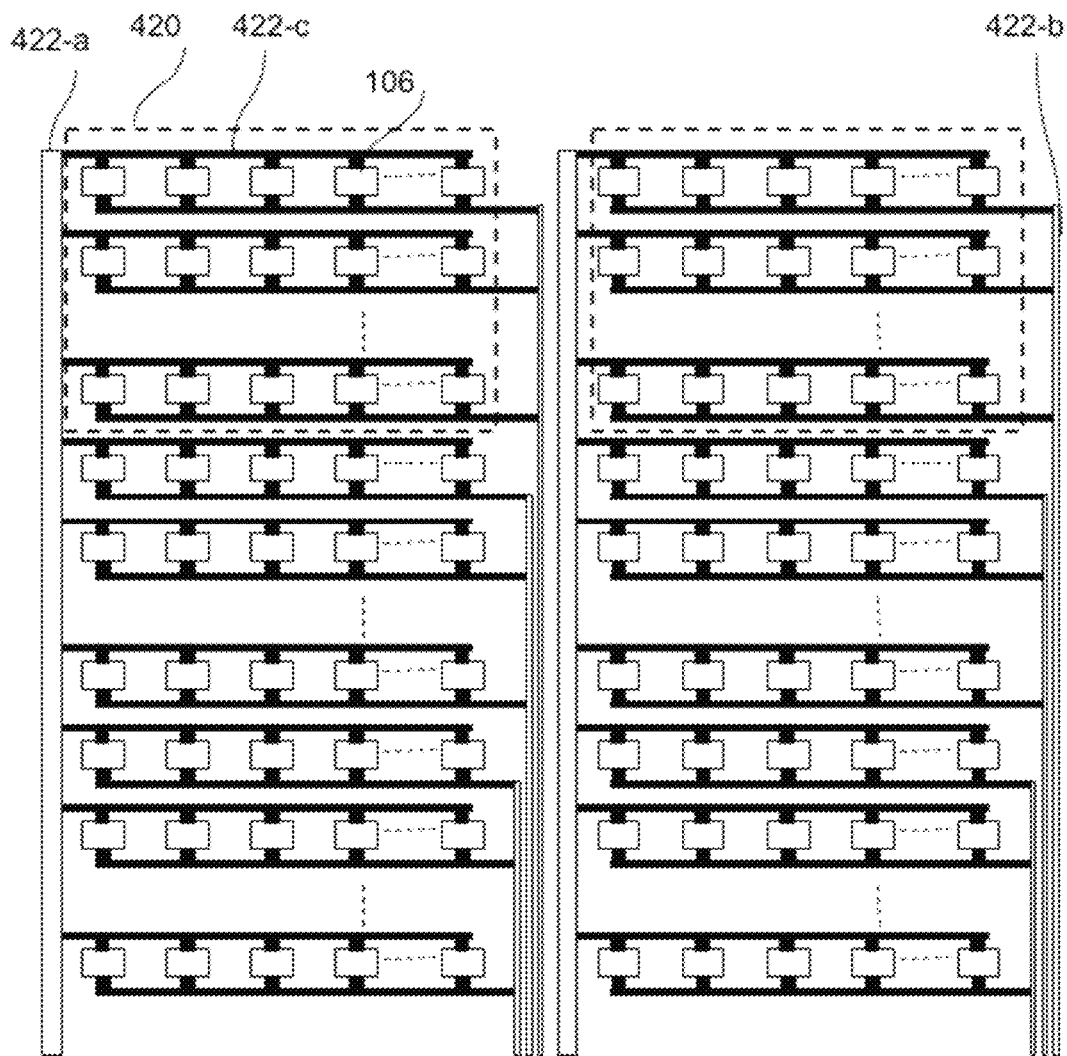

In a structure with micro devices 106 that have a contact on one side, a local and/or global array structure needs to include connections to both electrodes. Here, in a local array, the micro devices 106 may be connected in series or parallel. FIG. 6A illustrates a structure in which the local array is located in an integration area 420. The microdevices 106 are formed in a series structure in the form of rows (or columns) and then connected together to form a parallel structure in the form of columns (or rows). The microdevices 106 may be connected together in series with series electrodes 422c extending therebetween, and they may be connected to a driver through common first and second electrodes 422a and 422b at opposite ends of the arrays of microdevices 106. One of the first and second electrodes 422a or 422b may be a common electrode to multiple integration areas 420 of micro-devices 106, e.g. multiple pixels, as shown in FIG. 6B, to reduce the number of traces connected to a driver. In another embodiment, the first electrode 422a may be on a different side of the integration areas 420 in columns (or rows) to enable sharing the common electrodes 422a between two adjacent columns (or rows). FIG. 6C illustrates another exemplary embodiment to connect the microdevices 106 into parallel and series configuration, in which an array of microdevices 106, i.e. a plurality of rows and columns, in an integration area 420 and interconnected by series electrodes 422c, are connected to a single second electrode 422b. A plurality of integration areas 420 are then connected to a single common first electrode 422a. FIG. 6D illustrates a full parallel structure for a localized array 420. Here, the micro devices 106 in the localized array 420 may be connected to the electrodes 422c to be in parallel. The microdevice/electrode structures in FIGS. 6A-6D may be fabricated in one conductive layer on the substrate 100 to form all possible electrodes and result in very low cost process. It is possible to use single microdevices 106 for each localized array 420 as well.

Figure 7A:
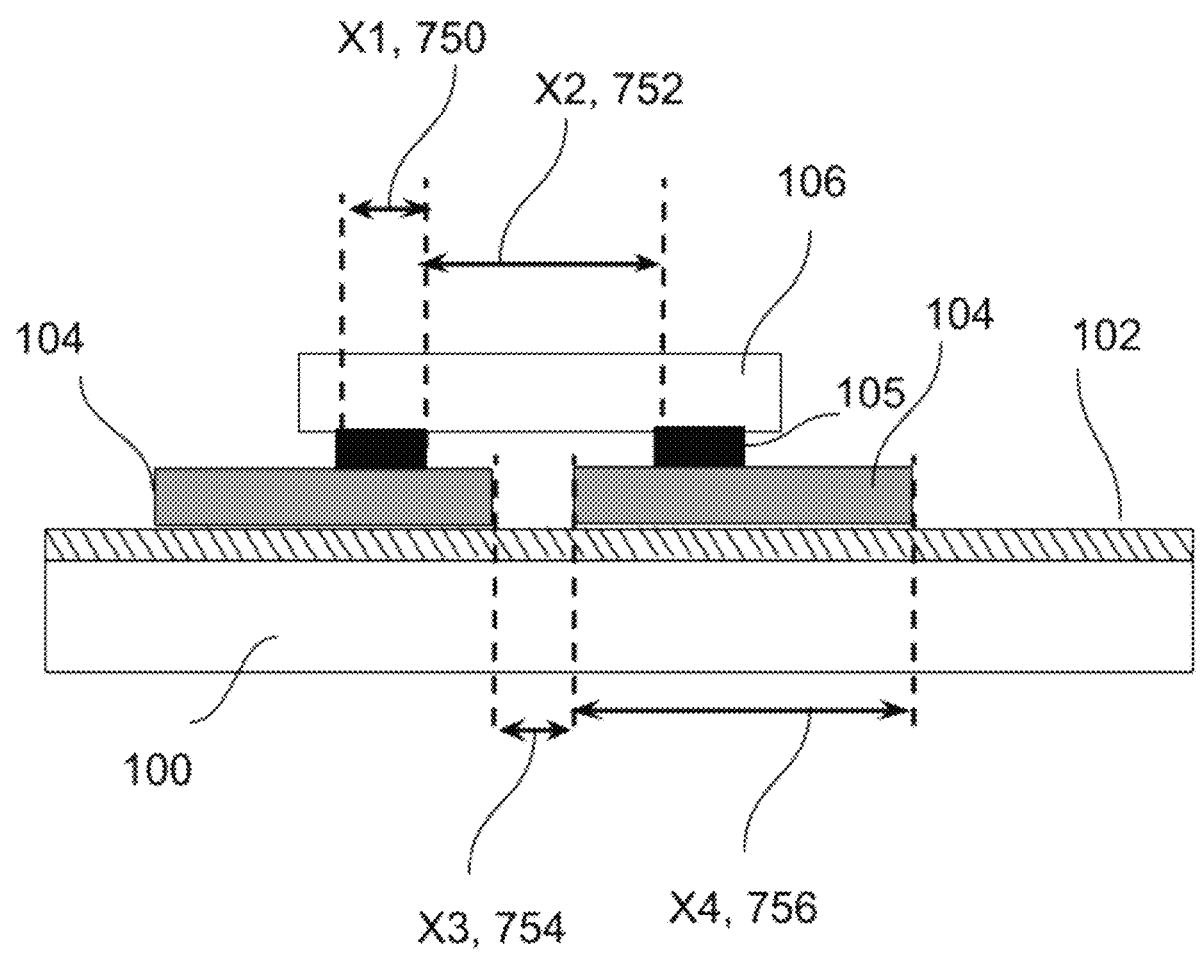
FIG. 7A shows a pad floor plan for a microdevice with two pads, in accordance with an embodiment of the invention.

FIG. 7A illustrates an embodiment in which multiple electrodes 104 and pads 105 are disposed on the receiver substrate 100 based on a two pad microdevice 106. The size of the electrode 104 is X4 756 and a distance between two electrodes in X3 754. Similar structures may be used for multiple pads 105, each with a pad size of X1 750. The distance between the two pad locations on the receiver substrate 100 should be smaller than X2−2Dx−2Bx, where X2 752 is the distance between the electrode pads 105 of the micro devices 106, Dx is the transfer alignment accuracy of the microdevice 106, and Bx is the minimum size required for a proper bonding between pads 105 on the receiver substrate 100 and on the micro device 106.

Figure 7B:
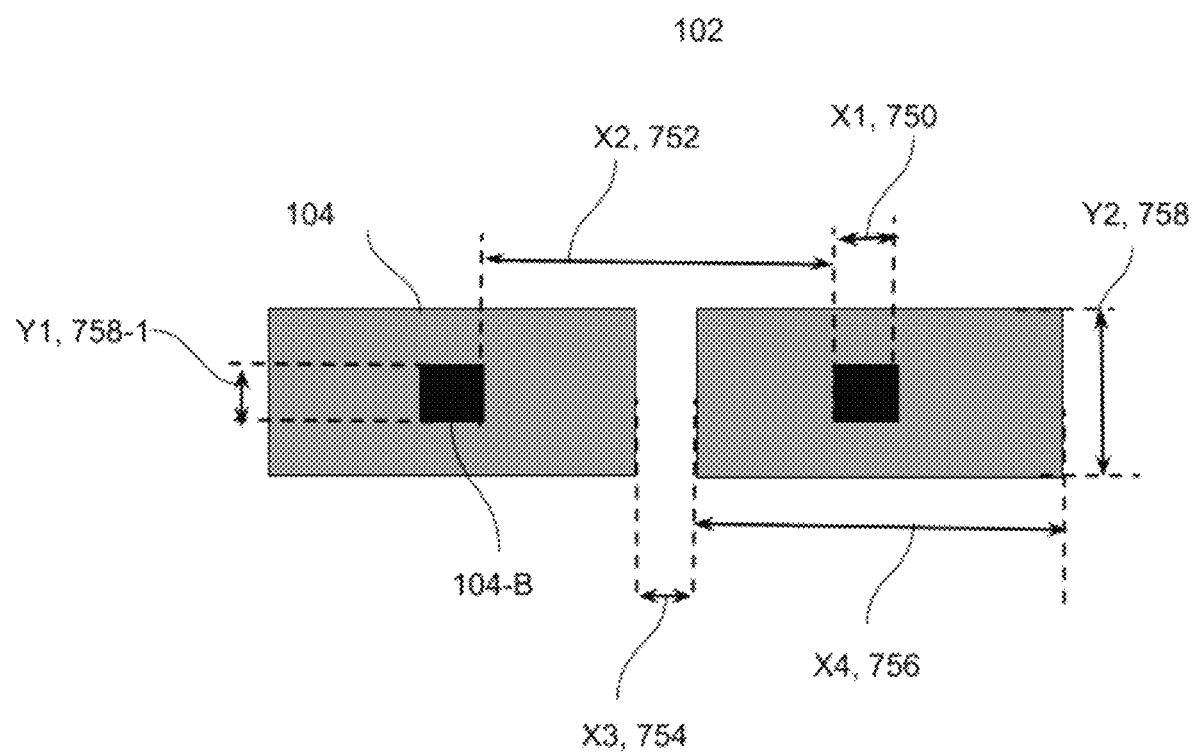
FIG. 7B shows a top view of a pad floor plan for a microdevice with two pads, in accordance with an embodiment of the invention.

FIG. 7B illustrates a top view of the embodiment of FIG. 7A. The size of the receiver pad 105 in the X direction is larger than X1+2Dx−Db. Here, the size of the receiver pad 105 in the Y direction is different from the X direction, i.e. should be larger than Y1+2Dy−Db, where Y1 758-1 is the size of the micro device pad 105 in the Y direction, Dy is the transfer alignment accuracy in the Y direction and Db is the minimum bonding overlap. The size of the bottom electrode 104 in the Y direction is Y2 758.

According to an embodiment for a pad design on the receiver substrate 100, the pad size is larger than the "pad size of micro devices+2×transfer alignment accuracy−minimum bonding overlap".

According to another embodiment for a pad design on the receiver substrate 100, the distance between the pads on the receiver substrate 100 is smaller than the "distance between pads of a micro device−2×transfer alignment accuracy−pad size of micro device+minimum bonding overlap".

The localized arrays 420 are then connected through the common electrodes 422a to form the global array. Each localized array 420 may be controlled separately through the second controllable electrode 422b.

Figure 8A:
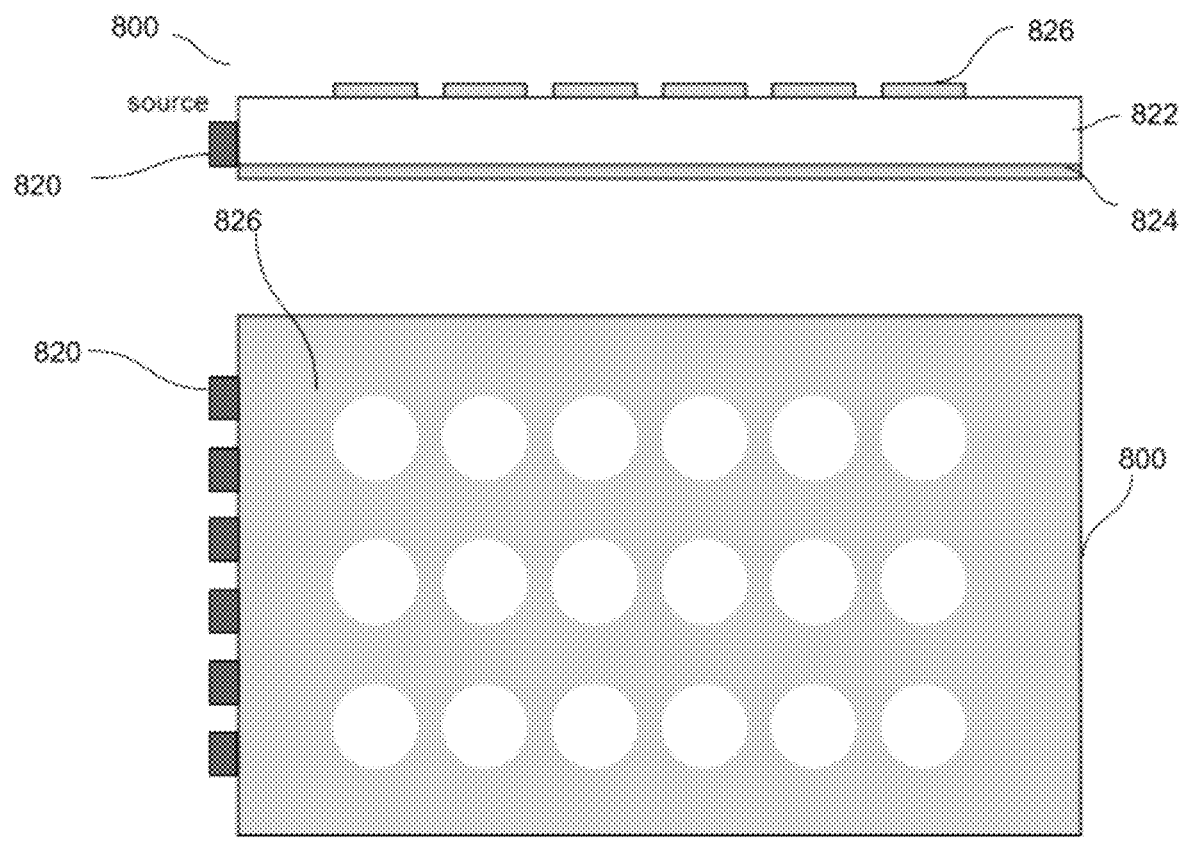
FIG. 8A shows a light guide based on two reflective layers with one that is patterned.
Figure 8B:
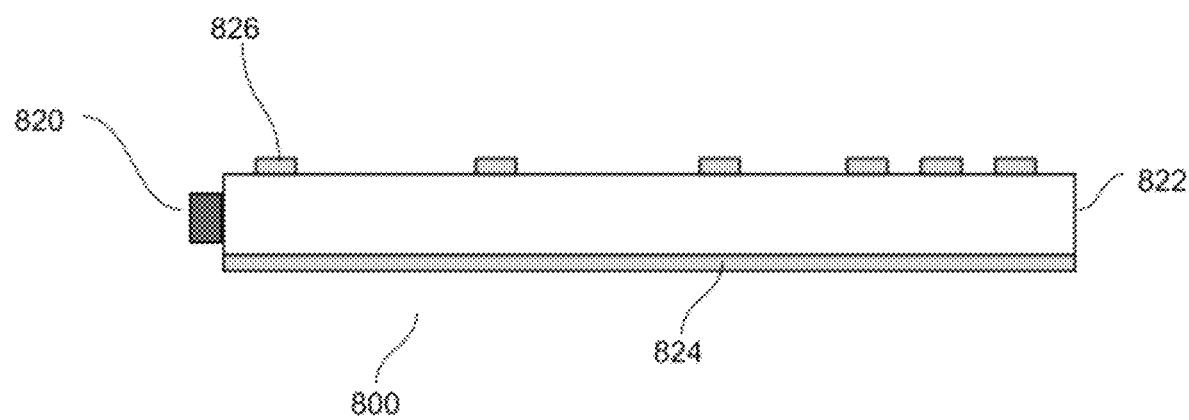
FIG. 8B shows a patterned reflective layer with a gradient profile, in accordance with an embodiment of the invention.

An embodiment of a light guide plate (LGP) 800 utilizing the integrated system in accordance with the present invention, illustrated in FIGS. 8A and 8B, comprises a backlight plate structure in which the light from one or more light sources 820 is directed in a substrate 822, which may include one or more of the following: the substrate 100, the planarization layer 108, the bottom electrode 104, the top electrode 112, and the integrated circuit layer 114. The structure is developed by depositing (or another form of forming) a reflective layer 824 on one side of the substrate 822 and an array of reflective patterns 826, e.g. circles or another suitable shape, on the other, e.g. opposite, side of the substrate 822 as shown in FIG. 8A. The pattern also may also be a negative image of what is shown in FIG. 8A, i.e. circular or other suitably shaped openings in FIG. 8B. In one case, the patterned reflective layer 826 may be deposited on separate substrate and laminated to the first substrate 822. This structure may be used for other embodiments described here as well.

In order to manipulate the angle of light beams inside the substrate 822, the top and/or bottom sides of the substrate 822 before and/or after the metal deposition of layers 824 and 826 may be textured using mechanical or chemical methods. The textures may have a random texture or they may have certain patterns engineered to increase the efficiency of the backlight plate. The array of reflective patterns 826 may be uniform or the array of reflective patterns 826 may have a gradient depending on the position, number, or distribution of the light sources, e.g. spaced farther apart when proximate to the light source 820 and spaced closer together when remote from the light sources 820, as shown in FIG. 8C. In one embodiment, the light sources 820 may be LEDs installed in one side edge of the substrate 822. In addition, the substrate 822 may have any thickness independent of the height of the light source 820. Optical means may be used to prevent the escape of light beams when the height of the light source 820 is larger than the thickness of the substrate 822. In one case, the substrate 822 may be comprised of a flexible PEN plastic and the metallic layers 824 and 826 may be comprised of one or more of aluminum and silver layers deposited using sputtering or printed using screen printing systems.

Figure 9A:
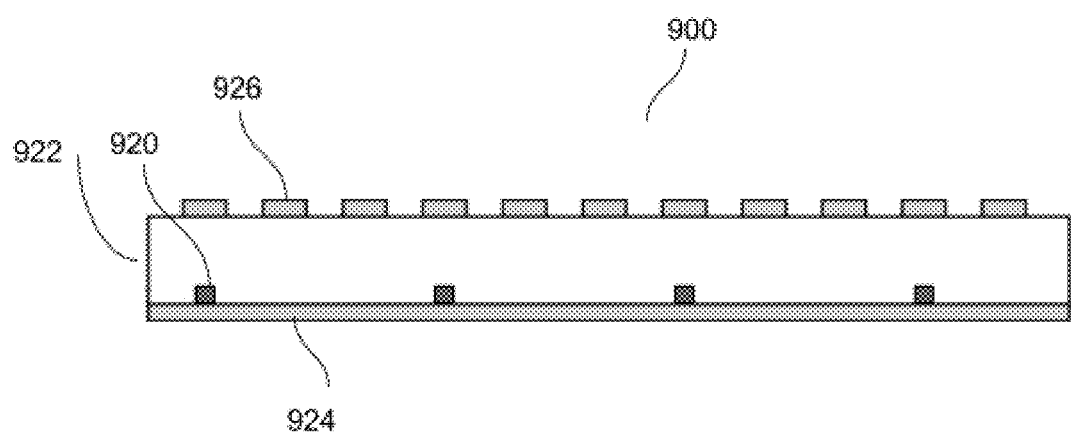
FIG. 9A shows a light source sandwiched between two reflective layers with at least one that is patterned, in accordance with an embodiment of the invention.
Figure 9B:
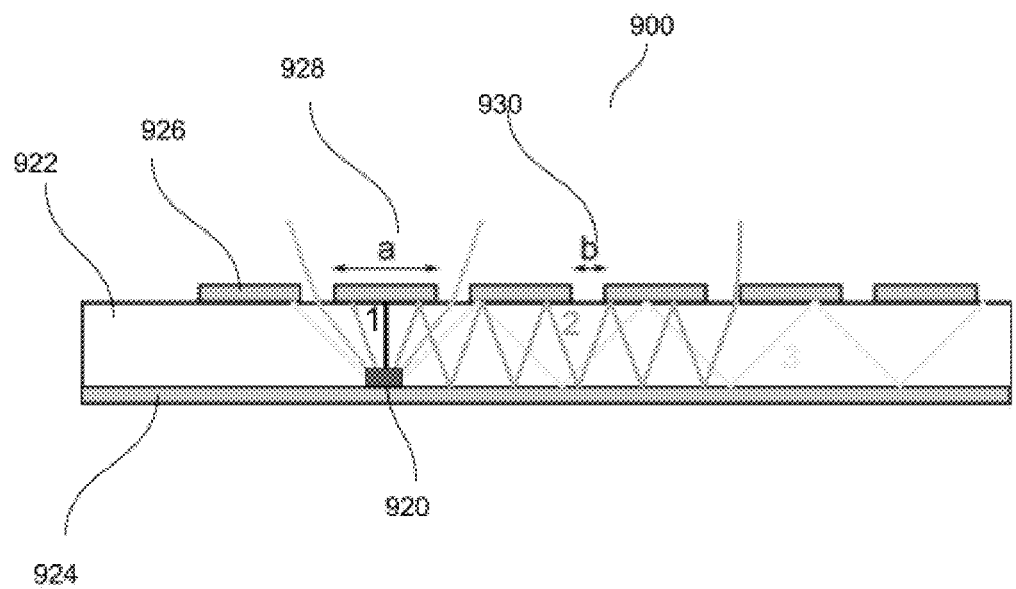
FIG. 9B shows exemplary ray tracing of the light source output in the structure of FIG. 9A, in accordance with an embodiment of the invention.
Figure 9C:
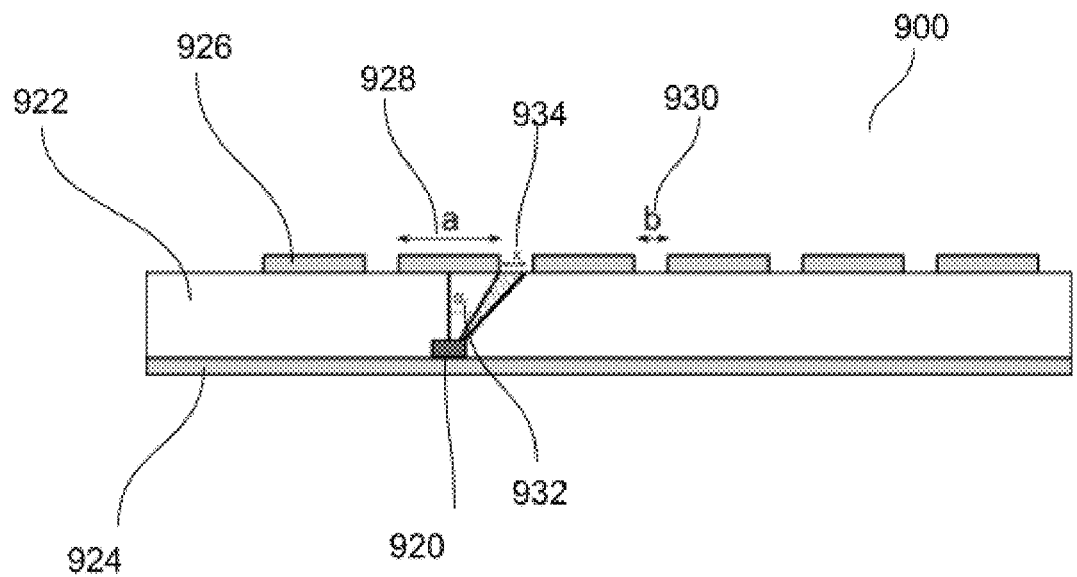
FIG. 9C shows some of the critical parameters of the structure in FIG. 9A, in accordance with an embodiment of the invention.

According to another embodiment of the present invention, an LGP 900 illustrated in FIGS. 9A to 9C, includes light sources 920, which may be distributed on one side of a substrate 922, with the fully reflective layer 924 on one side of the substrate 922, and a partially patterned reflective layer 926 on the opposite side of the substrate 922, as shown in FIG. 9A. In this case, the light sources 920 may or may not be aligned with the reflective patterns 926 on the other side of the substrate 922. The substrate 922 may be a filling layer, e.g. dielectric, or just an air gap with spacers between the two reflective layers 924 and 926. The substrate 922 may include one or more of the following: the substrate 100, the planarization layer 108, the bottom electrode 104, the top electrode 112, and the integrated circuit layer 114. Any of the previous methods may be used here for spacer or passivation layers. There may be another substrate on either side of the reflective layers 924 and 926. Either of the reflective layers 924 and 926 may be part of either electrode for the sources 920 as well. Using this scheme, one can increase the light extraction efficiencies by distributing the light sources 920 on the surface of substrate 922 of the reflective layer 924, instead of using an edge-lit scheme.

FIG. 9B illustrates an example of beam ray propagation of the aforementioned embodiment. The patterned reflective layers 926 may be a negative image of what is shown, i.e. with a reflective sheet with transparent openings, instead of transparent spaces between reflective shapes. Also, the patterns 926 may have a different profile, such as gradient around the light source 920, to compensate for the light non-uniformity caused by individual point source devices. On top of the LGP 900, e.g. any layer 924 or 926, there may be other structures, such as a color conversion layer deposit, laminated or stacked thereon. In one embodiment, a color conversion layer may be disposed on each light source 920. As an example, assuming smooth surfaces and interfaces, positioning of the metallic patterns 926 may be optimized for 1) maximum extraction of the lights from the individual light sources 920 and 2) propagation of the light across the substrate 922 for uniform illumination.

In an example calculation, both top and bottom surfaces/interfaces of the substrate 922 are assumed to be smooth. Depending on a dimension "a" 928 of a shape in the reflective pattern 926, a dimension "b" 930 of a transparent opening in the reflective pattern 926, and a light beam angle $\alpha$ 932, beams with angles larger than minimum angle $\alpha_1$ to avoid the closest reflective pattern, but less than a critical angle $\alpha_c$ of light exiting light source 920, will exit the light guide plate (LGP) 900 from the nearest opening x 934.

Accordingly, the critical distance for escaping light $x = d \times \tan(\alpha_c) - (a/2)$ OR $\tan(\alpha_c) = (a/2 + x)/d$.

The minimum angle for escaping light is defined by $\tan(\alpha_1) = (a/2)/d$ and the beam angle relating to the critical distance x 934 is the critical angle minus the minimum angle or $\alpha_x = \alpha_c - \alpha_1$. If x>b the beam angle relating to escaping light will be less than the critical distance x, whereby the escaping angle will be $\alpha_x = \tan^{-1}(a/2+b)/d) - \tan^{-1}(a/2d)$.

In an ideal case, any beam with angles greater than the critical angle $\alpha_c$ or the escape angle $\alpha_x$ when x>b, will be trapped inside the LGP 900, e.g. beam 3 in FIG. 9C. Beams with angles less than $\alpha_c$ will exit the LGP 900 either through the nearest opening 934 or the subsequent openings depending on the launch angles, the reflective pattern dimension "a" 928, and the gap dimension "b" 930.

Texturizing the bottom reflective surface and/or the top surface of the substrate 922 optimizes the propagation of light, and results in a uniform light beam extraction in the areas between two adjacent light sources 920. In another embodiment, instead of texturing the top surface of the substrate 922 of the LGP 900 (shown in FIG. 5) before pattern deposition, this process may be performed after pattern formation. Consequently, only areas denoted by "b" are texturized. In another embodiment, the top surface of the substrate 922 may be texturized after pattern deposition of the patterned reflective layer 926, and the bottom surface of the substrate 922 may be textured before metal blanket deposition of the reflective layer 924.

Figure 10A:
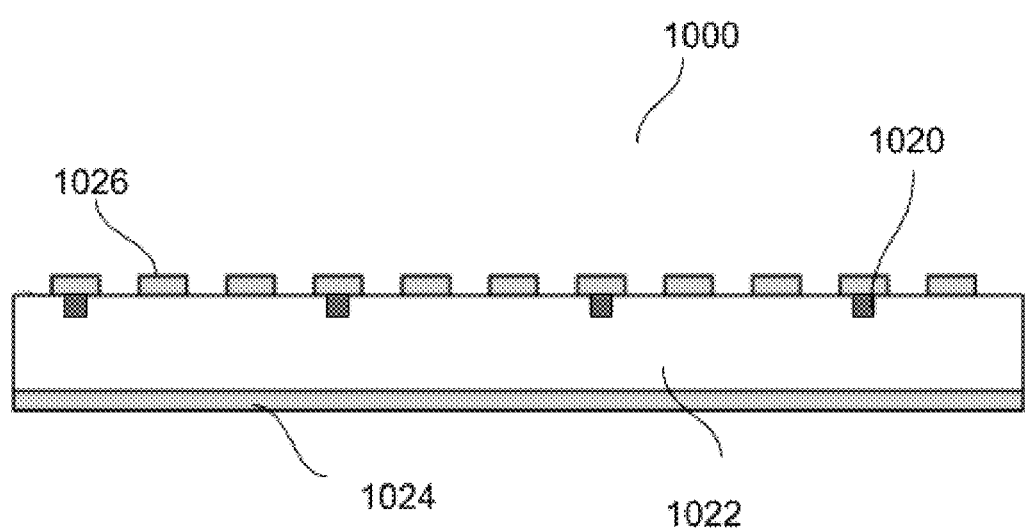
FIG. 10A-B show cross for light source sandwiched between reflective layers to create uniform surface emitting light source, in accordance with an embodiment of the invention.

In another embodiment, as shown in FIG. 10A, an LGP 1000 includes light sources 1020, which may be positioned on a top surface of a substrate 1022, underneath reflective patterns 1026 and on an opposite side to the reflective layer 1024.

Figure 10B:
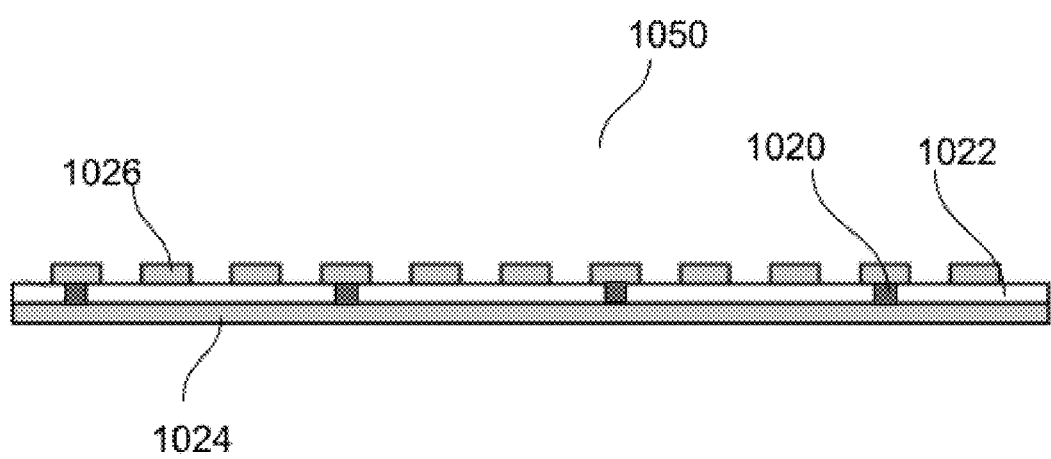

In another embodiment, shown in FIG. 10B, an LGP 1050 includes a height, which is the same as the height of the light sources 1020, or the light sources 1020 are installed in holes embedded into the substrate 1022, which may include one or more of the following: the substrate 100, the planarization layer 108, the bottom electrode 104, the top electrode 112, and the integrated circuit layer 114. In this scheme, the light beams come from the side of the light source 1020. For LED light sources, the top and bottom reflector layers 1026 and 1024 may be part of the electrodes for the LED contacts as well. Similar to other embodiments, top and bottom surfaces of the substrate 1022 may be texturized before or after metal deposition of the reflective layers 1024 and 1026. In this example a dent (or a hole) is made in the substrate 1022 and after placing LEDs 1020, they are secured in place by epoxy or other means of curable materials.

Figure 11A:
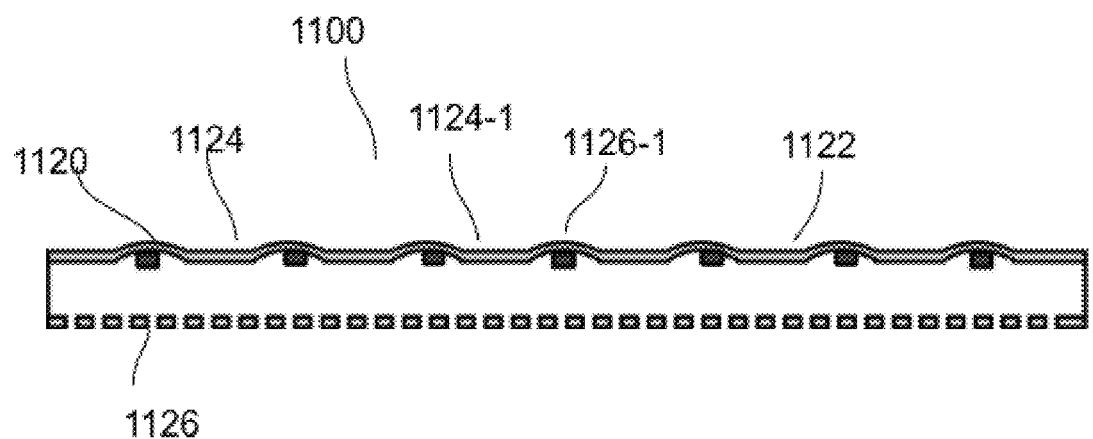
FIG. 11A-C show other embodiments for light source sandwiched between reflective layers to create uniform surface emitting light source, in accordance with an embodiment of the invention.

In another embodiment the top surface of a substrate 1122 may have concave or convex mirror structures to further enhance the uniform light extraction from an LGP unit 1100. As shown in FIG. 11A, each LED 1120 is placed between the focal point (F) of a concave structure 1126-1 and the mirror 1124-1. The concave structures 1124-B additionally facilitate the light propagation along the LGP 1100. In this case, the LEDs 1120 may be on top or bottom side of the substrate 1122, i.e. proximate to either reflective layer 1124 or 1126, depending on the light source height and the overall thickness of the LGP 1100.

Figure 11B:
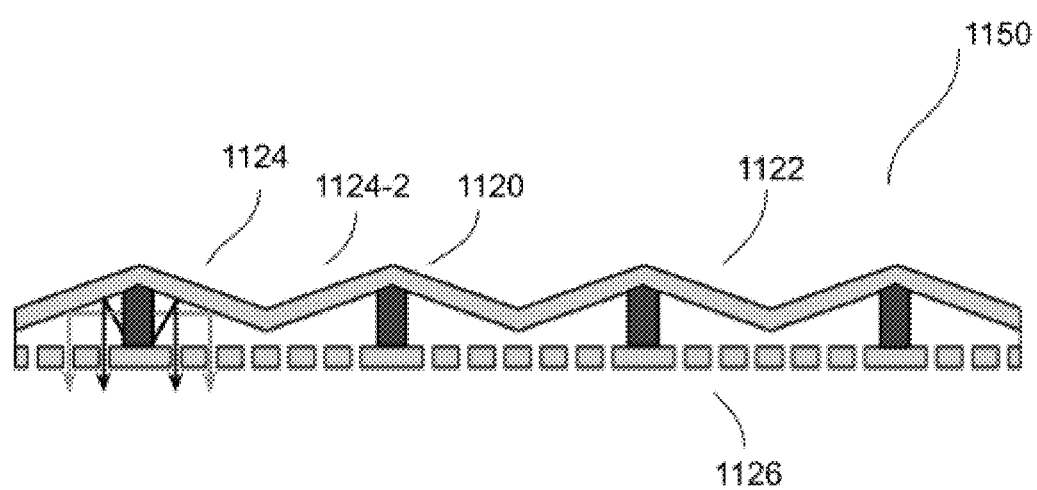

In another embodiment, illustrated in FIG. 11B, the height of the light source 1120 is comparable with that of the LGP 1150, i.e. substantially the same as the substrate 1122, whereby pyramid concave mirrors 1124-2 may be provided in the top or bottom reflective layers 1124 or 1126 to guide side-illuminating light toward the bottom or top perforated plate (FIG. 11B).

Figure 11C:
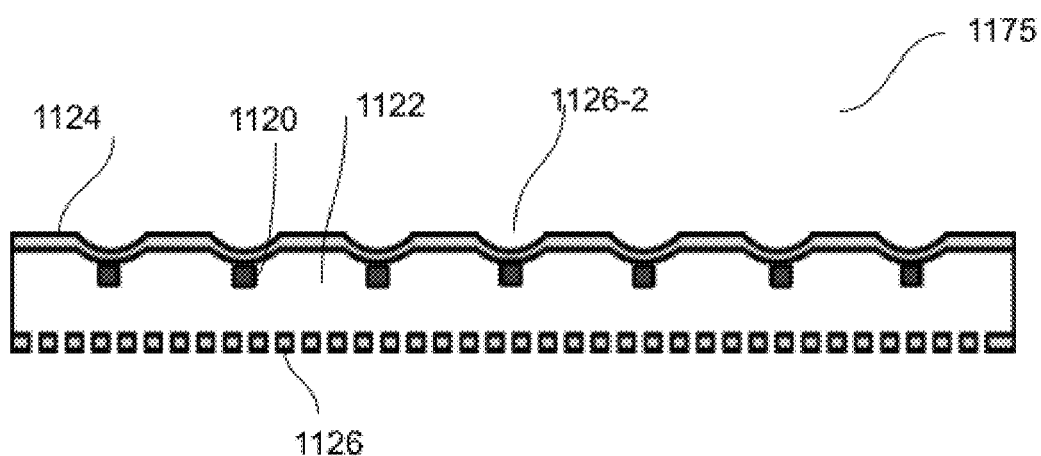

FIG. 11C illustrates another embodiment, in which an LGP 1175 includes light source 1120 embedded inside the substrate 1122, which has been modified for receiving convex mirror structures 1126-2. The substrate 1122 may include one or more of the following, the substrate 100, the planarization layer 108, the bottom electrode 104, the top electrode 112, and the integrated circuit layer 114. The convex structures 1126-2 may decrease the total number of light sources 1120 required in the backlight units, while maintaining a particular uniform light intensity. In all of the above-mentioned examples, careful calculations will be done to find the optimum curvature of the convex or concave mirrors 1124-1 and 1124-2 for uniform light radiation from the backlight unit. In addition, optical micro lenses may be provided between two adjacent top reflectors to further enhance the light propagation.

In the embodiments of FIGS. 9A-9C, 10A-10B, and 11A-10C, either of the reflective layers 924/926, 1024/1026, 1124/1126 may be part of the electrode for the light sources 920, 1020, 1120. A transparent electrode may be deposited on or before the patterned reflective layer 926, 1026, 1126. In the embodiments of FIGS. 9A-C, 10A-B, and 11A-C, substrates with other structure, such as electrodes, color conversion layers, and other layers may be provided before or after any of reflective layers. In the embodiments of 9A-C, FIG. 10A-B, and FIG. 10A-C, the substrate 922, 1022, 1122 may be a filler layer, or just space between the two reflective layers. The filler may have particles with reflective characteristics to improve the light output uniformity. In the embodiments of 9A-C, FIG. 10A-B, and FIG. 10A-C, the patterned reflective layers may have a profile, such as a gradient around the point light source to create uniform light output with fewer light sources.

In the embodiment of FIG. 9A-9C, the light sources 920 may or may not be aligned with the reflective patterns 926 on the other side of the substrate 922. The substrate 922 may be a filler layer or just a space between two reflective layers 924, 926. Any of previous methods may be used for the spacer or passivation layers. There may be another substrate on either side of the reflective layers 924, 926. Either of reflective layers 924, 926 may be part of either electrode for the source.

Microdevice and Backplane Integration

Some embodiments of the present disclosure relates to the post processing steps for enhancing the performance of micro devices after transferring into a receiver substrate.

One method to improve the system performance is to integrate microdevices into a system substrate. The challenge is to transferring millions of these micro devices and integrate them with circuits for every pixel with proper yield. The system substrate can be uneven due to other components in the system substrate prior to the transfer of the micro devices. Although planarization may work, but it may interfere with the transfer process due to limitation for processing parameters such as pressure, temperature and etc. Another challenge is that bonding the micro devices into an electrode in the system substrate is a time consuming process and generally it is done for each transfer step. Therefore, if a system requires few hundred transfer steps (cycles), it will take several hours to finish the process due to the timing required for bonding. Moreover, the bonding repeatability and reliability at such small pad size are major concerns affecting yield and lifetime of the system.

In one embodiment, a method to integrate one or more microdevices to a system substrate is provided. The method comprising transferring the one or more microdevices to the system substrate, forming a protective layer to cover the one or more microdevices, patterning the protective layer to receive conductive electrodes and connecting backplane elements to the one or more microdevices through the conductive electrodes.

Various embodiments in accordance with the present structures and processes provided are described below in detail.

In addition, these embodiments exemplarily illustrate with one or more micro light-emitting devices, but the invention is not limited thereto. The number of micro light-emitting devices may be changed according to actual requirements.

In this description, the terms "system substrate", "receiver substrate" and "display substrate" are used interchangeably. However, it is clear to one skilled in the art that the embodiments described herein are independent of substrate type.

Here, micro devices (e.g., GaN LEDs) are fabricated by depositing a stack of material on a sapphire substrate. The micro devices structure may be in the form of one of: a cylindrical structure, a mesa structure, a flip-chip structure, or a vertical structure.

Figure 12A:
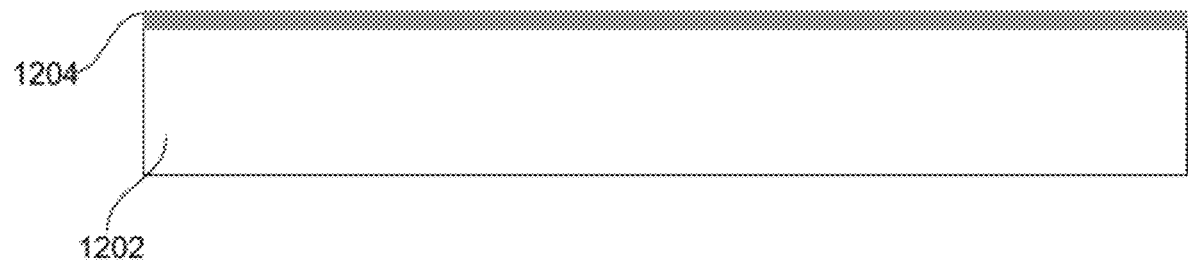
FIG. 12A is a schematic cross-sectional diagram illustrating a system based on integration of a buffer layer to a receiver substrate, in accordance with an embodiment of the invention.

FIG. 12A shows a cross section of a system based on integration of a buffer layer to a receiver substrate. FIG. 12A shows a system substrate 1202. A buffer layer 1204 may be formed on a top surface of the substrate 1202. The buffer layer(s) 1204 may be used as a delamination layer as well as a separate layer that can separate the fully integrated system from the substrate 1202. It is possible to eliminate the buffer layer 1204 specially when the stacked microdevice and circuit structure is staying on the substrate 1202. The buffer layer 1204 can also include an electrode that can be patterned or be used as common electrode. Some extra layers can be deposited on top of the electrode to create bonding places for micro devices. The buffer layer is formed before transferring the micro devices to the system substrate 1202. The buffer layer is formed between the microdevices and the substrate surface.

Figure 12B:
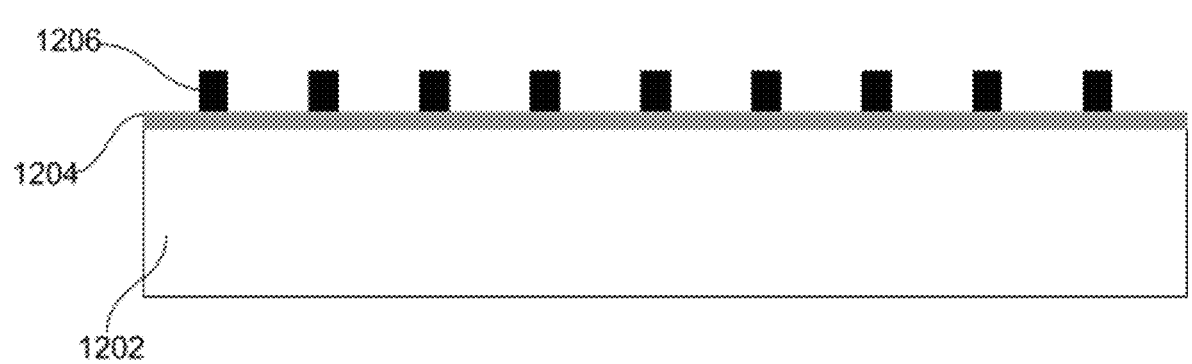
FIG. 12B is a schematic cross-sectional diagram illustrating the system based on integration of micro devices to the receiver substrate, in accordance with an embodiment of the invention.

FIG. 12B shows a plurality of microdevices 1206 transferred over the system substrate 1202. In one case, the micro-devices can be micro light emitting devices. In another case, the micro devices may be any micro device that may typically be manufactured in planar batches, including but not limited to LEDs, OLEDs, inorganic LEDs, sensors, solid state devices, integrated circuits, MEMS, and/or other electronic components.

Figure 12C:
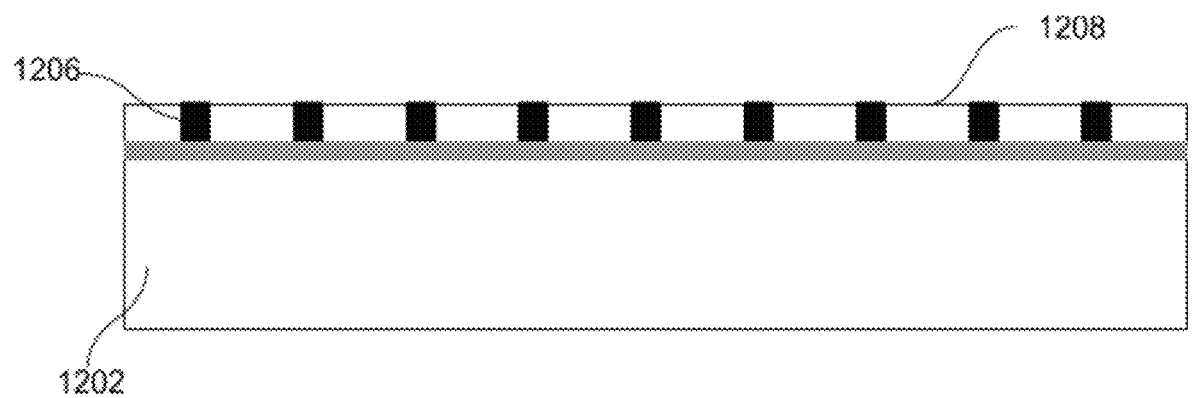
FIG. 12C is a schematic cross-sectional diagram illustrating the system with integrated micro devices and planarization layers, in accordance with an embodiment of the invention.

FIG. 12C shows a cross section of a system with integrated micro devices and planarization layers. A protective layer 1208 may be formed to cover the micro devices 1206 bonded to the substrate 1202. The protective layer can be a planarizing layer. It is possible that the protective layer 1208 is made of few different layers and materials, e.g. dielectric layer. In one case, the protective layer 1208 can be extended beyond the microdevice edges. In one embodiment, another passivation layers can be used to cover the micro devices.

Figure 12D:
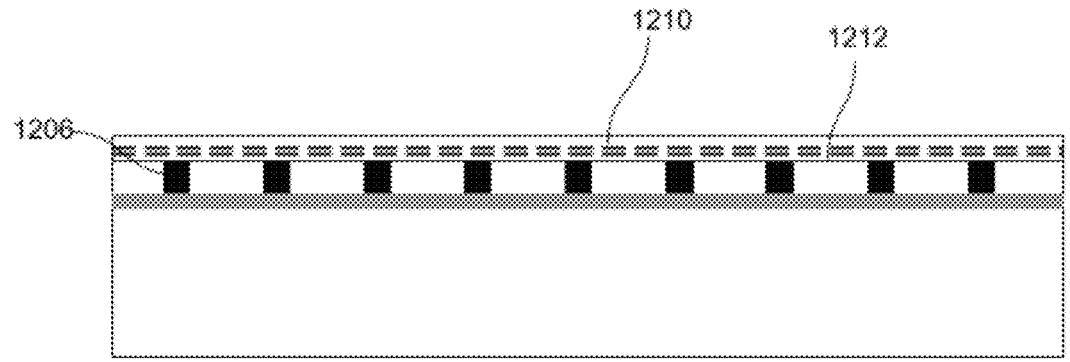
FIG. 12D is a schematic cross-sectional diagram illustrating the system with integrated micro devices and a plurality of other planarazing layers, in accordance with an embodiment of the invention.

FIG. 12D shows a cross section of an embodiment with integrated micro devices and a plurality of another planarizing layers. A plurality of another planarizing layers 1210 may be formed over the protective layer 1212 covering the micro devices 1206. The other planarizing layers 1210 can be any other layer such as the extension of the protective layer 1208, a passivation layer, a protective layer or any other separate layer. In one case, color conversion layer can be integrated prior to the planarization layer. In another case, the color conversion layer can be integrated after the protective layer (passivation layer) and can be covered by another passivation layer. In one embodiment, color conversion layer can be the passivation layer.

If the planarization layer covering the micro devices, vias can be formed in the planarization layers to provide access to the micro devices.

Figure 12E:
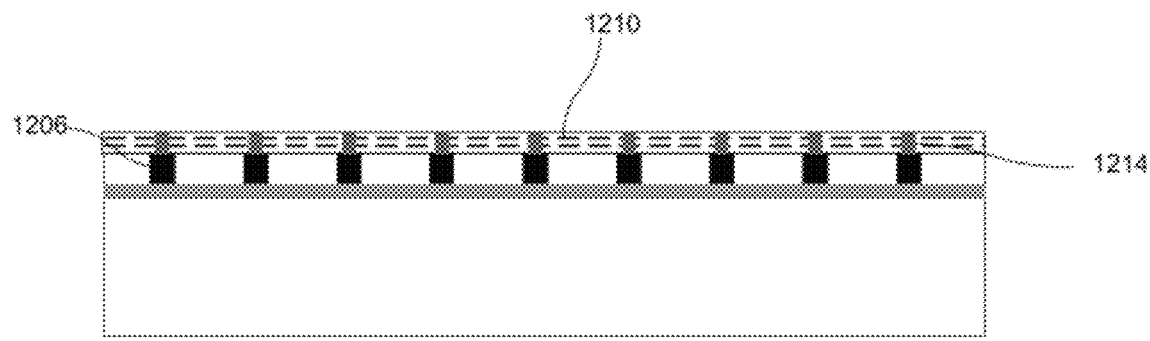
FIG. 12E is a schematic cross-sectional diagram illustrating the system with integrated micro devices and vias in the planarization layers, in accordance with an embodiment of the invention.

FIG. 12E shows a cross section of an embodiment with integrated micro devices and vias in the passivation layers. A plurality of vias 1214 can be made e.g. etched, in the planarizing layers 1210 down to each micro device 1206. These vias 1214 can be used to connect the micro devices 1206 to backplane elements. The top conductive electrodes 1212 are then formed in the openings 1214, whereby the top conductive electrodes 1230 may be connected to the micro devices 1206. The top conductive electrodes 1230 may then be used to connect the micro devices 1206 to the integrated circuit layer 1216.

The integrated circuit layer may be either a backplane, thin film transistors, CMOS chiplet, or other type of integrated circuit. The openings 1214 extending through the planarizing layer 1210 may be used to receive conductive electrodes for connecting to the microdevices 1206 to the backplane elements. In one case, the openings 1214 are formed before the formation of conductive electrodes that connects the microdevice to the backplane elements. The number of vias 1214 for each microdevice 1206 depends on the number of connections required between the microdevice 106 and the backplane elements and coupling method. The integrated circuit layer, e.g. the backplane, may be fabricated after the planarizing layer 1210, and the backplane may be comprised of a thin film transistor (TFT) layer.

Figure 12F:
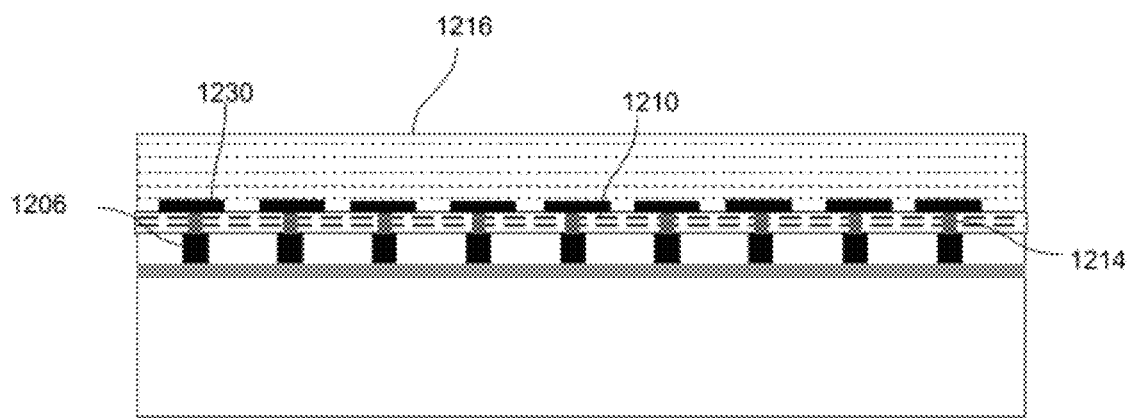
FIG. 12F is a schematic cross-sectional diagram illustrating integration of micro devices and a backplane, in accordance with an embodiment of the invention.

FIG. 12F shows a cross section of a system with integrated micro devices and a backplane. A backplane 1216 can be coupled to the micro device structure by disposing or forming conductive electrodes 1230 in the vias 1214. The backplane 1216 can be connected to the micro devices 1206 through the vias 1214. The conductive electrodes 1230 may be connected to the micro devices 1206. The top conductive electrodes may then be used to connect the micro device 106 to an integrated circuit layer that interconnects each of the micro devices 1206, via the electrodes, to power supplies or control systems. The integrated circuit layer may be either thin film transistors, CMOS chiplet, or other type of integrated circuit.

Figure 12G:
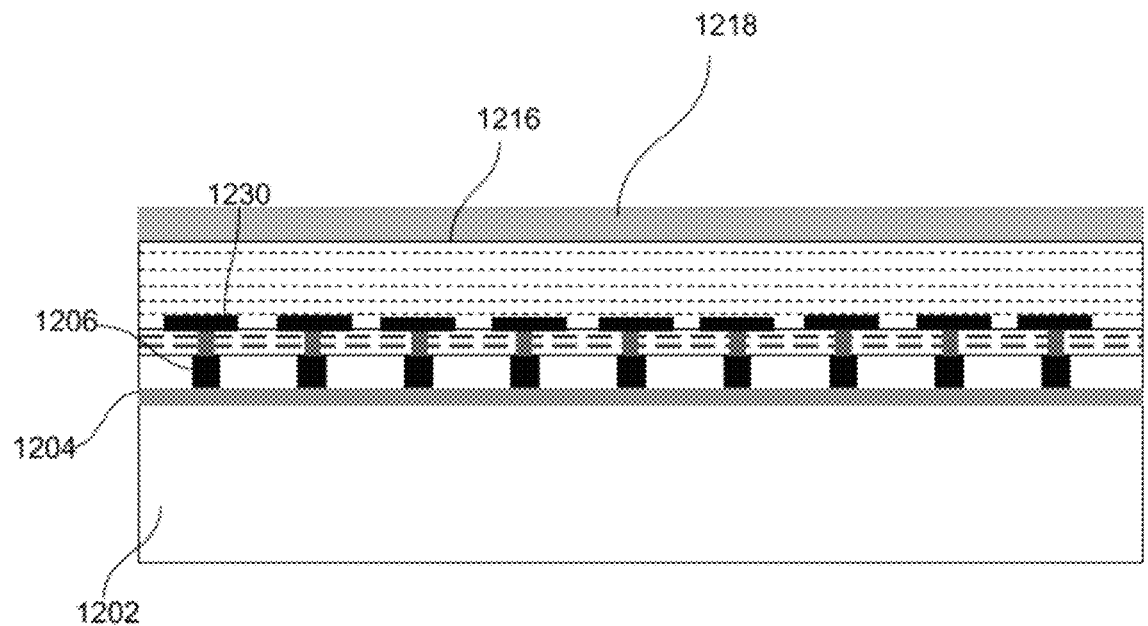
FIG. 12G is a schematic cross-sectional diagram illustrating the system integration with micro devices and different top layers, in accordance with an embodiment of the invention.

FIG. 12G shows a cross section of an embodiment with integrated micro devices and different top layers. A plurality of additional layers may be formed on top of the microdevices 1206 and the backplane 1216. The additional layers 1218 may comprises optical layers, passivation layer, a color conversion layer, a color filter, an optical enhancement layer, a touch sensing electrode, or a common electrode. The touch sensing structure can be separated from micro-devices and or their electrode(s) by a dielectric layer. The touch structure can be in the same plane as the micro devices. The touch structure can be of different types such as capacitive, resistive, pressure, optical or combination thereof. An electrode may be deposited and can be patterned or be used as common electrode. Some extra layers can be deposited on top of this electrode for optical properties.

In one embodiment, the first substrate (e.g., in this case, the receiver substrate 1202) can be removed to enable flexible system or post processing steps performed on the side of the system facing the first substrate. In one case, there is no need for supportive layer/protective layer or substrate and the stacked layers on the system can handle the separation process. In another embodiment, another supportive or permanent substrate is added to the other side of the system different from the side on the first substrate.

Figure 12H:
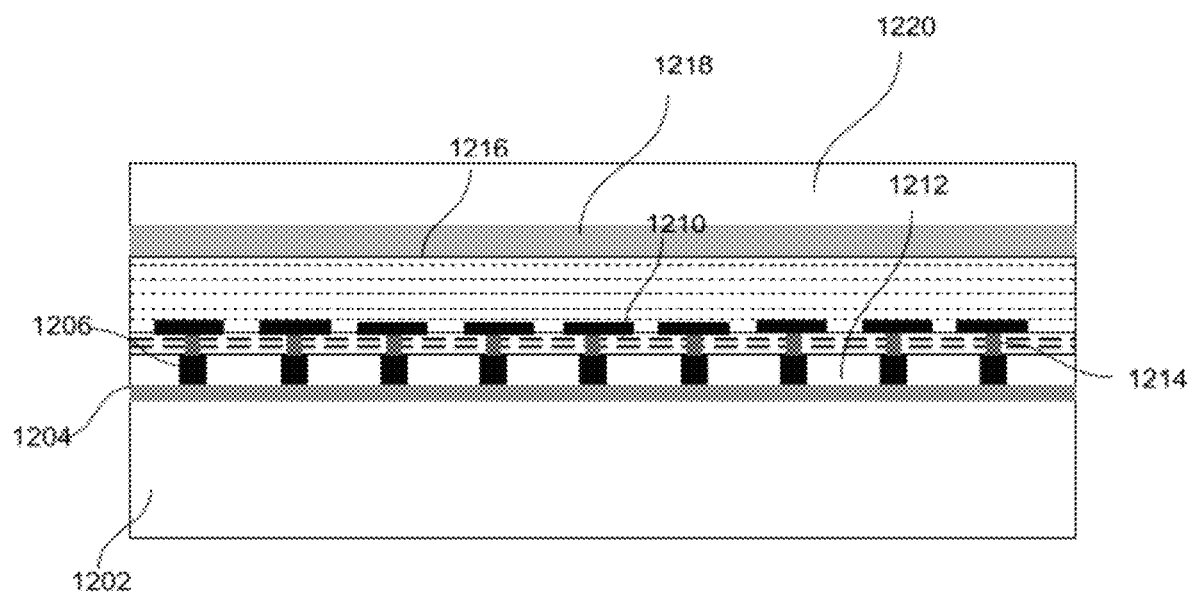
FIG. 12H is a schematic cross-sectional diagram illustrating the system integration with micro devices and another substrate on a top surface of the passivation layer, in accordance with an embodiment of the invention.

FIG. 12H shows a cross section of an embodiment with integrated micro devices and a second substrate 1220 on a surface of the system. The system can be separated from the first substrate while supported by the second substrate 1220.

Figure 12I:
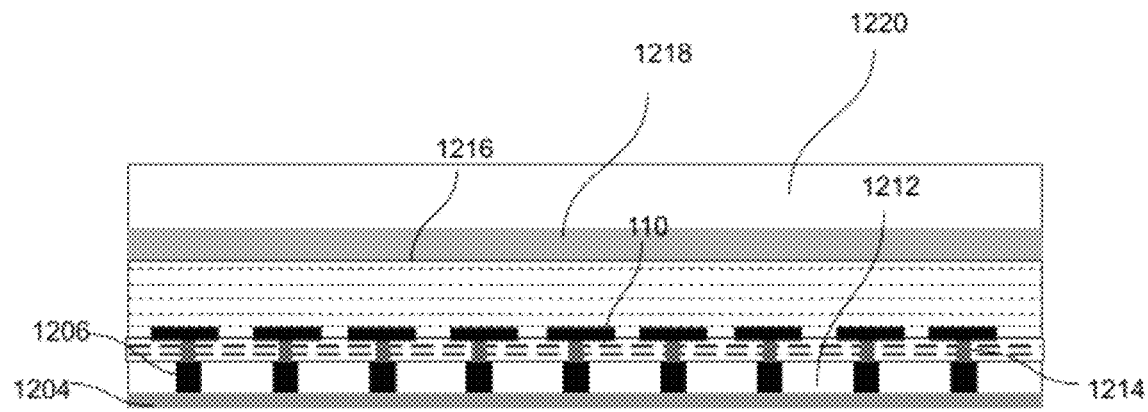
FIG. 12I is a schematic cross-sectional diagram illustrating the system integration with micro devices and removing the first substrate, in accordance with an embodiment of the invention.

FIG. 12I shows a cross section of an embodiment with integrated micro devices and removing the first substrate. The first substrate can be removed after integration of the secondary substrate 1220. The separation is done by modifying the buffer layer 1204. The post processing steps may be performed on the surface of the layers separated from the first substrate. Here, the buffer layer can include a protective layer to protect the devices (e.g. micro devices, the backplane components, and other conductive layers) from any side effect during the separation process. In one case, the protective layer can absorb the excess emission from the laser used to separate the system from the first substrate. In one embodiment, the protective layer can be removed after the separation process. The other post processing steps can include at least one of: forming one or more vias (openings) in a single or plurality of layers, removing one or more of the plurality of layers, forming different electrodes, forming optical layers, forming color conversion/filter layers, or forming passivation layer.

Figure 12J:
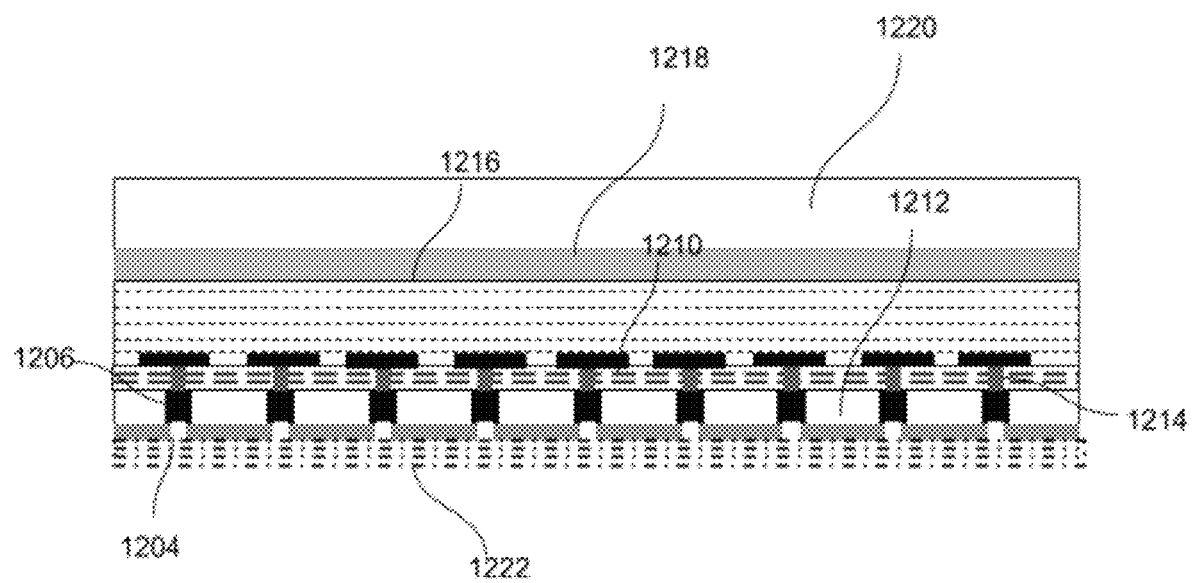
FIG. 12J is a schematic cross-sectional diagram illustrating the system integration with micro devices and the optical layers covering the buffer layer, in accordance with an embodiment of the invention.

FIG. 12J shows a cross section of an embodiment with integrated micro devices and other layers covering the buffer layer. After the removal of the first substrate, the other layers 1222 that may comprise one of a passivation layer, a color conversion layer, a color filter, an optical enhancement layer, a touch sensing electrode, or a common electrode can be formed over the buffer layer. In one case, other layers such as color conversion layer, color filter or other devices can be placed on the side of substrate which is opposite to the side where micro-devices are located. Here, plurality of vias 104 can be formed in the one or more layers to provide coupling options to the micro devices or the backplane. Various embodiments related to FIG. 12J has been described in the disclosure.

In some embodiments, the planarization layer can have vias at different locations to micro devices to make connections with backplane. These embodiments exemplarily illustrate with one micro light-emitting device, but the invention is not limited thereto. The number of micro light-emitting devices may be changed according to actual requirements.

After all the microdevices transferred to a system substrate, to make connections with backplane, pre-processing steps can be done on the transferred microdevices. Here, the microdevice has contacts one one side. The contacts need to get exposed to have connections with backplane. The connections can be provided by vias opened at different locations of microdevice contacts. The different locations can be p-type ohmic contact and n-type ohmic contact of the microdevice. The number of openings for each microdevice depends on the number of connections required between the microdevice and the backplane. The surface of system substrate can be leveled by using planarization layer.

Figure 13A:
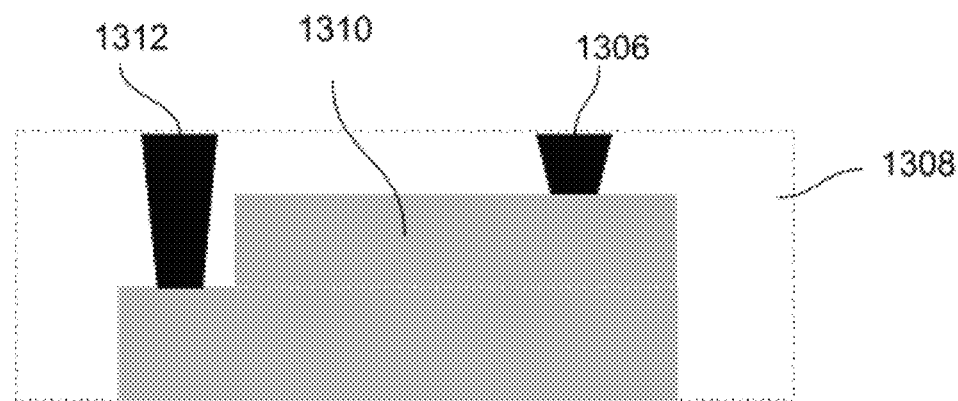
FIG. 13A-13F is a schematic cross-sectional diagram illustrating the system integration with micro devices with openings in the planarization layers, in accordance with an embodiment of the invention.

FIG. 13A shows a cross section of a system with integrated micro devices having vias to make connections with a backplane, according to some embodiments. A passivation layer/planarization layer 1308 may be deposited over a top surface of the micro device 1310. A plurality of vias/openings (1306, 1312) can be made to connect the micro device 1302 to the backplane. The plurality of openings can be made through the passivation layer/planarization layer 1308 deposited over the micro devices. A planarization layer 1308 formed over micro devices, and openings are formed to expose the backplane working circuitry. The micro device can have multiple layers stacked together.

Figure 13B:
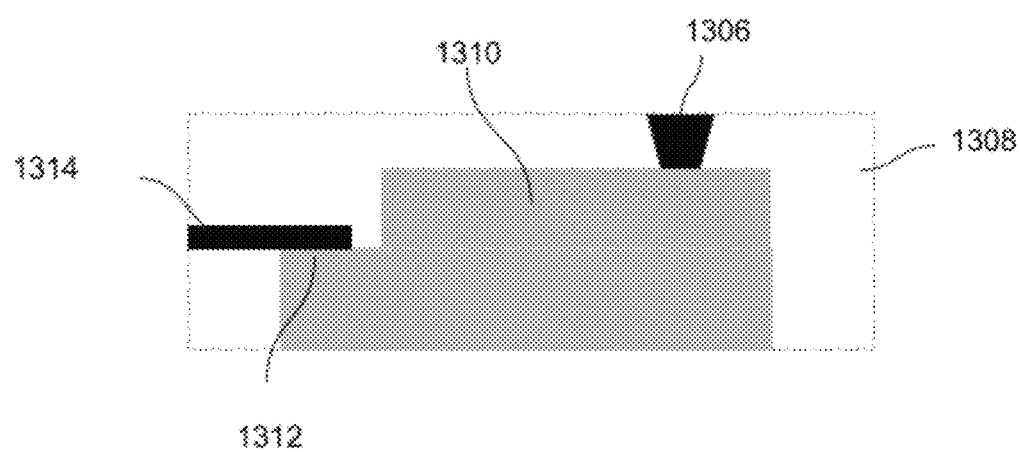

FIG. 13B shows cross section of a system with integrated micro devices having openings to make connections with the backplane according to some embodiments. After all the microdevices transferred to a system substrate, the surface can be leveled by using planarization layer. A passivation layer/planarization layer 1308 may be deposited over a top surface of the micro device 1310. In one case, an opening 1306 can be made to connect the micro device 1302 to the backplane. In another case, a common electrode/metal layer 1314 can be deposited on a surface of the microdevice 1310 to connect to the backplane. The common electrode can be shared with other microdevices. There can be more than one planarization layers. Each planarization layer can have a plurality of vias or a direct metal layer. One planarization step can cover or extend to one of the surfaces and the other planarization layer can extend to a surface or cover a surface higher than the first surface. There can be vias between planarization layer to connect the connections at different planarization layers together.

Figure 13C:
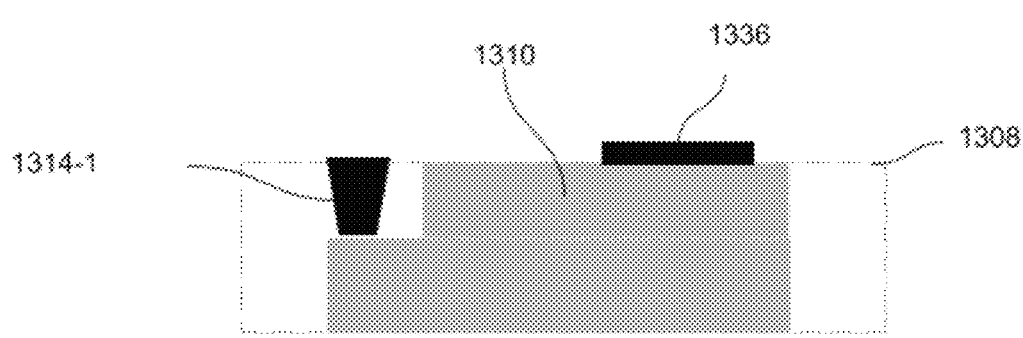

FIG. 13C shows another exemplary system with combination of connections and vias at different surfaces of a micro device. A metallization (conductive) layer 1336 may be deposited over the first surface of the micro device 1310. The metallization layer can be a common electrode for all the microdevices. A plurality of vias/openings can be made to connect the connection of the micro devices 1310 to a backplane located at surface of the micro device that is different from the first surface. Here, the micro device can have two or more different surfaces at different heights. One planarization step can cover or extend to one of the surfaces and the other planarization layer can extend to a surface or cover a surface higher than the first surface. One of an opening 1314-1 of the plurality of openings can be made through the passivation layer 1308 deposited over the micro devices. A planarization layer 1308 may be formed over micro devices, and openings are formed to expose the backplane working circuitry.

Figure 13D:
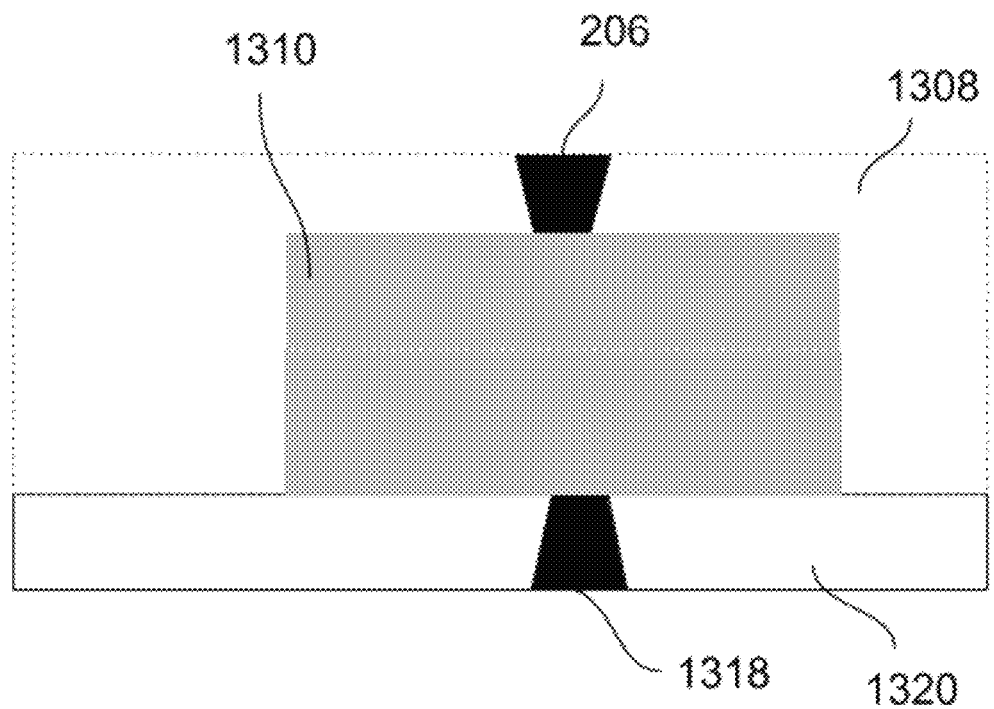

FIG. 13D shows cross section of an exemplary system with combination of connections and vias at different surfaces of a micro device. A plurality of vias can be made to connect the micro devices 1310 to a backplane. The planarization layer 1308 can have a plurality of vias. As shown in FIG. 13D, an opening 1306 can be made through passivation/planarization layer 208 deposited over the micro device wherein another opening 1318 can be made through a buffer layer 1320.

Figure 13E:
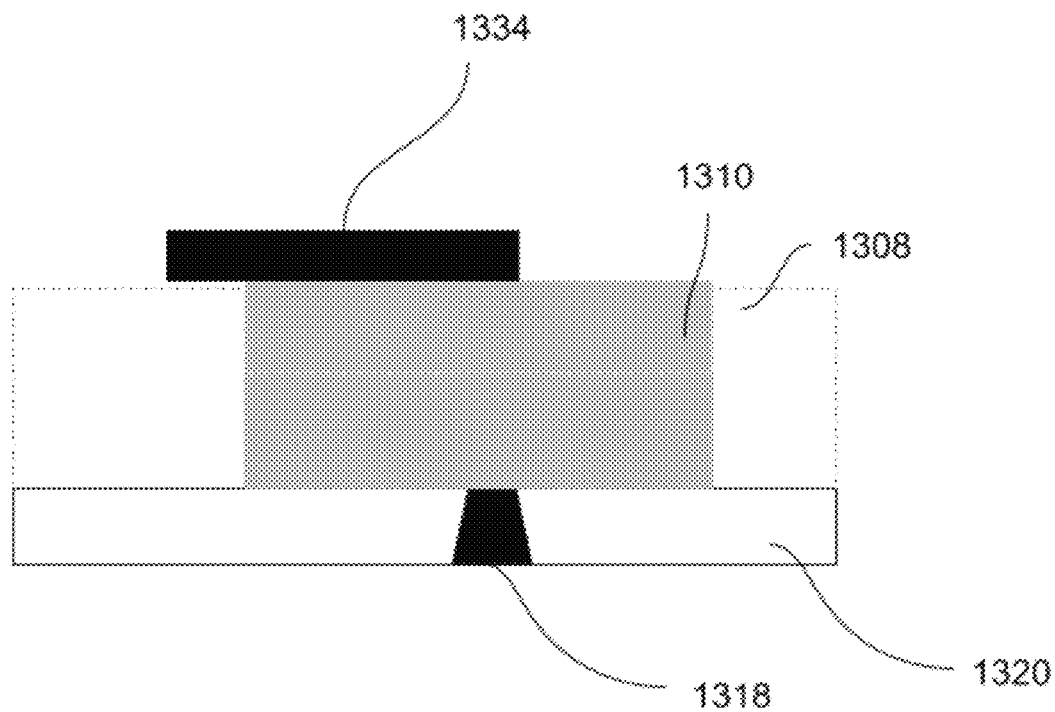

FIG. 13E shows cross section of a system with integrated micro devices having openings to make connections with a backplane according to some embodiments. A plurality of openings can be made to connect the micro devices 1310 to a backplane. A metallization layer 1334 may be deposited over one of the planarization surface coupling to the micro devices and an opening 1318 can be made via a buffer layer 1320 at a bottom surface of the micro device.

Figure 13F:
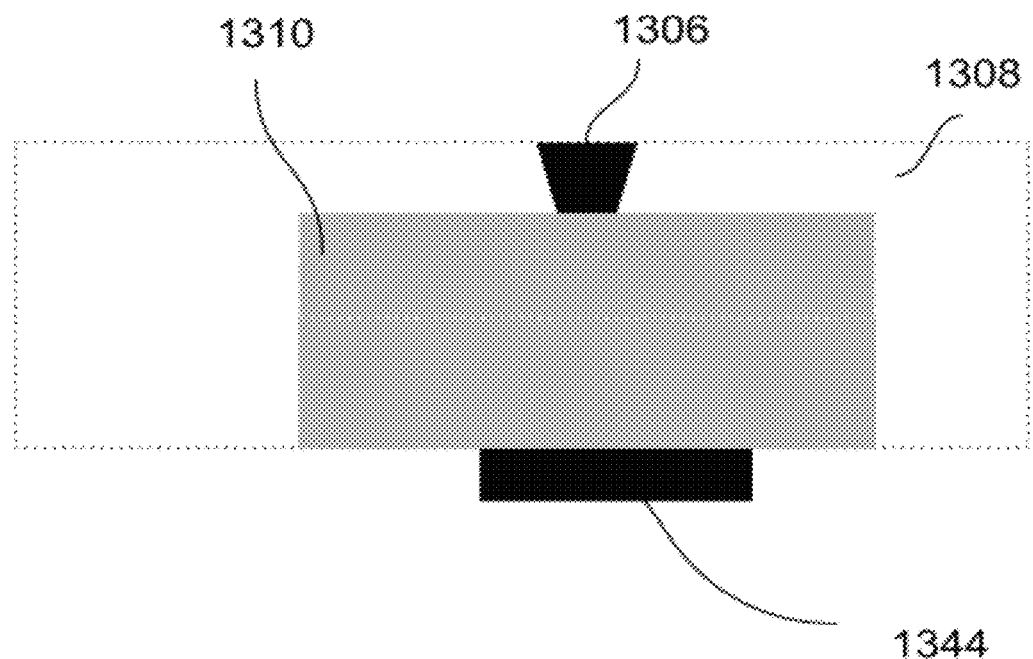

FIG. 13F shows cross section of a system with integrated micro devices having openings to make connections with a backplane according to some embodiments. An opening (1306) can be made to micro device 1310 for connections to a backplane through the passivation/planarization layer 1308. A metallization layer 1344 may be deposited over one of the planarization surfaces opposite to the surface of the micro devices 1310.

Figure 14A:
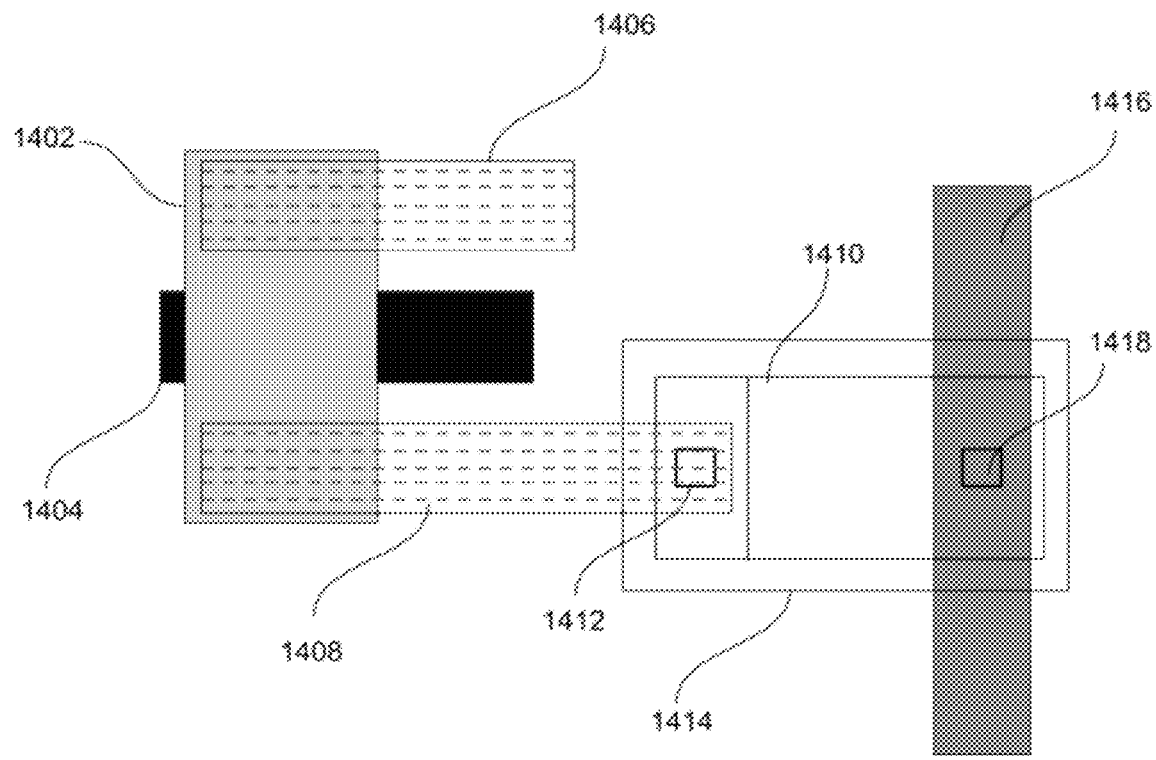
FIG. 14A shows a top view of integration of backplane with the micro devices through openings, in accordance with an embodiment of the invention.

FIG. 14A shows a top view of backplane according to one embodiment. Here, the micro device 1410 are covered by plurality of layers. The plurality of layers may comprise a passivation/planarization layer 1414 surrounding the micro device 1410. A plurality of vias/openings (1418, 1412) can be made to connect the micro device 1410 to the backplane components 1402. The backplane components 1402 can be connected to the micro device through conductive layers 1406, 1408 and vias 1412, 1418. The backplane can include multiple conductive traces 1406, 1404, 1408, 1416. These traces can be in one layer or separate layers. Other separate layers such as a passivation layer, a color conversion layer, an optical enhancement layer, a touch sensing electrode, or a common electrode may also be deposited over the microdevices. The backplane component can be a transistor, capacitor, a signal source, a power source, etc.

Figure 14B:
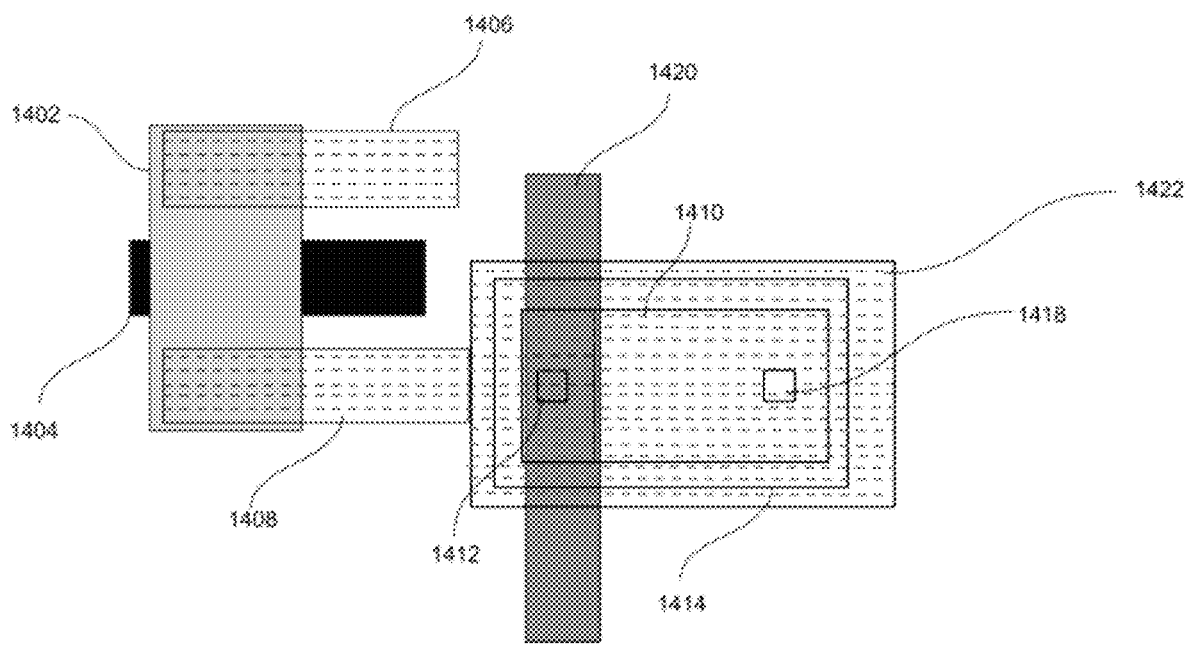
FIG. 14B shows another top view of integration of backplane with the micro devices through openings, in accordance with an embodiment of the invention.

FIG. 14B shows another exemplary top view of the system with a backplane. Here, the micro device 1410 are covered by plurality of layers. The plurality of layers may comprise a passivation/planarization layer 1414 surrounding the micro device 1410. A backplane components 1402 can be connected to the micro device 1410 through conductive layers 1406, 1408 and vias 1412, 1418. The backplane can include multiple conductive traces 1406, 1404, 1408. In one case, a metalization layer 1422 can be used to connect the microdevice to a component in the backplane or a power/signal source. Another common conductive layer 1420 can be used to connect another connection of the micro device. In a case, there can be a dielectric layer between the other conductive layer 1420 and the metalization layer 1422. The dielectric layer is formed between the metallization layer and another conductive layer connecting to the one or more microdevices can be used to avoid shorting between electrodes.

Some embodiments of the present disclosure show integration of microdevices with backplane with plurality of vias at different locations of microdevices. Here, a reflective layer can be integrated over the microdevices to confine the light with the active area of the microdevice. The reflective layer can be a common electrode or a patterned electrode.

Figure 15A:
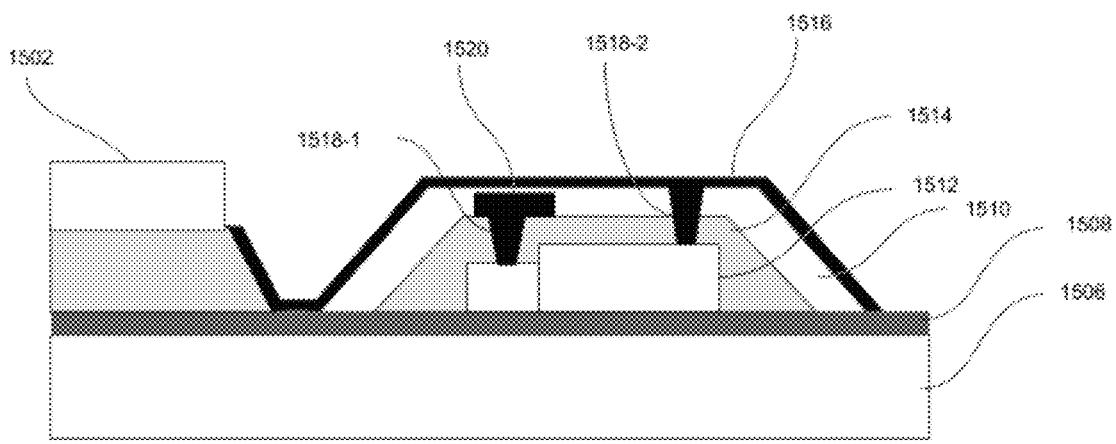
FIG. 15A is a schematic cross-sectional diagram illustrating the system integration with micro devices having planarization and dielectric layers, in accordance with an embodiment of the invention.

FIG. 15A shows a cross section of an embodiment with integrated micro devices having planarization and dielectric layers. FIG. 15A shows a substrate 1506. A buffer layer 1508 can be deposited on top of the substrate 1506. The buffer layer (or layers) can be used as delamination layer as well as a separate layer that is separating the fully integrated system from the substrate 1506. It may be possible to eliminate this layer 1508 especially when the stacked micro-device and circuit structure is staying on the substrate 1506. Microdevices 1512 are transferred into the substrate 1506. Here, the micro device can have two or more different surfaces at different heights. One planarization step can cover or extend to one of the surfaces and the other planarization layer can extend to a surface or cover a surface higher than the first surface. Thus, the system can include multiple step planarization layer. A planarizing layer 1514 may be formed over the micro device 1512. It is possible that the planarizing layer 1514 is made of few different layers. A planarizing layer can be a passivation layer. Vias 1518-1 can be made in the planarizing layer 1514 to connect the micro device 1512 to a backplane 1502 located at surface of the micro device 1512 that is different from the first surface. The vias 1518-1 may be used to provide conductive electrode 1520 to connect the micro device 1512 to the backplane 1502. The backplane can be either thin film transistors, CMOS chiplet, or other type of integrated circuit. A dielectric layer 1510 can be formed over the electrode 1520 and a reflective layer/reflector 1516 can be formed over the dielectric layer 1510 through a via 1518-2 in the dielectric layer. The planarization layer 1514 can be extended over the substrate to provide connections to the backplane 1502. It is noted that any of the layers can be eliminated. In one case, the surface of the transferred device is planarized first. Then, vias can be opened to create contact to the backplane. This contact can be at the edge or in the middle of the arrays. The conductive electrode 1520 includes the reflective material 1516 for directing light from the micro device. The dielectric layer 1510 includes openings therethrough to enable light to travel through to the electrode 1520.

Figure 15B:
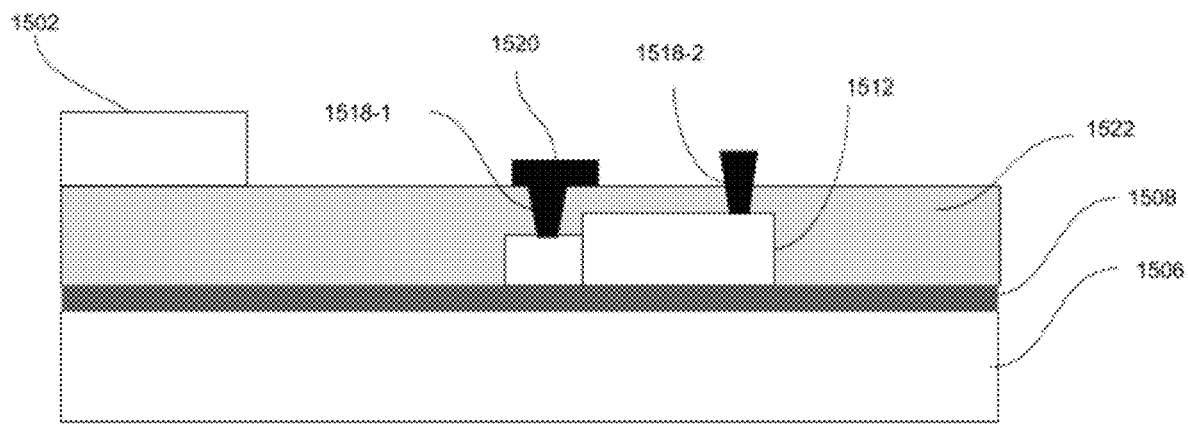
FIG. 15B is a schematic cross-sectional diagram illustrating the system integration with micro devices and metallization, in accordance with an embodiment of the invention.

FIG. 15B shows a cross section of an embodiment with integrated micro devices and backplane. Here, micro devices 1512 are transferred into the substrate 1506 having a buffer layer 1508 at top of the substrate 1506. Here, the system can include multiple step planarization layer. Each planarization layer can have a plurality of vias. The planzaring layer/passivation layer 1522 may be deposited over the micro devices 1512 having two or more different surfaces at different heights. The planarization layer 1522 can be extended over the substrate 1506 to provide connections to the backplane 1502. The openings 1518-1, 1518-2 are extending through the planarizing layer 1522 may be used to receive conductive electrodes 1520 for connecting to the micro devices 1512 to the backplane elements 1502.

Figure 15C:
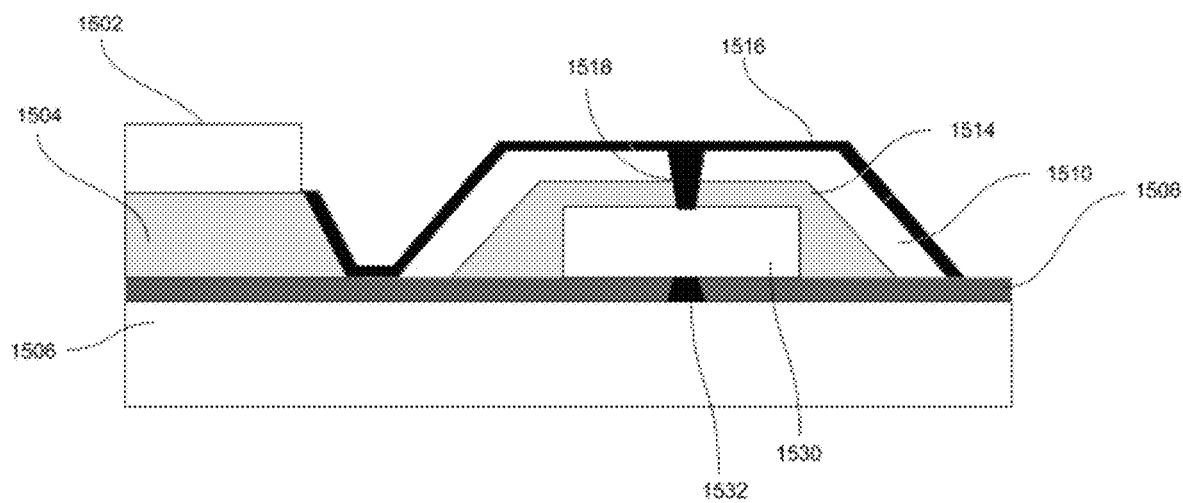
FIG. 15C is a schematic cross-sectional diagram illustrating the system integration with micro devices, in accordance with an embodiment of the invention.

FIG. 15C shows a cross section of an embodiment with micro devices. Here, a buffer layer 1508 can be deposited on top of the substrate 1506. Micro devices 1530 are transferred into the substrate 1506. A planarizing layer 1514 is formed over the micro device 1530. Vias 1518 can be made in the planarizing layer 1514. These vias can be opened to create contact to the backplane 1502. This contact can be at the edge or in the middle of the arrays. A reflective layer 1516 can be deposited for directing light from the micro device. The dielectric layer 1510 includes openings therethrough to enable light to travel. Here, an opening 1532 has been provided through the buffer layer 1508 and the planarization layer 1504 can be extended over the substrate 1506 to provide connections to the backplane 1502 through openings (1518, 1532).

Figure 16A:
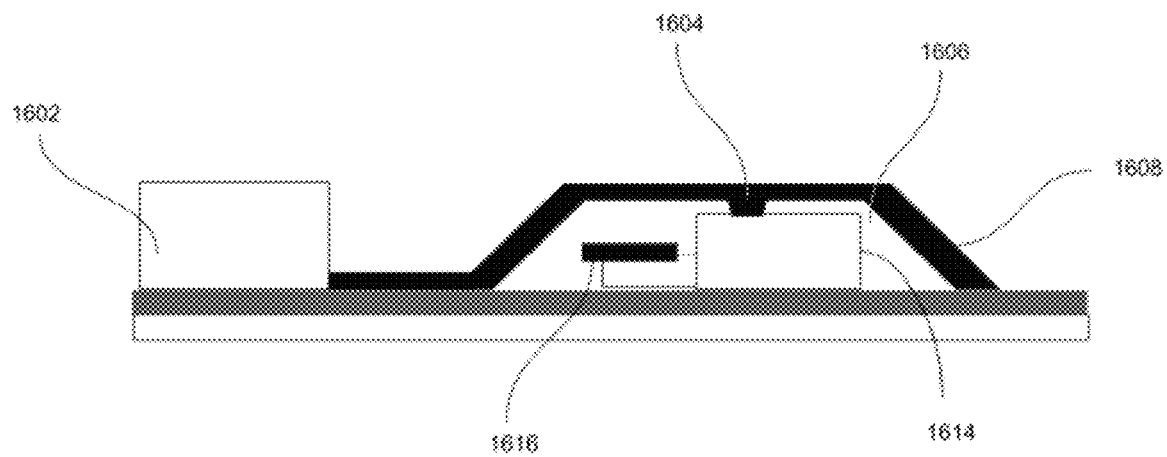
FIG. 16A-16C is a schematic cross-sectional diagram illustrating a backplane arrangement including integrated circuits thereon, in accordance with an embodiment of the invention.

FIG. 16A is a cross section illustrating a backplane arrangement including integrated circuits thereon according to some embodiments of the present invention. Here, the micro device can have two or more different surfaces at different heights. One planarization step can cover or extend to one of the surfaces and the other planarization layer can extend to a surface or cover a surface higher than the first surface. For example, a metallization layer 1616 may be deposited over one of the planarization surface coupling to the micro devices. There can be vias between planarization layer to connect the connections at different planarization layer together. A metalization layer 1616 may be directly deposited over a top surface of the micro devices or an opening 1604 can be made to the dielectric layer 1606 to connect the micro devices 1614 to a backplane 1602. A reflective layer 1608 can be deposited for directing light from the micro device.

Figure 16B:
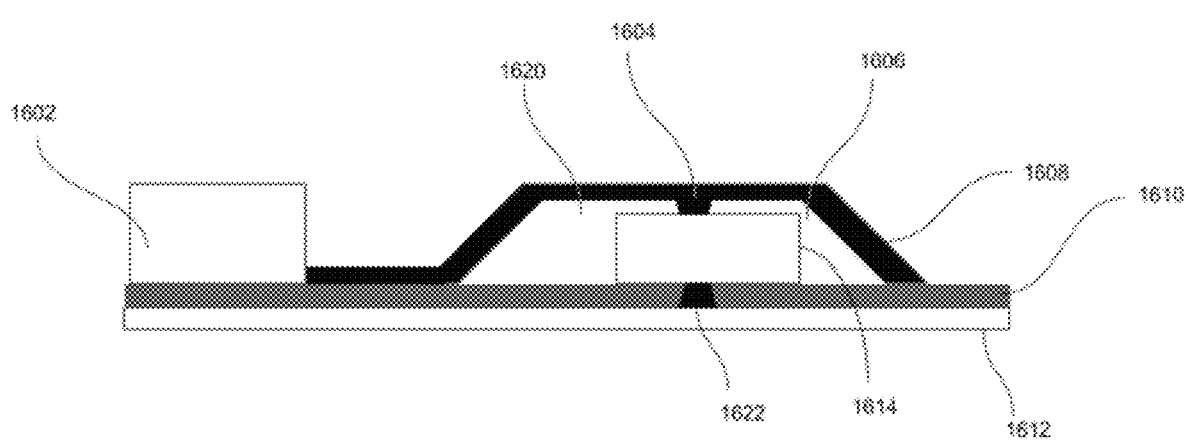

FIG. 16B is a cross section illustrating a backplane arrangement including integrated circuits thereon according to some embodiments of the present invention. Here, a plurality of opening have been provided to connect the micro device 1614 to the integrated circuit layer 1602 and system. The circuit can be either thin film transistors, CMOS chiplet, or other type of integrated circuit. An opening 1604 can be formed through the planarization layer/passivation layer 1606 and other opening 1622 can be formed through the buffer layer 1610. A reflective layer 1608 can be deposited for directing light from the micro device 1614.

Figure 16C:
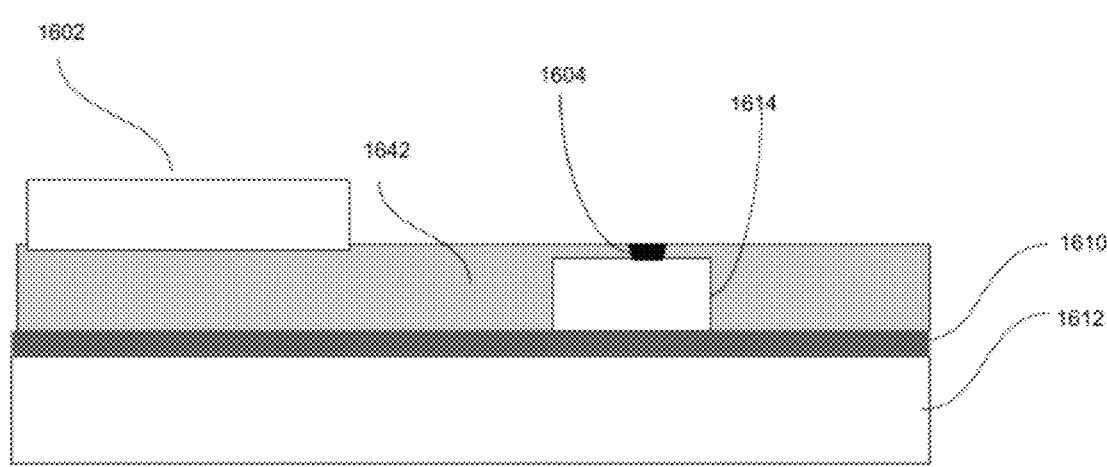

FIG. 16C is a cross section illustrating a backplane arrangement including integrated circuits thereon according to some embodiments of the present invention. Here, openings 1604 may be provided through the planarization layer/passivation layer 1642 to the micro device 1614 on a substrate 1612 having a buffer layer 1610. The planarization layer 1642 can be extended over the substrate to provide connections to the backplane 1602.

In all embodiments demonstrated in FIG. 15A-C and FIG. 16A-C, the backplane component can be on top of the planarization or micro device.

Figure 17A:
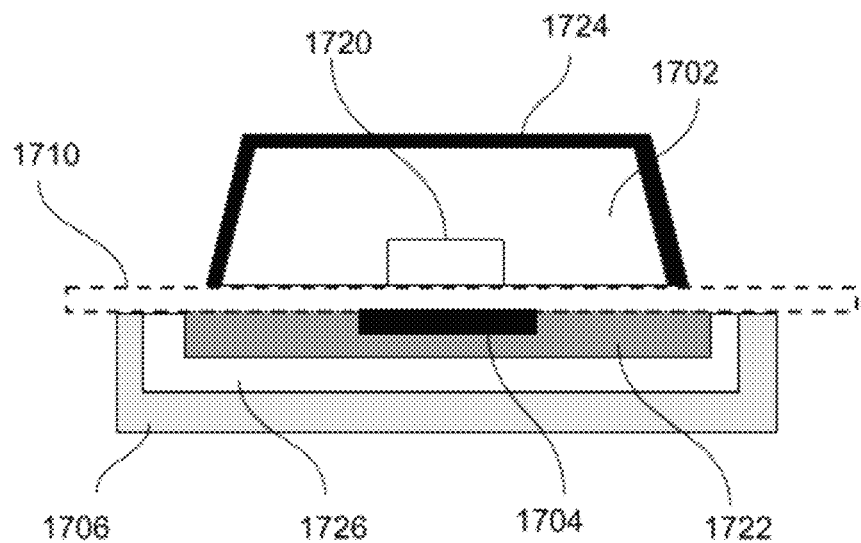
FIG. 17A is a schematic cross-sectional diagram illustrating a micro device integrated with different layers, in accordance with an embodiment of the invention.

FIG. 17A shows a cross section of a micro device integrated with plurality of layers according to some embodiments of the present invention. In some embodiments, optical layers, such as color conversion 1722, color filter 1726, passivation layer and/or an electrode (blocking layer) or other devices may be included, e.g. deposited, on a buffer layer 1710 and the micro device 1720. In this case, other structures, such as a color conversion layer, color filter or other devices may be placed on the underside opposite to the side where the micro-devices are located. Other layers such as planarization/passivation layer 1702 and a reflector/reflective layer 1724 may be deposited at a top surface of the micro device. Post processing steps for additional structure such as reflective layers, fillers, black matrix or other layers may be used to improve the out coupling or confining of the generated LED light. In another example, color conversion layers are integrated into the system substrate to create different output from the micro devices. A color filter mounted on the buffer layer may be used for receiving light from the light emitting micro device. To reduce the direct light intensity, a blocking layer 1704 is deposited covering part of the micro device surface. In one case, the blocking layer can be the micro device electrode or another functional electrode such as touch screen electrode. The micro device light is get reflected back to the color conversion layer in combination by the blocking layer and the reflector layer. After or before the color conversion layer, there can be a passivation layer 1706 to protect the color conversion materials. A color filter can be added to the stack allowing the only the output of the color conversion layer to pass through. A passivation layer can be added after the color conversion layer.

Figure 17B:
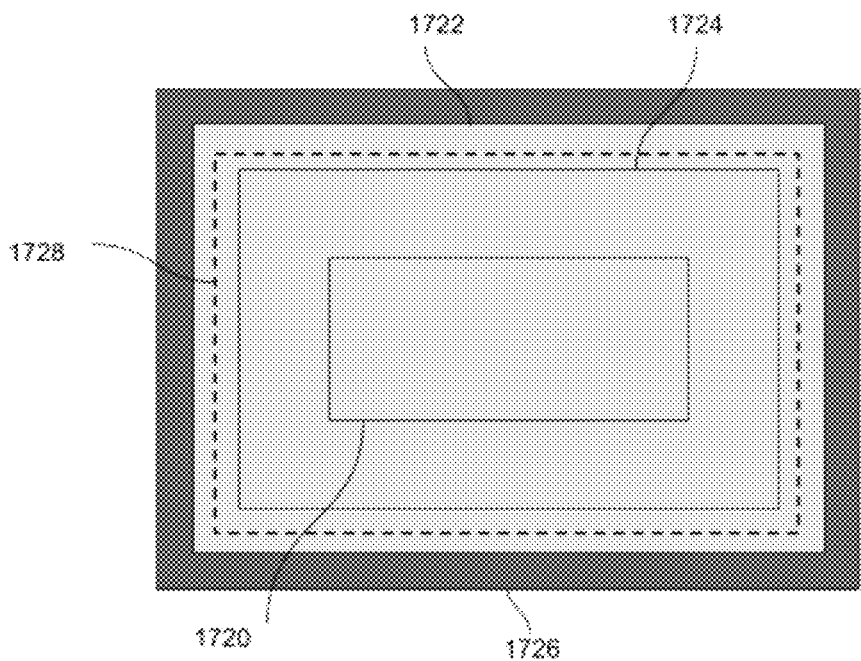
FIG. 17B shows a top view of FIG. 17A, in accordance with an embodiment of the invention.

FIG. 17B shows a top view of microdevice integrated with separate layers according to some embodiments of the present invention. FIG. 17B shows a top view of FIG. 17A, where separate layers such as color conversion layers 1722, reflective layers 1724, passivation/planarization layers 1728, color filters 1726 or other separate layers are deposited over the micro device 1720.

Figure 17C:
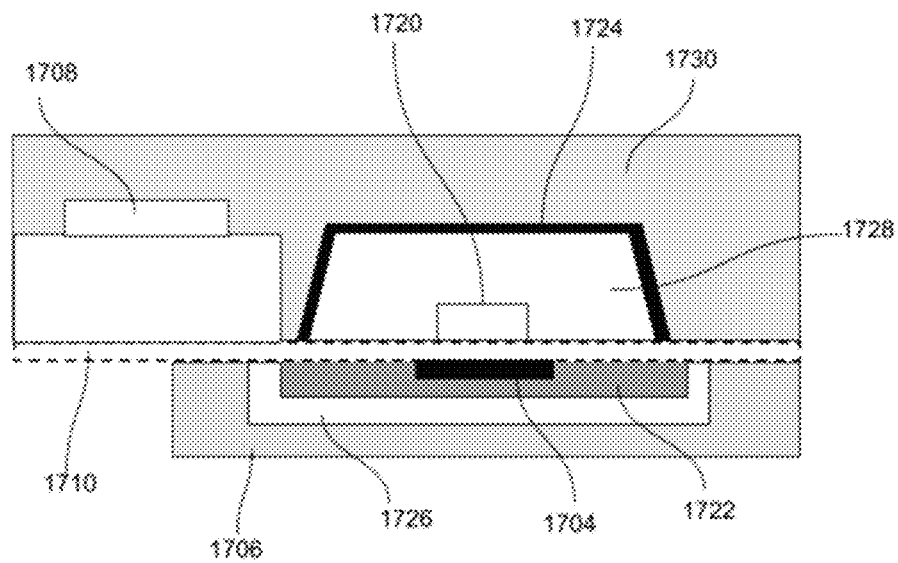
FIG. 17C is a schematic cross-sectional diagram illustrating micro devices integration with a backplane, in accordance with an embodiment of the invention.

FIG. 17C shows a cross section view of micro device integrated with optical layers and a backplane. In some embodiments, optical layers, such as color conversion 1722, color filter 1726, passivation layer 1706 and/or an electrode (blocking layer) 1704 or other devices may be included, e.g. deposited, at a bottom surface of the buffer layer 1710 and the micro device 1720. In this case, optical structures, such as a color conversion layer, color filter or other devices may be placed on the underside opposite to the side where the micro-devices are located. Other layers such as planarization/passivation layer 1728 and a reflective layer/reflector 1724 may be deposited at a top surface of the micro device 1720. A top planarization layer/passivation layer 1730 can be deposited over the reflective layer. The integrated circuit layer, e.g. the backplane, may be fabricated after the planarizing layer, and the backplane 1708 may be comprised of a thin film transistor (TFT) layer. Other optional passivation/planarization layers may be deposited over the backplane. The backplane component can be on top of the micro device structure layer.

Figure 17D:
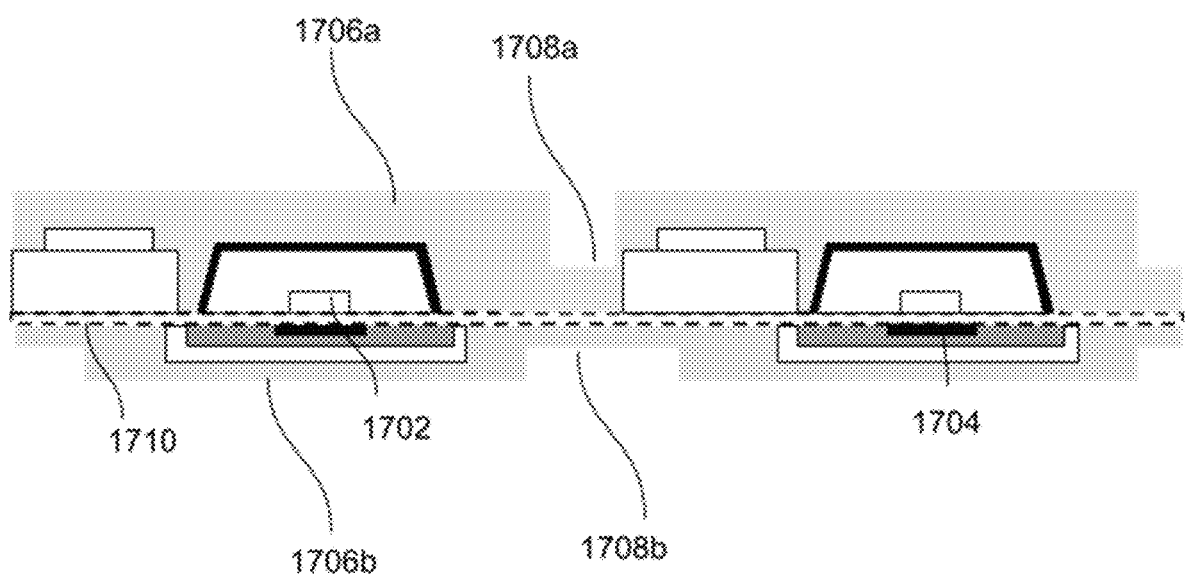
FIG. 17D is a schematic cross-sectional diagram illustrating micro devices integrated on a substrate with trenches in the passivation layers, in accordance with an embodiment of the invention.

FIG. 17D shows a cross section of a system with micro devices integrated on a substrate with trenches in the passivation layers. A plurality of micro devices (e.g. 1702, 1704) are provided over the buffer layer 1710. A plurality of passivation layers can be deposited over the substrate to enable implementation or fabrication of backplane into the system with the micro device. The planarization layer can be a continuous film or can be patterned to create reflective optical structure. A planarization or protective layer 1706a can be deposited covering the backplane and micro devices. This passivation can act as a support structure for the system as well. Another passivation/planarization layer 1706b can be deposited on the other side of the system. This layer 1706b can act as a support for the system as well. A plurality of trenches (1708a and 1708b) can be formed in the passivation layers (passivation layer 1706a & passivation layer 1708b) deposited at top and bottom surfaces. Components of the backplane can be on top of the micro devices as well. The plurality of trenches FIG. 18A-18C shows some exemplary combination of the micro device and backplane compensation on top of the micro devices.

Figure 18A:
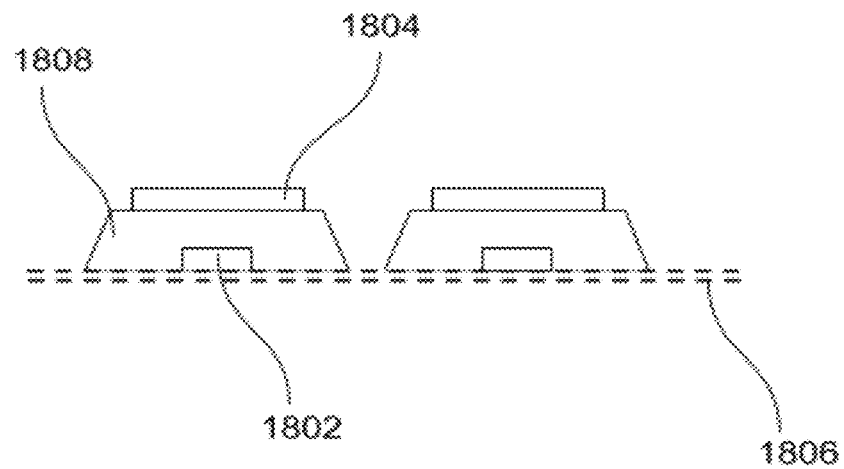
FIG. 18A-18C shows some exemplary combination of the micro device and backplane compensation on top of the micro devices, in accordance with an embodiment of the invention.

FIG. 18A shows a cross section view of micro devices integrated with plurality of passivation layers integrated with backplane components. In one case, a plurality of micro devices 1802 may be formed over a buffer layer 1806. The buffer layer can be a passivation layer. Another passivation layer/planarization layer 1808 may be formed over the micro device and can be patterned to create connections with the backplane components 1804.

Figure 18B:
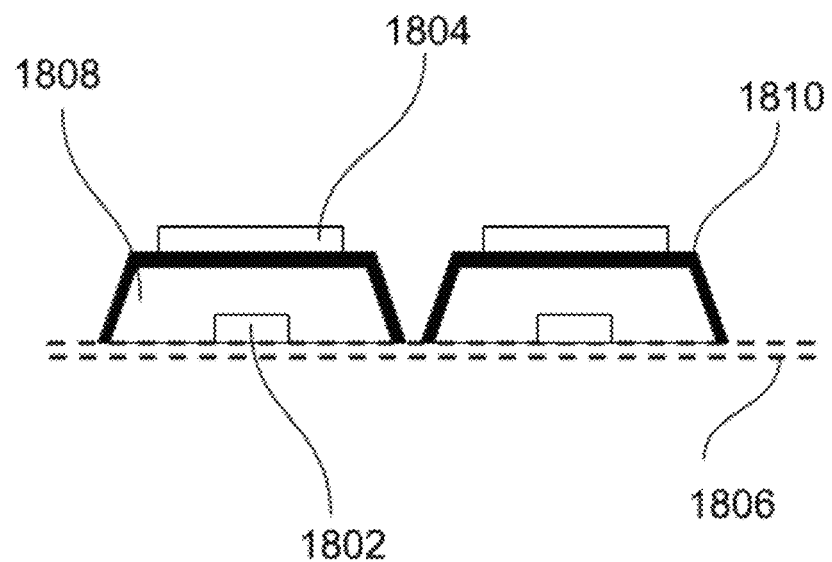

FIG. 18B shows a cross section view of micro devices integrated with plurality of passivation layers integrated with backplane components. In one case, a plurality of micro devices 1802 may be formed over a buffer layer 1806. The buffer layer can be a passivation layer. Another passivation layer/planarization layer 1808 may be formed over the micro device and can be patterned to create connections with the backplane components 1804. A reflective layer/reflector 1810 can be formed over the planarization/passivation layer for directing light from the micro device.

Figure 18C:
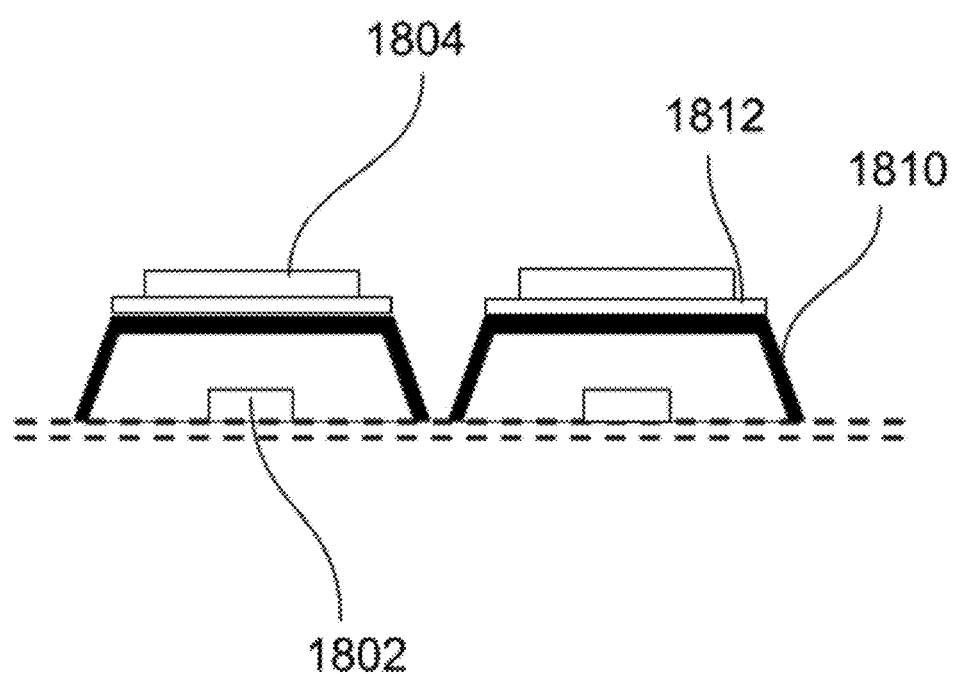

FIG. 18C shows another cross section view of micro devices 1802 integrated with plurality of passivation layers integrated with backplane components wherein a dielectric layer 1812 may be formed over the reflective layer/reflector 1810 to enable light to travel through to a top electrode or backplane components 1804.

Color Conversion Layer Integration with Micro Device Substrate

Some embodiments of the present disclosure relate to the integration of color conversion layer(s) into a micro device substrate.

According to one embodiment, a display system may be provided. The display system may comprise a substrate, a buffer layer deposited over the substrate, a bonding pad formed on a top surface of the buffer layer, at least one micro device transferred on top of the bonding pad, and one or more color conversion layers disposed on the substrate surface or buffer layer surface opposite to the surface of the micro device.

According to another embodiment, a method of manufacturing a display system may be provided. The method may comprising providing a substrate, depositing a buffer layer over the substrate, forming a bonding pad on a top surface of the buffer layer, transferring at least one micro device on top of the bonding pad, and disposing one or more color conversion layers on the substrate surface or buffer layer surface opposite to the surface of the micro device.

According to some embodiments, a display system may be provided. The display system may comprising: a substrate, one or more planarization layers formed over the substrate; a bonding pad formed on a top surface of the one or more planarization layers, at least one micro device transferred on top of the bonding pad, and one or more color conversion layers disposed on or over the micro device.

This disclosure is related to the integration of color conversion layer(s) in a micro device substrate. The micro device substrate may comprise micro light emitting diodes (LEDs), organic LEDs, sensors, solid state devices, integrated circuits, MEMS, and/or other electronic components. The color conversion layers may include phosphor or quantum dots (QD).

In one embodiment, the color conversion layers may integrate on the micro device substrate surface opposite to a surface of the micro device.

In another embodiment, the color conversion layers may integrate on a buffer layer.

In yet another embodiment, the substrate may be removed and color conversion layer(s) may be directly formed on a surface of the buffer layer.

In some embodiments, the color conversion layer(s) may be formed after the buffer layer, wherein the buffer layer may be removed and color conversion layer(s) may be directly formed on the surface of the micro device.

In another embodiment, the buffer layer is the substrate.

In further embodiments, a bonding pad is formed on top of the buffer layer.

In another embodiment, one or more planarization layers may be formed on or over the at least one micro device.

In another embodiment, a reflector/blocking layer may be formed over the buffer layer before the bonding pad.

In yet another embodiment, the bonding pad may be transparent to allow light to get inside or outside of the micro device.

In some embodiments, a black matrix may be deposited between the color conversions patterns to reduce ambient reflection and color mixing of the micro device.

In yet another embodiment, a bank layer may be formed for the color conversion layers to separate different color conversion layers.

In another embodiment, at least one contact deposited over the micro device, through a via in the one or more planarization layers, to provide an electrode to connect the micro device to the backplane.

In another embodiment, the bonding pad comprises a light distribution pad/structure and a bonding layer. The bonding pad may be used to improve the surface profile for bonding.

In another embodiment, the light distribution pad/structure can be formed before the bonding layer. The light distribution structure enhances the light extraction from the micro device. A light distribution layer may be provided in the light distribution structure. The light distribution layer and the light distribution structure may be the same. In another case, a height of the light distribution layer can be adjusted to compensate for the depth of the bank layer. The light distribution layer can be on part of the bank layer with reflector layer, or fill the entire bank layer.

In some embodiments, the planarization layer may be formed around the micro device and a second reflective structure may cover the patterned planarization layer.

In another embodiment, a similar or a different planarization layer(s) may be used to level at least some of the areas around the micro device.

In another embodiment, a backplane may be formed and extended over the micro device. The micro device may have at least one contact to the backplane through an electrode. The electrode may be the same or part of the second reflector.

Figure 19A:
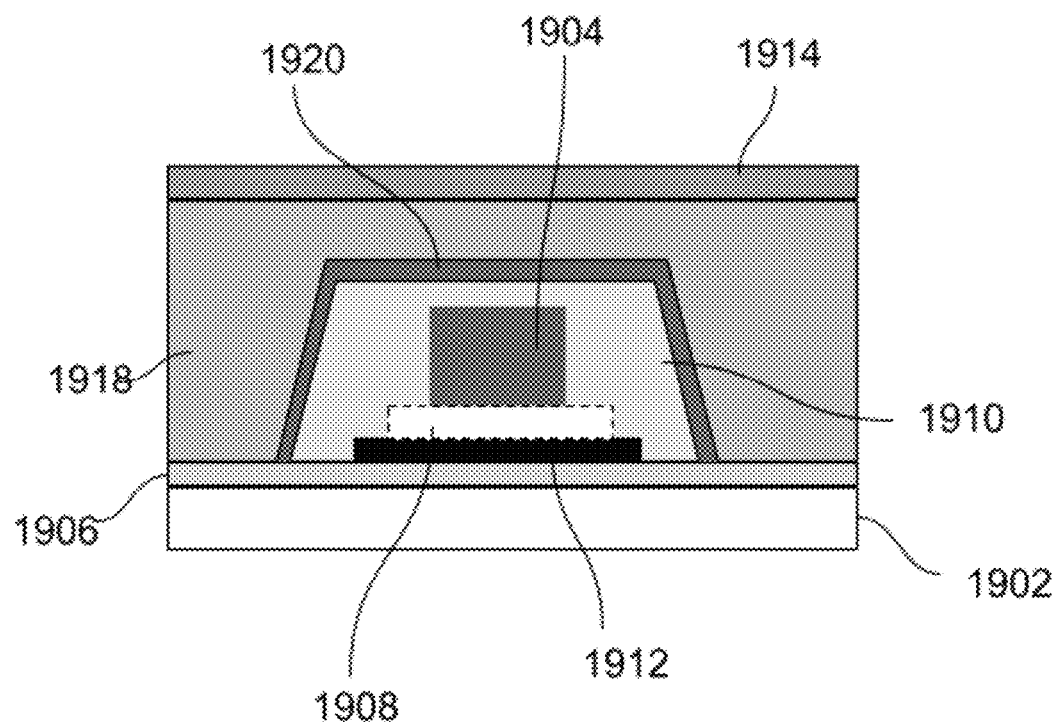
FIG. 19A is a schematic cross-sectional diagram illustrating a micro device integrated with different top layers and a backplane, in accordance with an embodiment of the invention.

FIG. 19A shows a cross section of a micro device integrated with a plurality of layers according to some embodiments of the present invention. FIG. 19A shows a substrate 1902. A buffer layer 1906 may be deposited on a top surface of the substrate 1902. The buffer layer (or layers) can be used as a delamination layer as well separating the fully integrated system from the substrate 1902. It is possible to eliminate the buffer layer 1906 especially when the stacked micro device and circuit structure are staying on the substrate 1902. A bonding pad 1908 may be formed on a top surface of the buffer layer 1906. The bonding pad 1908 and the buffer layer 106 may be the same or different layers. In one embodiment, a reflector/blocking layer 1912 may be formed over the buffer layer before the bonding pad 1908. A micro device 1904 may be transferred into the substrate 1902 on top of the bonding pad 1908. The bonding pad 1908 may be transparent to allow light to get inside or outside of the micro device. The blocking layer 1912 can be a micro device electrode or another functional electrode such as a touchscreen electrode. Other layers such as a planarization layer 1910 may be formed on or over the micro device. It is possible that the planarizing layer 1910 may be made of a few different layers. The planarizing layer 1910 can be a passivation layer. A second reflector/reflective layer 1920 may cover the patterned planarization layer 1910. Another similar or different planarization layer 1918 may be formed over the reflective layer 1920 to level out the areas around the micro device 1904.

In one embodiment, vias may be made in the planarization layer 1918 to connect the micro device 1904 to a backplane 1914. The vias may be used to provide conductive electrode to connect the micro device 1904 to the backplane. The backplane may be extended over the micro device 1904. The backplane can be either thin film transistors, CMOS chiplet, or another type of integrated circuit. Post processing steps for additional structure such as reflective layers or other layers may be used to improve the outcoupling or confinement of the generated LED light. The planarization layer 1918 can be extended over the substrate to provide connections to the backplane 1914. It is noted that any of the layers can be eliminated. In one case, the surface of the transferred device is planarized first. Then, vias can be opened to create contact to the backplane. This contact can be at the edge or in the middle of the arrays. In one case, the conductive electrode may include the second reflector to direct light from the micro device.

Figure 19B:
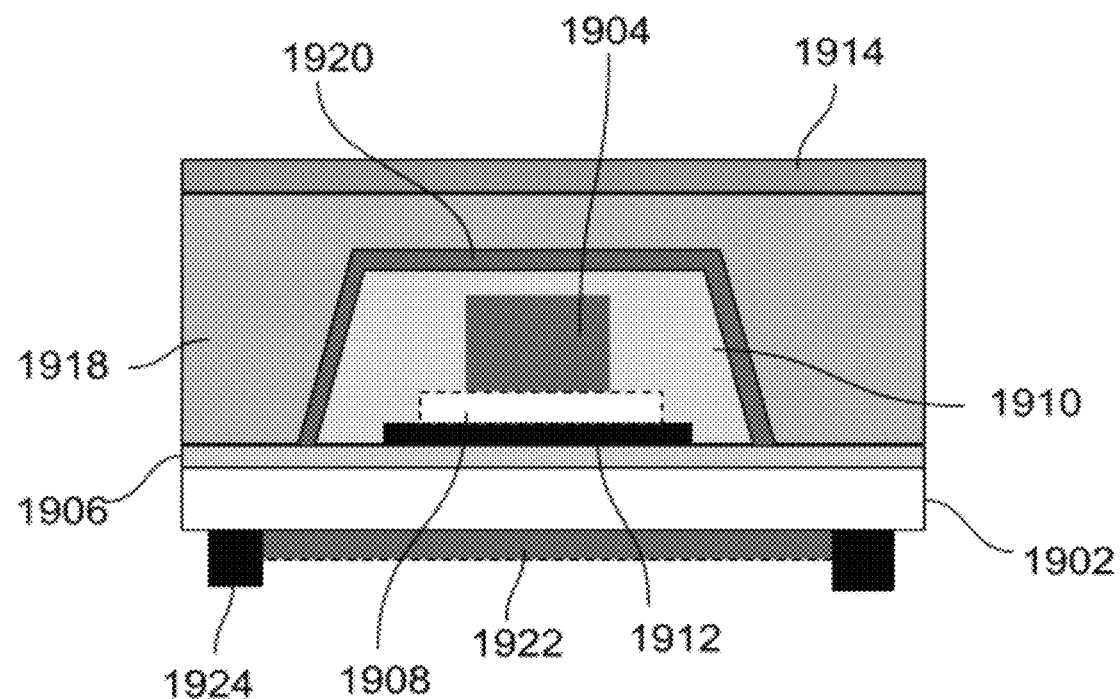
FIG. 19B is a schematic cross-sectional diagram illustrating the micro device integrated with different the top layers, the backplane, and color conversion layers, in accordance with an embodiment of the invention.

FIG. 19B shows a cross section illustrating a micro device integrated with different top layers, a backplane, and color conversion layers. In this case, other structures, such as a color conversion layer(s) 1922, color filter, or other devices may be placed on the underside of the substrate 1902 opposite to the side where the micro device 1904 is located. In another example, color conversion layer(s) 1922 are integrated into the micro device substrate 1902 to create different output from the micro device. Color conversion layers may comprise color filter layers mounted on the buffer layer 1906 to receive light from the light emitting micro device 1904. The micro device light is reflected back to the color conversion layer(s) 1922 in combination by the blocking layer and the reflector layer 1920. In one case, a black matrix 1924 may be deposited between the color conversions patterns to reduce ambient reflection and color mixing of the micro device 1904. In one example, the black matrix may be a layer of resins such as polyimide or polyacrylic in which particles of black pigment such as carbon black have been dispersed. In another aspect, color filters may be deposited on the color conversion layers. One can use a planarization layer and/or bank layer after the color conversion layer before depositing the color filter layers. The bank layer can separate different color conversion layers.

After or before the color conversion, there may be a passivation layer to protect the color conversion materials. A color filter may be added to the stack to allow only the output of the color conversion layer to pass through. A passivation layer can be added after the color conversion layer.

Figure 19C:
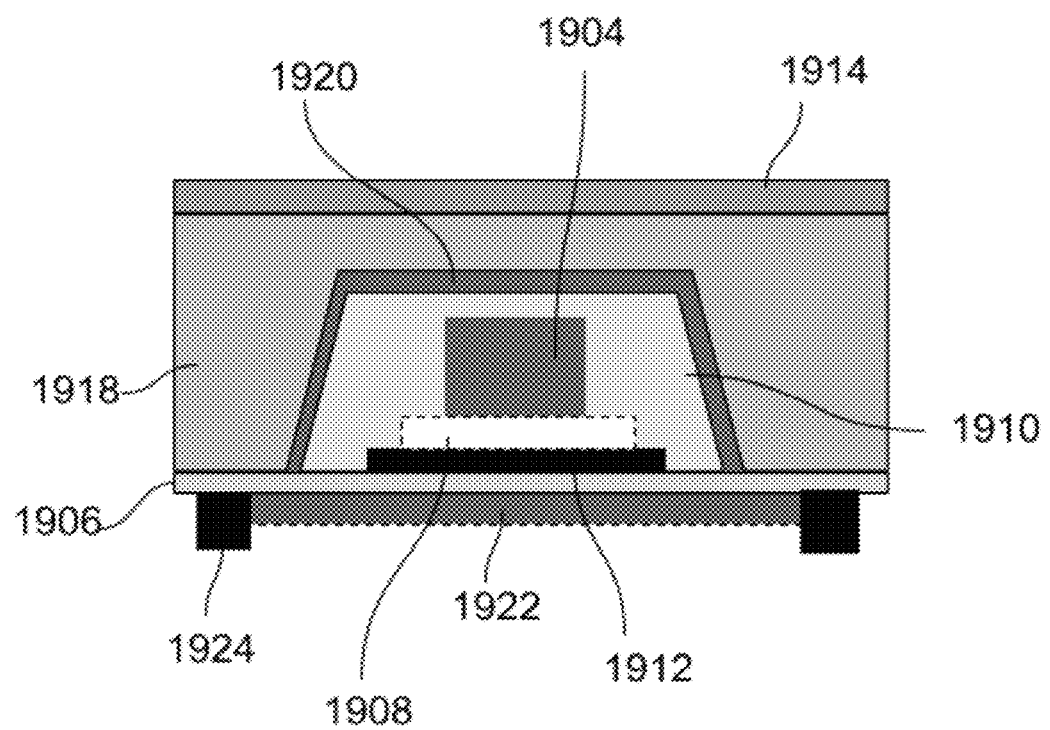
FIG. 19C is a schematic cross-sectional diagram illustrating the micro device integrated with different top layers, the backplane, the color conversion layers, and removal of the substrate, in accordance with an embodiment of the invention.

FIG. 19C shows a cross section illustrating a micro device integrated with different top layers, a backplane, color conversion layers, and removal of the substrate. In this case, the substrate may be removed to enable a flexible system or color conversion layer(s) may be directly formed on the surface of the buffer layer. The system can be separated from the substrate while supported by the backplane 1914. This separation may be done by modifying the buffer layer 1906. The post processing steps may be performed on the surface of the layers separated from the substrate. Here, the buffer layer may include a protective layer to protect the devices (e.g., micro devices, the backplane components, and other conductive layers) from any side effect during the separation process. In one case, the protective layer can absorb the excess emission from laser that was used to separate the system from the substrate. In one embodiment, the protective layer can be removed after the separation process.

Figure 19D:
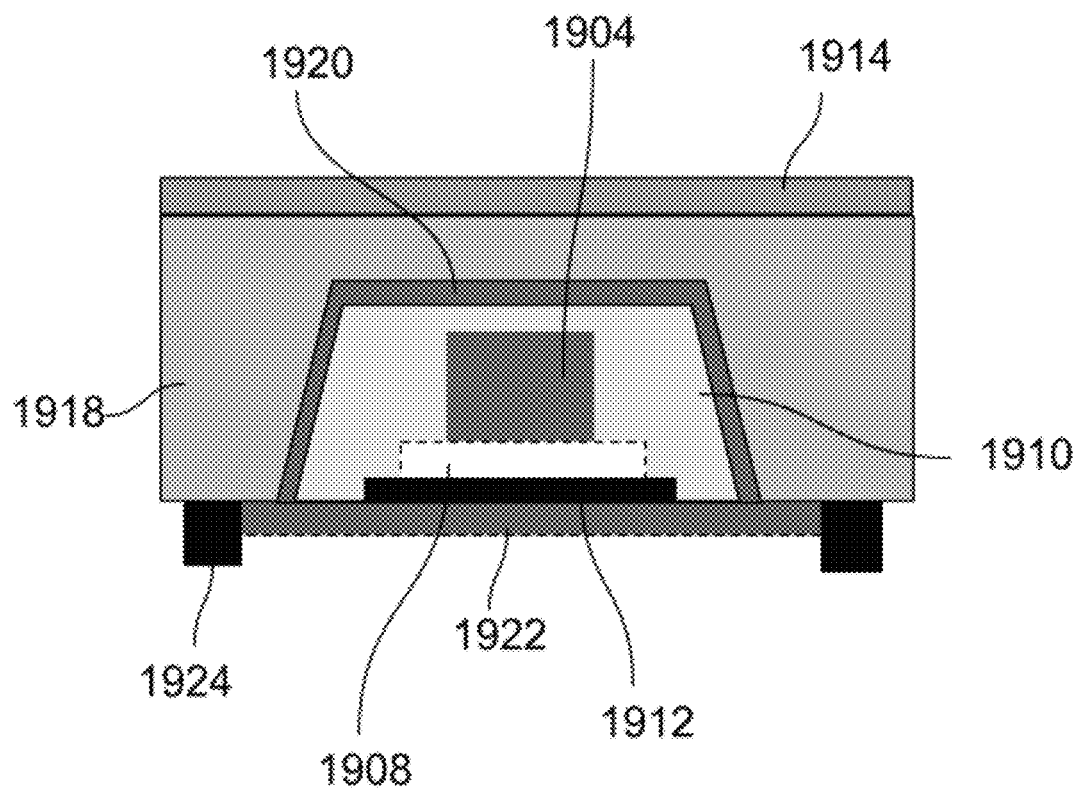
FIG. 19D is a schematic cross-sectional diagram illustrating the micro device integrated with different top layers, the backplane, the color conversion layers, and removal of the buffer layer, in accordance with an embodiment of the invention.

FIG. 19D shows a cross section illustrating a micro device integrated with different top layers, a backplane, color conversion layers, and removal of the buffer layer. After the removal of the substrate, the buffer layer 1906 may be removed and the color conversion layer(s) may be formed on the surface. Here, a plurality of vias can be formed in the one or more layers to provide coupling options to the micro devices or the backplane.

Figure 20A:
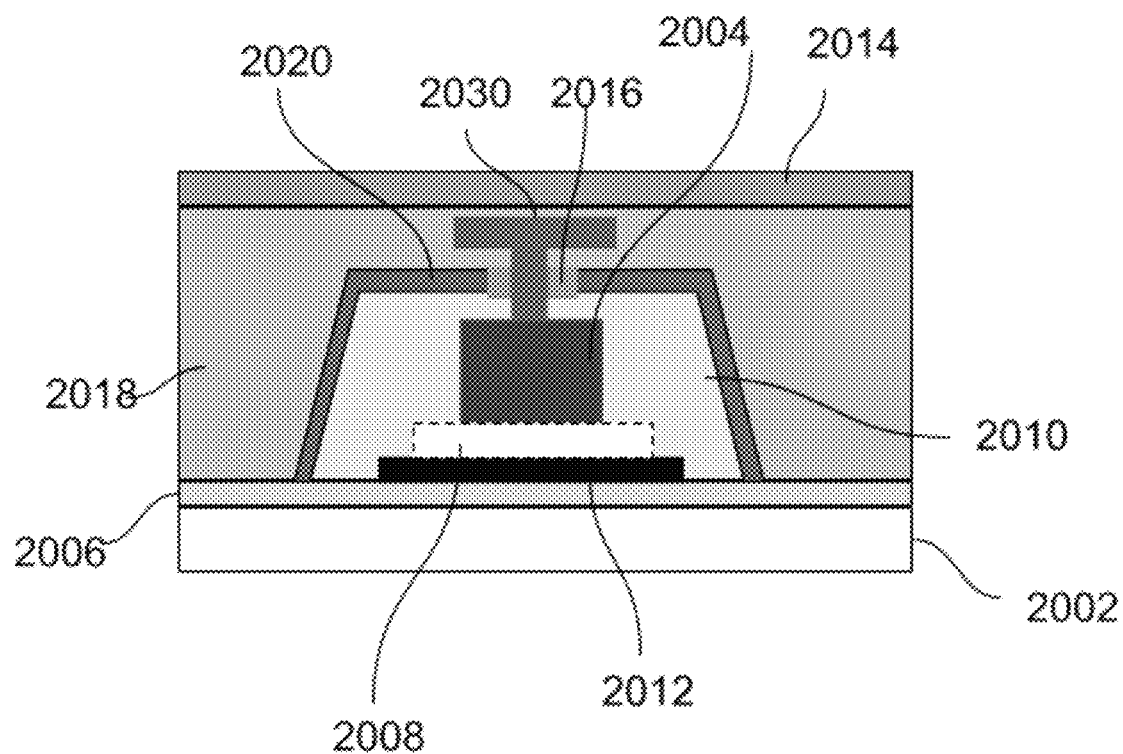
FIG. 20A is a schematic cross-sectional diagram illustrating a micro device integrated with different top layers, a backplane, and a contact on a top surface of the micro device, in accordance with an embodiment of the invention.

FIG. 20A shows a cross section of an embodiment with micro devices. Here, a buffer layer 2006 may be deposited on top of the substrate 2002. Micro device 2004 is transferred into the substrate 2002. A planarizing layer 2010 is formed over the micro device 2004. Vias 2016 can be made in the planarizing layer. These vias can be opened to create contact 2030 to the backplane 2014. This contact 2030 can be at the edge or in the middle of the micro device. A reflective layer 2020 can be deposited to direct light from the micro device. Another planarization layer 2018 can be extended over the substrate to provide connections to the backplane through openings. A bonding pad 2008 can couple to the device through at least one of the contacts (e.g., the contact at the top side). In one case, a layer that can be dielectric is covering the part of the device surface that is not covered by the contact. There can be side surfaces which can have different functions such as a passivation layer, optical enhancement layer, or encapsulation layer.

Figure 20B:
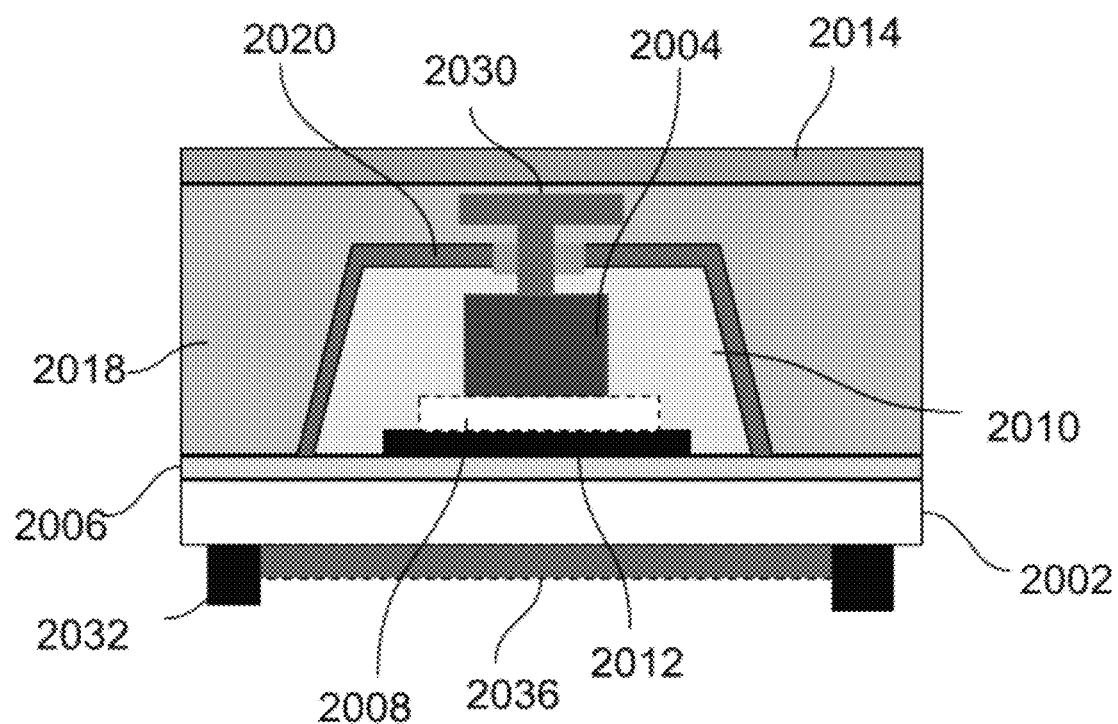
FIG. 20B is a schematic cross-sectional diagram illustrating the micro device integrated with different top layers, the backplane, the color conversion layers, and the contact on a top surface of the micro device, in accordance with an embodiment of the invention.

FIG. 20B shows a cross section illustrating a micro device integrated with different top layers, a backplane, color conversion layers, and a contact on a top surface of the micro device through a via in the planarization layer 2016. These vias can be opened to create contact 2030 to the backplane 2014. This contact 2030 can be at an edge or in the middle of the micro device. In one case, other structures, such as a color conversion layer(s), color filter or other devices may be placed on the underside opposite to the side where the micro device is located. In another example, color conversion layer(s) 2036 are integrated into the micro device 2004 substrate to create different output from the micro device. A color filter may be mounted on the buffer layer to receive light from the light emitting micro device. In one case, a black matrix 2032 may be deposited between the color conversions patterns to reduce ambient reflection and color mixing of the micro device.

One may use a planarization layer and/or bank layer after or before the color conversion layer before depositing the color filter layers. The bank layer can separate different color conversion layers. A bank layer may be formed for the color conversion layers to separate different color conversion layers.

Figure 20C:
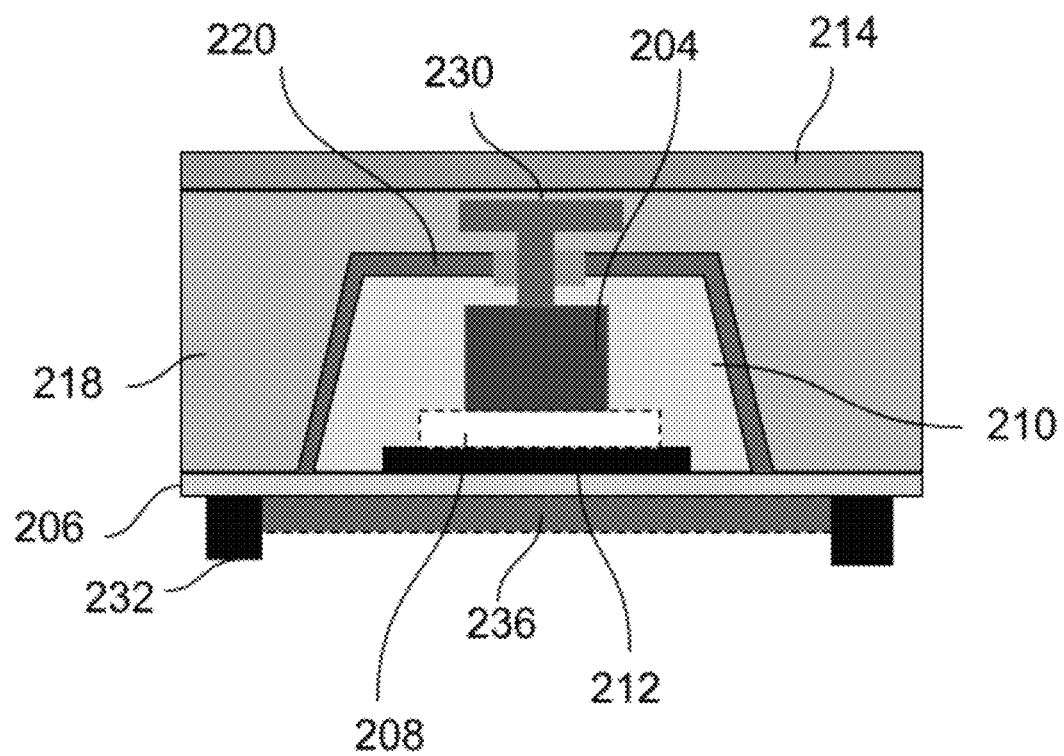
FIG. 20C is a schematic cross-sectional diagram illustrating the micro device integrated with different top layers, the backplane, the color conversion layers, the contact on a top surface of the micro device, and removal of the substrate, in accordance with an embodiment of the invention.

FIG. 20C shows a cross section illustrating a micro device integrated with different top layers, a backplane, color conversion layers, a contact on a top surface of the micro device through a via in the planarization layer and removal of the substrate. In this case, the substrate 2002 as shown in FIG. 20B may be removed to enable a flexible system or post processing steps performed on the side of the system facing the substrate. The system can be separated from the substrate 2002 while supported by the backplane 2014. This separation may be done by modifying the buffer layer 2006.

Figure 20D:
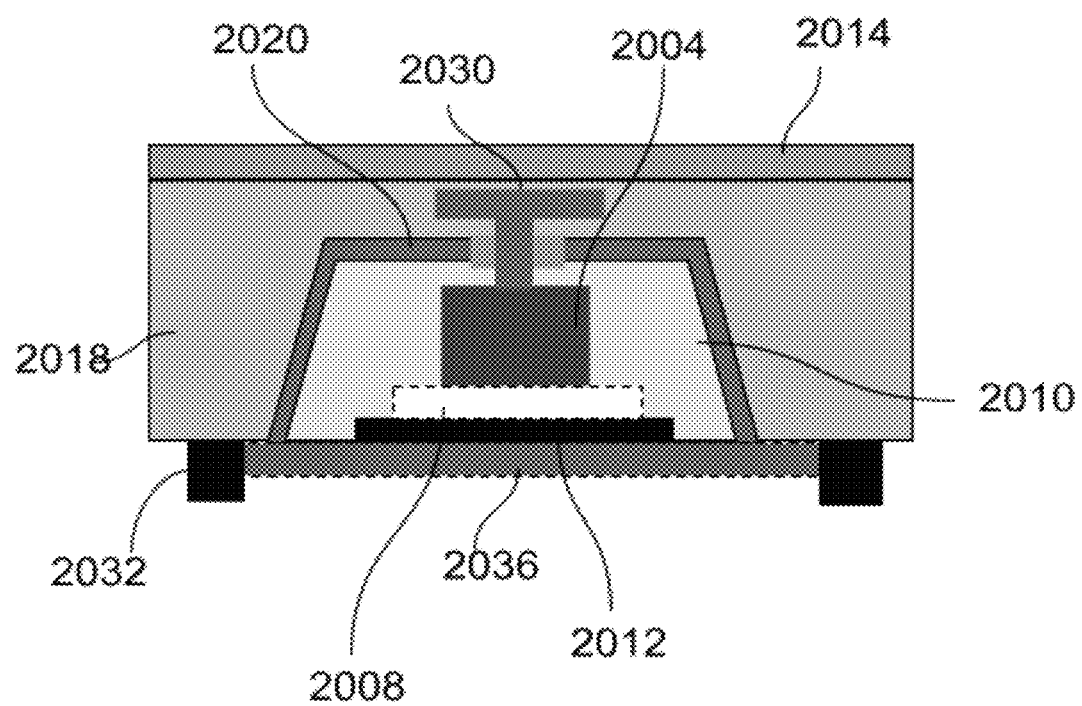
FIG. 20D is a schematic cross-sectional diagram illustrating the micro device integrated with different top layers, the backplane, the color conversion layers, the contact on a top surface of the micro device through a via in the planarization layer, and removal of the buffer layer, in accordance with an embodiment of the invention.

FIG. 20D shows a cross section illustrating a micro device integrated with different top layers, a backplane, color conversion layers, a contact on a top surface of the micro device through a via in the planarization layer, and removal of the buffer layer. After the removal of the substrate as shown in FIG. 20C, the buffer layer 2006 may be removed. Here, a plurality of vias can be formed in the one or more layers to provide coupling options to the micro devices or the backplane 2014.

FIGS. 21A-21D shows cross section views illustrating a micro device having reflector on sidewalls of the micro device according to embodiments of the present disclosure. Here, a buffer layer 2106 deposited on top of the substrate 2102. The micro device 2104 is transferred into the substrate 2102. A reflective layer 2118 may be deposited on the sidewalls of the micro device 2104 to direct light from the micro device. A planarizing layer 2110 may be formed over the micro device. A via 2120 may be made in the planarizing layer 2110 to create contact 2130 to the backplane 2114. This contact 2130 can be at an edge or in the middle of the micro device. A bonding pad 2108 may couple to the device through at least one of the contacts (e.g., the contact at the top side).

Figure 21A:
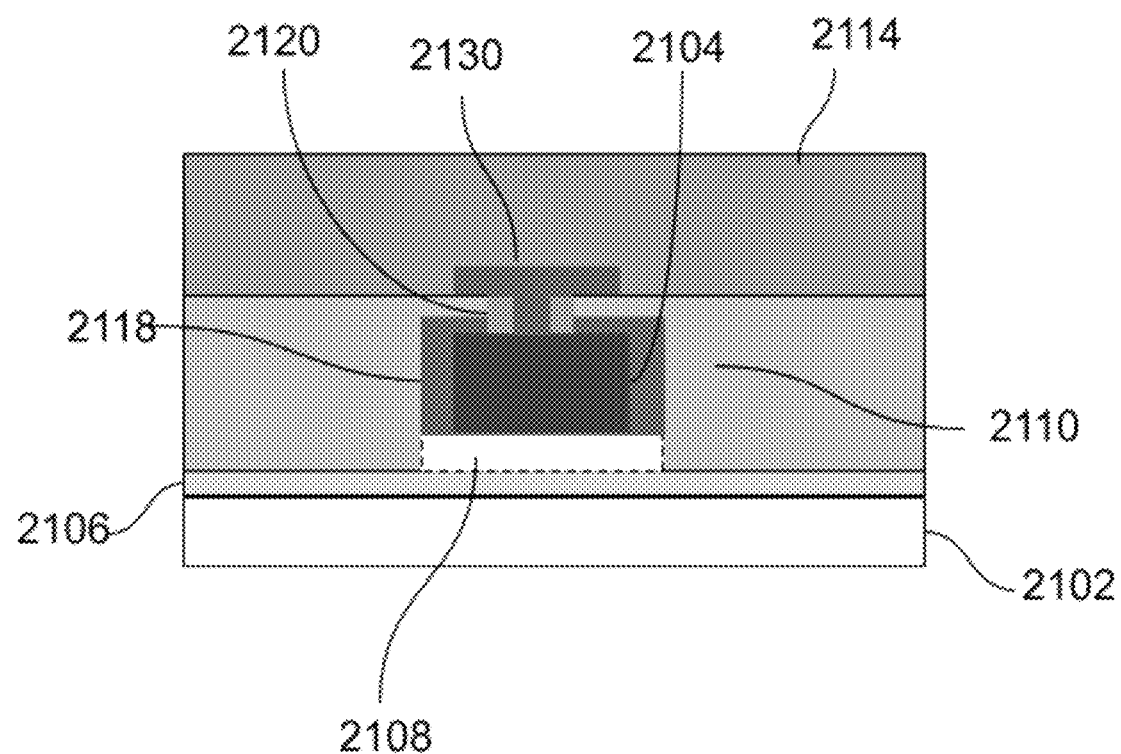
FIGS. 21A-21D are schematic cross-sectional diagrams illustrating a micro device having reflector on sidewalls of the micro device, in accordance with an embodiment of the invention.
Figure 21B:
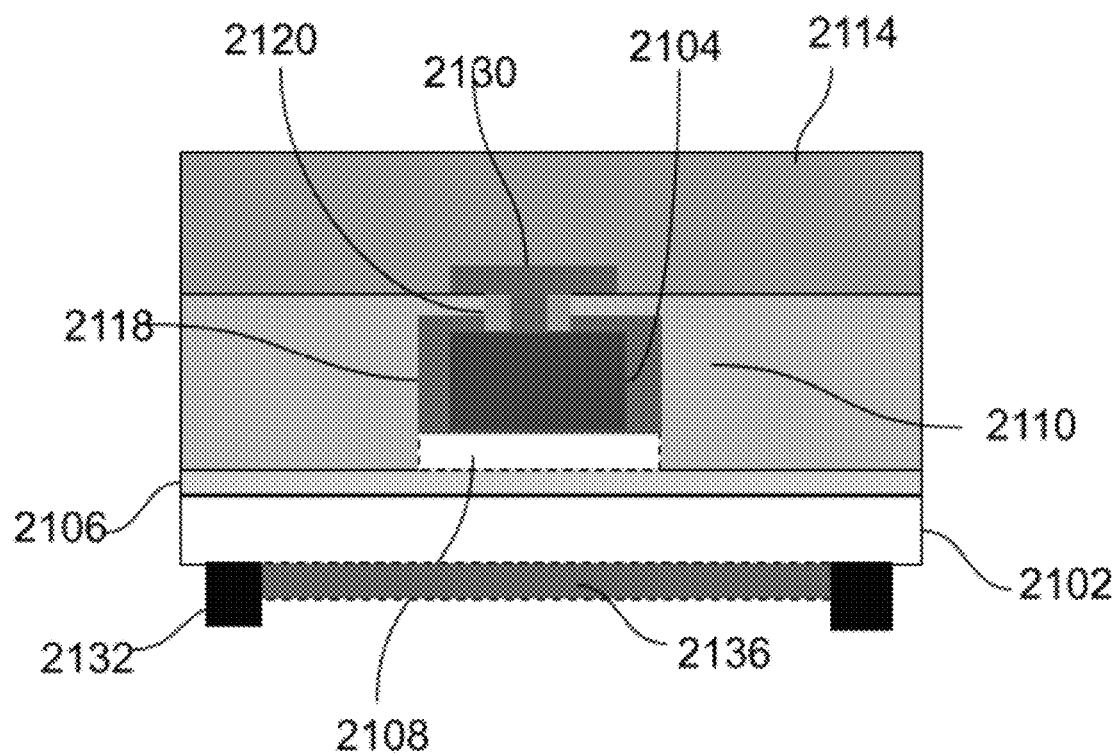

FIG. 21B shows the integration of color conversion layer(s) into the micro device substrate 2102 on the underside opposite to the side where the micro device 2104 is located to create different output from the micro device. In one case, a black matrix 2132 may be deposited on the sidewalls of the color conversion layers 2136 to reduce an ambient reflection of the micro device 2104.

Figure 21C:
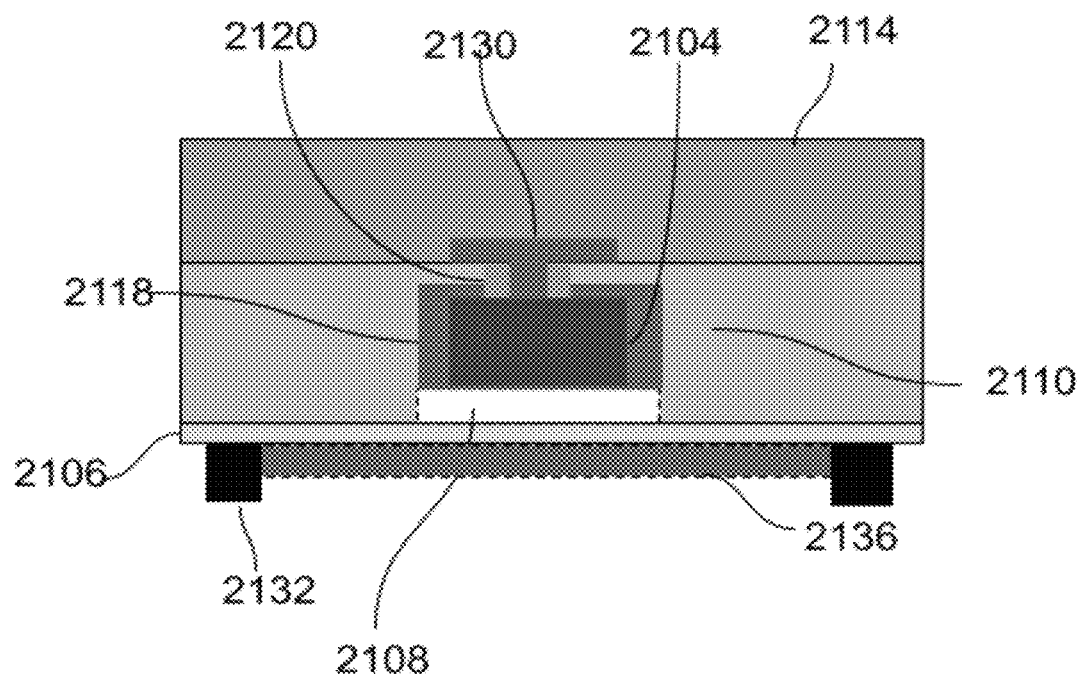

FIG. 21C shows a cross section illustrating a micro device integrated with a contact on a top surface of the micro device, and removal of the substrate. In this case, the substrate 2102 as shown in FIG. 21B may be removed to enable a flexible system or post processing steps performed on the side of the system facing the substrate. The system can be separated from the substrate 2102 while supported by the backplane 2114. The separation may be done by modifying the buffer layer 2106.

Figure 21D:
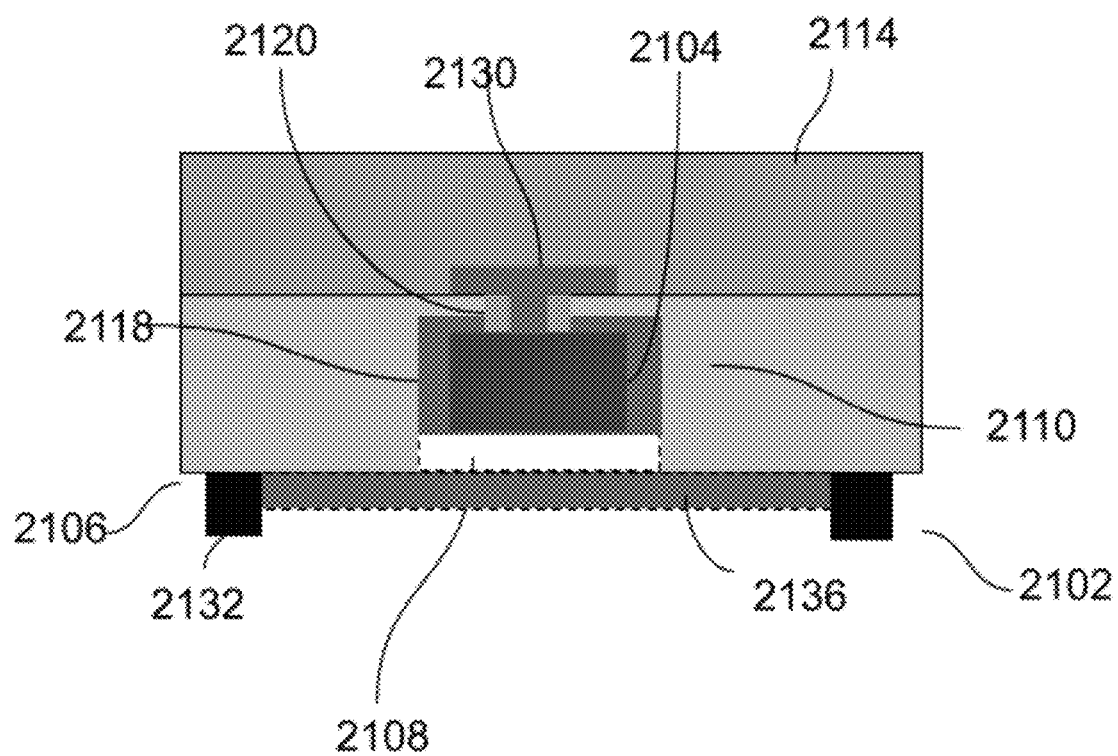

FIG. 21D shows that after the removal of the substrate as shown in FIG. 21C, the buffer layer 2106 may be removed. Here, a plurality of vias can be formed in the one or more layers to provide coupling options to the micro devices or the backplane 2114.

Figure 22:
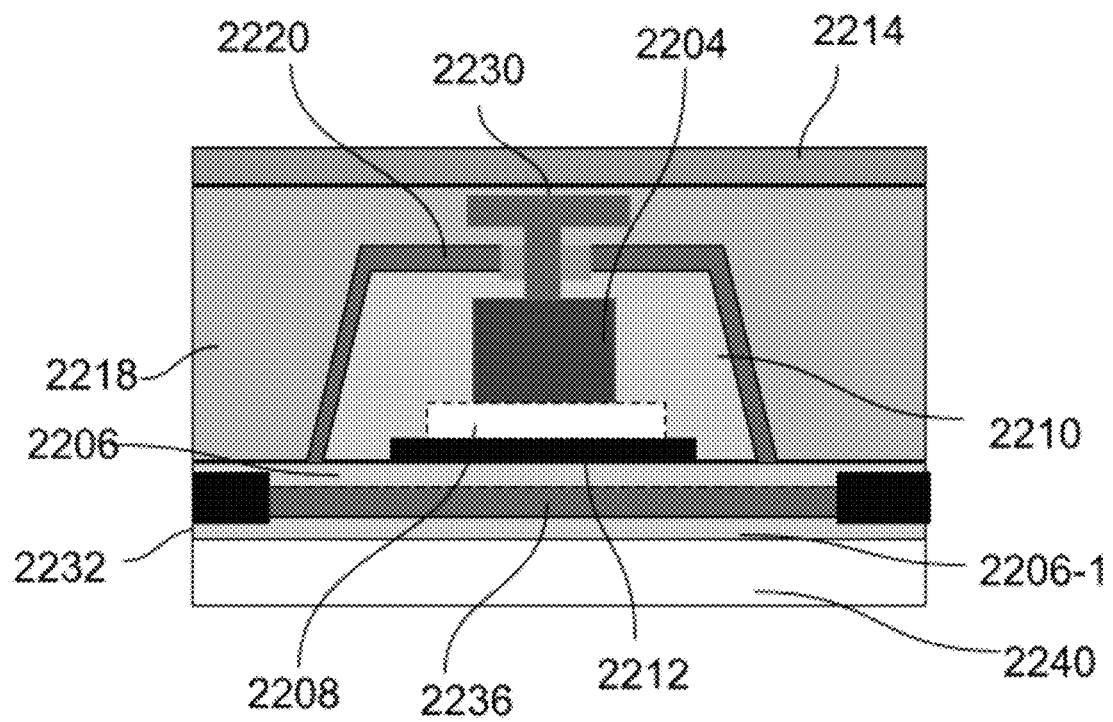
FIG. 22 is a schematic cross-sectional diagram illustrating a micro device integrated with color conversion layers on a buffer layer, in accordance with an embodiment of the invention.

FIG. 22 shows a cross section illustrating a micro device integrated with different layers and a backplane. In this case, a buffer layer 2206-1 may be formed on the substrate 2240 followed by formation of color conversion layer(s) 2236 over the buffer layer 2206-1.

Figure 23A:
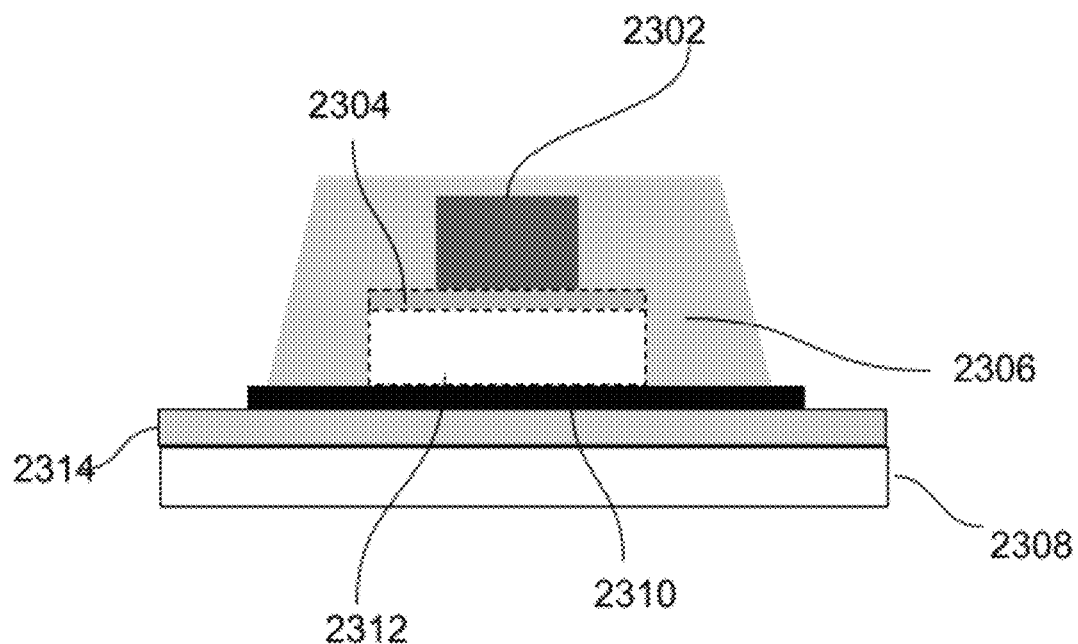
FIGS. 23A-23B are schematic cross-sectional diagrams illustrating a display system, in accordance with an embodiment of the invention.
Figure 23B:
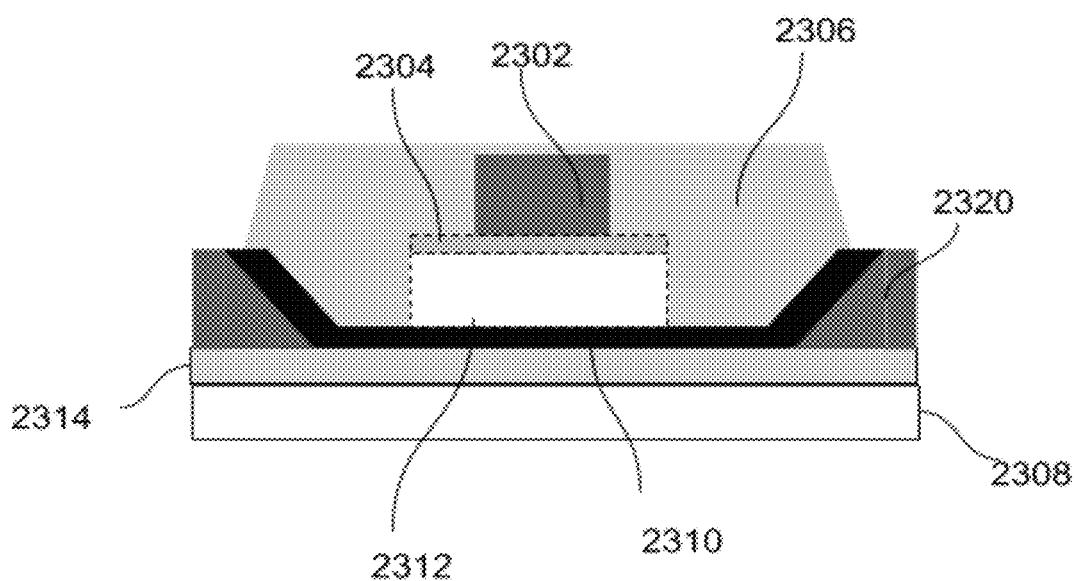

FIGS. 23A-23B show a cross section of a display system. In FIG. 23A, a substrate 2308 may be provided. A plurality of planarization layers 2314 may be formed over the substrate. A backplane may also be formed over the planarization layers. A bonding pad may be formed on a top surface of the planarization layer(s) 2314. The bonding pad comprises a light distribution pad 2312 and a bonding layer 2304. The light distribution pad 2312 and the bonding layer 2304 may be the same or different. In one embodiment, a reflector layer/blocking layer 2310 may be formed over the planarization layer(s) before the bonding pad. The reflector (or the blocking layer) 2310 is mounted on one or more sides of the light distribution pad to reflect light back through the light distribution structure and color conversion layer(s). A micro device 2302 may be transferred into the substrate 2308 on top of the bonding pad. The bonding pad may be transparent to allow light to get inside or outside of the micro device. The bonding pad may be provided to improve the surface profile for bonding. The reflector layer 2310 coupled to the micro device may direct the light through the light distribution pad. There may be a filler around the micro device. The filler may be a color conversion layer(s) 2306. In another case, color conversion may be on top of a filler layer.

The light distribution pad 2312 distributes the light before reaching the color conversion layer(s) 2306. In one structure, the light is distributed and directed away from the substrate where the color conversion layer 2306 is located. The light distribution pad can be a thick transparent layer. In one example, this layer is more than 3 µm. In another example, the side of the transparent layer is blocked by opaque or reflective layer(s) 2310 for each pixel or sub-pixel. In another example, there can be a reflective layer behind or on top of the micro device.

With reference to FIG. 23B, a substrate 2308 may be provided. A plurality of planarization layers 2314 may be formed over the substrate. A buffer layer may also be formed over the substrate. A backplane may also be formed over the substrate. Here, a transparent bonding pad may be formed inside a reflector structure 2310. The bonding pad comprises a light distribution pad 2312 and a bonding layer 2304. The reflector 2310 is transparent and as such the light from the micro device can be directed into the reflector. In one case, the reflector can also direct the light to the micro device in case the micro device is a sensor. A bank layer 2320 or other planarization layers may be deposited over the reflective layer. There may be a filler around the micro device. The filler may be a color conversion layer(s) 2306. In another case, color conversion may be on top of a filler layer.

In another embodiment, the light distribution pad/structure 2312 can be formed before the bonding layer 2304. The light distribution structure 2312 enhances the light extraction from the micro device. In another case, a height of the light distribution layer can be adjusted to compensate for the depth of the bank layer 2320. The light distribution layer can be on part of the bank layer with reflector layer or fill the entire bank layer.

Expanding the Size of Micro-Device for a Better Integration

Some embodiments of the present disclosure relate to methods and structures for enhancing the bonding process of micro devices into a substrate (e.g. system substrate).

Development of micro-devices consists of few major steps such as epitaxial growth of multiple layers, patterning and passivation of the layers, and lift off process. These steps can be costly and therefore, there is a significant desire to reduce the size of micro devices to produce more of them in one wafer substrate. This way, the cost per micro-device can be reduced. However, handling and bonding of such a device can be challenging. For example, for sub 10 micrometer device, the pads can be as small as a couple of micrometers. Bonding such small pads to a substrate requires significant alignment as the quality of the bonding will be affected significantly by the overlap. Moreover, the property of such bonding can be compromised due to the small surface area of the bond pads. There remains a need for expanding the device area or bonding area of micro devices.

Some embodiments of the present disclosure relate to expanding the device area or bonding area of micro devices. Herein described, an optoelectronic device comprising one or more extension layers formed around the optoelectronic device and at least one contact layer extended to the extension layers.

Various embodiments in accordance with the present structures and processes provided are described below in detail.

Figure 24:
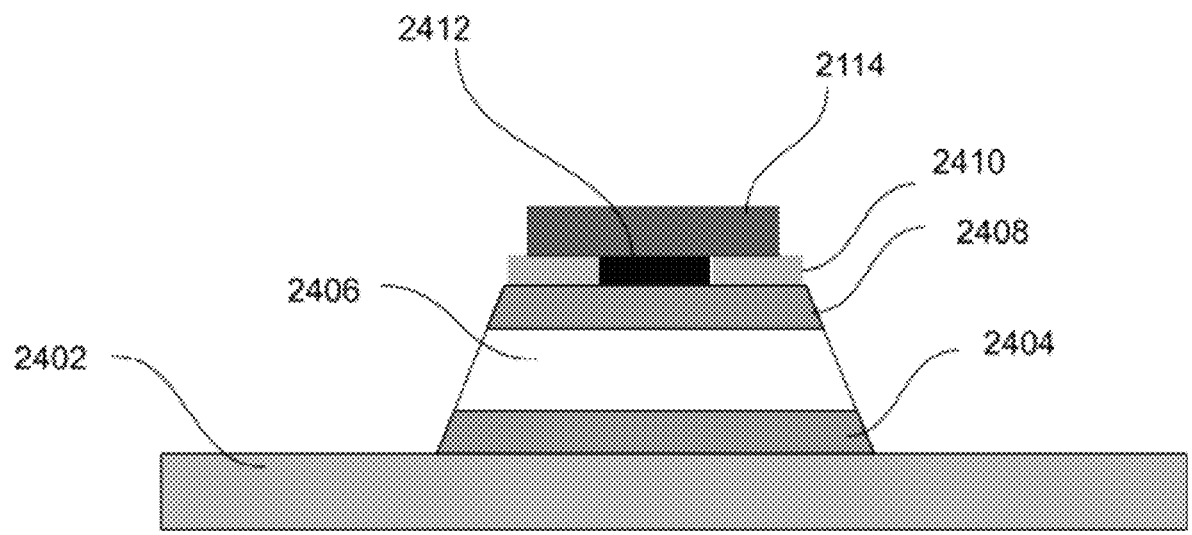
FIG. 24 is a schematic cross-sectional diagram illustrating a device substrate with a stack of layers deposited thereon, in accordance with an embodiment of the invention.

FIG. 24 shows an optoelectronic device substrate 2402, wherein different conductive layers 2404 and active layers 2406 are deposited on top of the device substrate 2402 followed by other conductive layers 2408. The device comprising a plurality of semiconductor layers disposed on the device substrate 2402 forming a top surface and a bottom surface, wherein the plurality of semiconductor layers are isolated into smaller areas forming at least one side surface and at least one conductive pad is formed that is coupled to the optoelectronic device on either the top or the bottom surface. The conductive layers 2404 may comprises buffer layers, p-type doped layers, n-type doped layers, charge blocking layers, and electrode. The active layers 2406 may comprise multi quantum well (MQW) layer, and other conductive layers 2408. The MQW layer may include a plurality of single quantum layers in a stack. The conductive layers can be transparent or opaque. The examples of a transparent conductive layer are thin Ni/Au or ITO that can be formed on the p-doped semiconductor layer (e.g. GaN or GaAs) for a better lateral current conduction. The conductive layer can have a stack of different layers. For example, the p-type electrode such as Pd/Au, Pt or Ni/Au is then formed on the transparent conductive layer. Here, the ohmic contact 2412 is surrounded by a dielectric layer 2410. A bonding pad 2414 can be deposited over the ohmic contact 2412 and can be extended over the dielectric layer. The dielectric layer can avoid unwanted short/coupling between the device and the ohmic contact.

However, for small devices or devices with multiple pads, the area may not be sufficient to make the pads large.

Figure 25A:
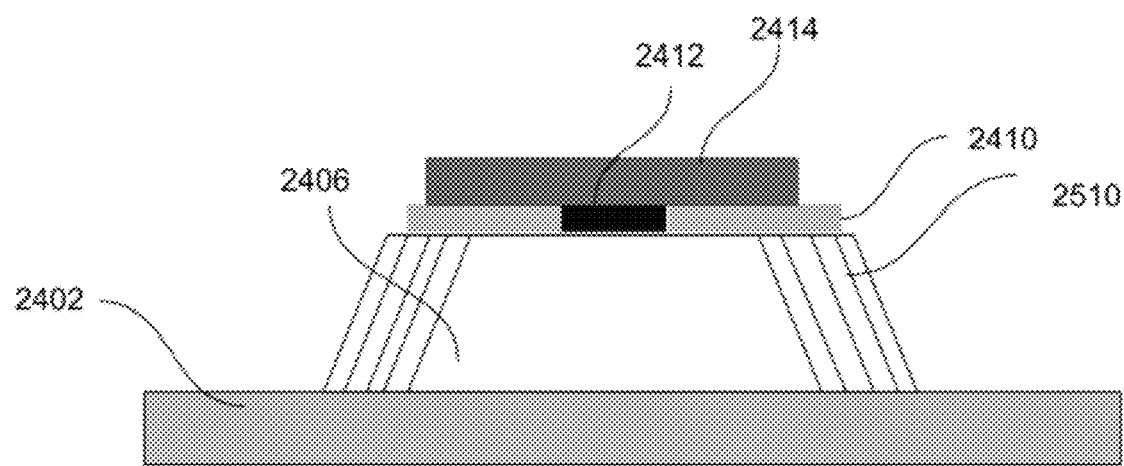
FIG. 25A shows a structure where extension layers are added to the device, in accordance with an embodiment of the invention.

FIG. 25A shows the microdevice 2406 formed on the substrate 2402 wherein a plurality of extension layers 2510 are added to the device 2406. Here, the one or more extension layers are formed around the optoelectronic device 2406 at the side surface and at least one bonding pad e.g., 2414 may extended to the one or more extension layers 2510. Some of these extension layers 2510 can have other functions such as reflection, color conversion, and etc. The dielectric layer 2410 can be extended over the extension layers 2510. The bonding pad 2414 can extend over the extension layers 2510 as well. The extension layers 2510 can be also optimized to enhance the light extraction by using different reflection indices. In one case, the extension layers 2510 can be formed on a buffer layer deposited on the substrate 2402.

In one case, at least one of the one or more extension layers is a polymer and a width of the at least one of the one or more extension layers is between 100 nm to a few micrometers.

Figure 25B:
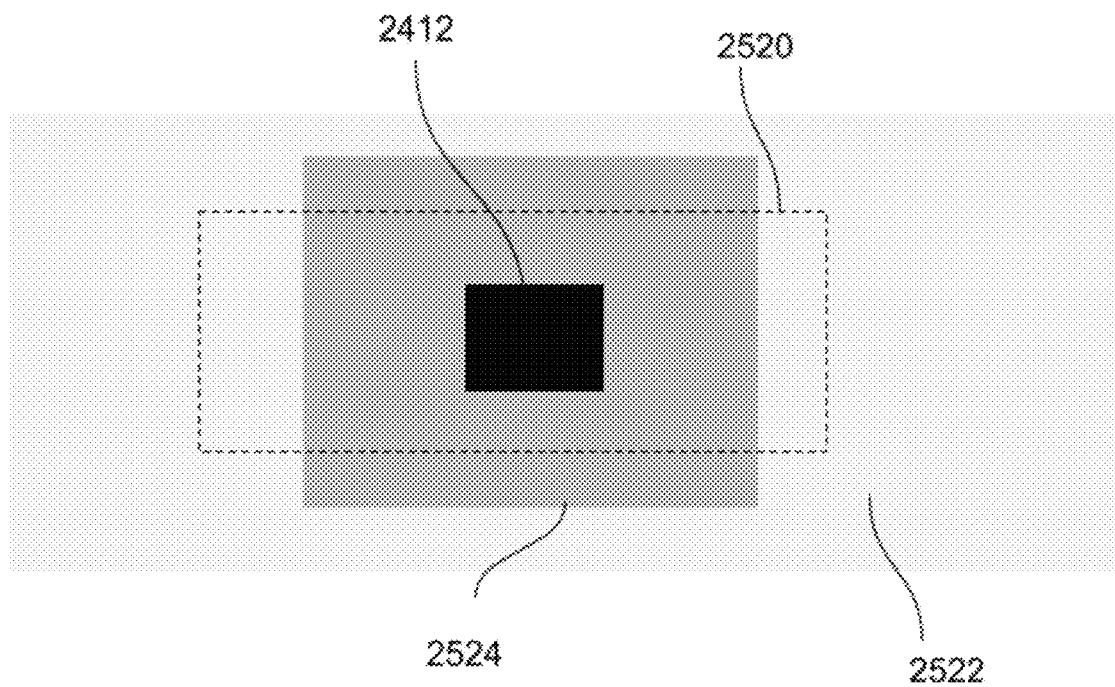
FIG. 25B shows an exemplary top view of the device of the structure in FIG. 25A, in accordance with an embodiment of the invention.

FIG. 25B shows an exemplary top view of the device as shown in FIG. 25A. Here, the extension layers 2522 covers at least one side of the micro device 2524 and the pad 2520 connected to the contact/via 2412 extends to at least a part of the extension layers 2522 in one direction.

Figure 26A:
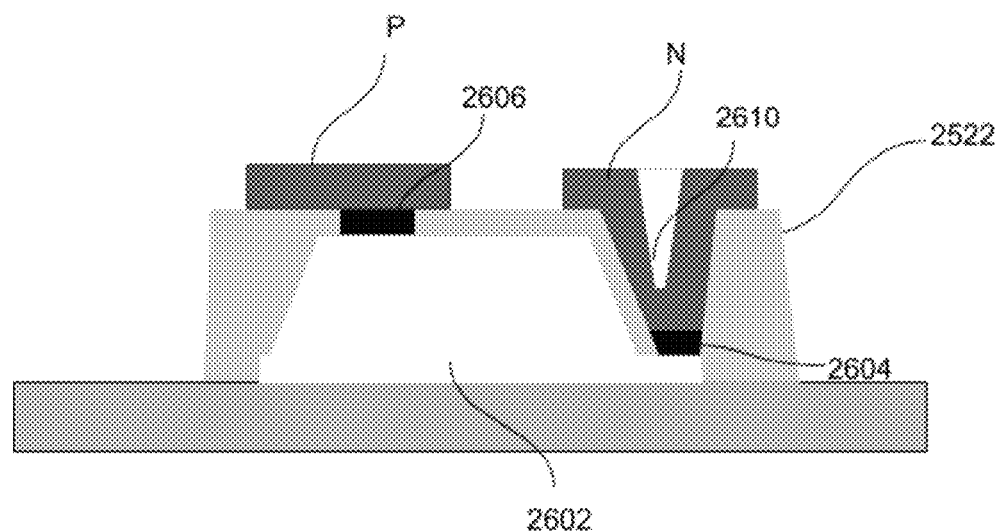
FIG. 26A shows a device where the extension layers are used as planarization layers, in accordance with an embodiment of the invention.

FIG. 26A shows a device where the extension layers 2522 are used as planarization layers as well. Here, the device 2602 has more than one contact (2606, 2604) and there is an opening in the extension layers 2522 to provide access to at least one of the contacts (2606, 2604). The extension layers 2522 can include the dielectric layer as well. The micro device 2602 can have p or n type bonding pads. One of the bonding pads (P, N) at least cover a part of the extension layers 2522. A trench 2610 is made through the extension layer 2522 to a lower level contact 2604

Figure 26B:
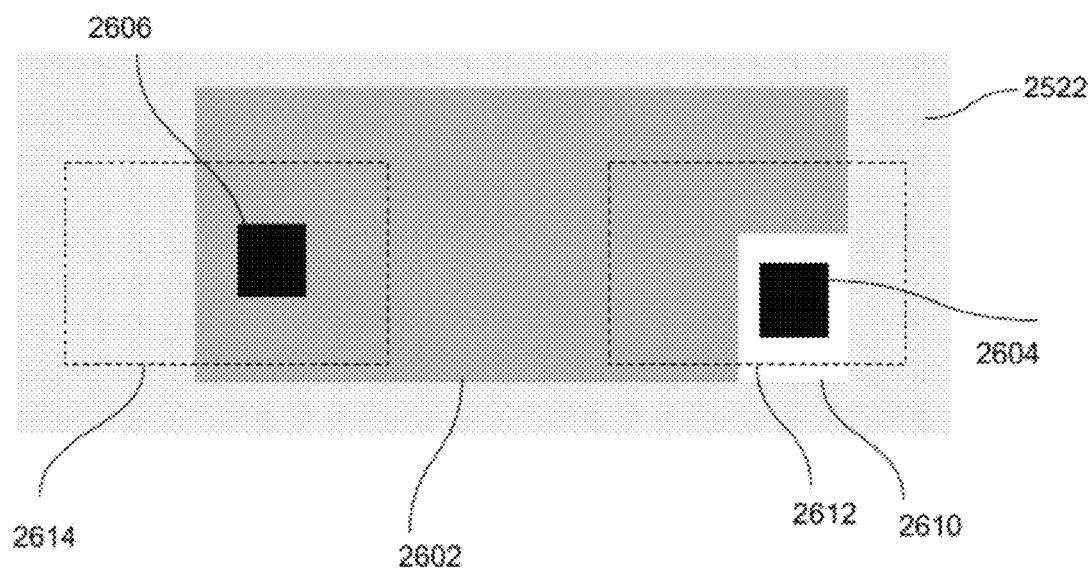
FIG. 26B shows an exemplary top view of the structure in FIG. 26A, in accordance with an embodiment of the invention.

FIG. 26B shows an exemplary top view of the structure in FIG. 26A. Here, the extension layers 2522 cover at least one side of a trench 2610 to a lower level contact 2606. The bonding pad 2612 for that connection 2604 can extend to at least one area of the extension layer 2522. The other contact 2606 on the other side of the device 2602 is connected to the another bonding pad 2614 that can be extended to at least another area of the extension layers 2522.

Figure 27A:
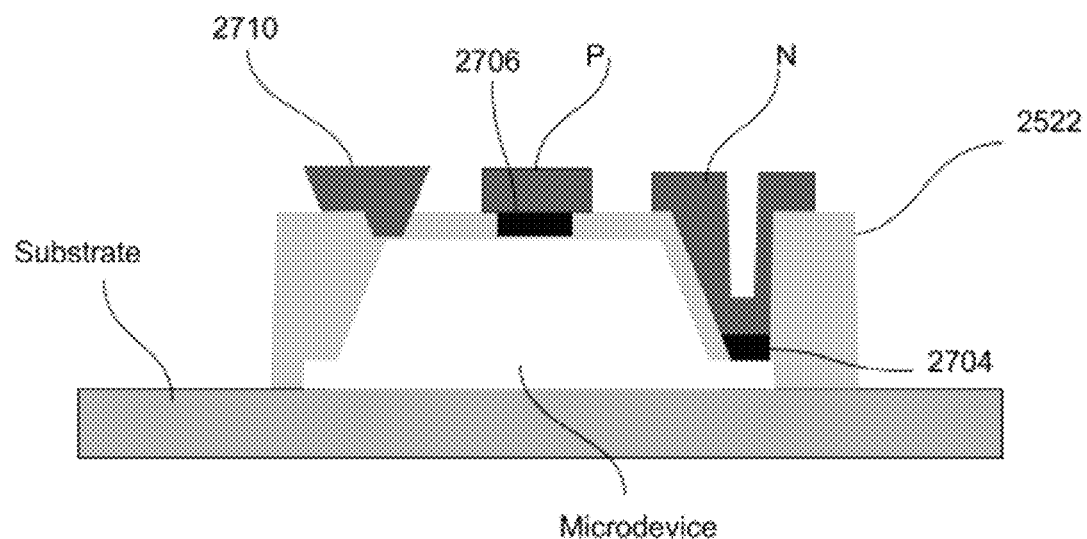
FIG. 27A is a schematic cross-sectional diagram illustrating the extension layers are used as planarization as well, in accordance with an embodiment of the invention.

FIG. 27A shows another device embodiment where the extension layers 2522 are used as planarization layers as well. Here, the device has more than one contact (2704, 2706) and there is an opening in the extension layers to provide access to at least one of the contacts (2704, 2706). The extension layers 2522 can include the dielectric layer as well. One of the pads (P, N) at least cover part of the extension area. A gate contact 2710 can also be provided to the extension layers 2522 connected to gate metal.

Figure 27B:
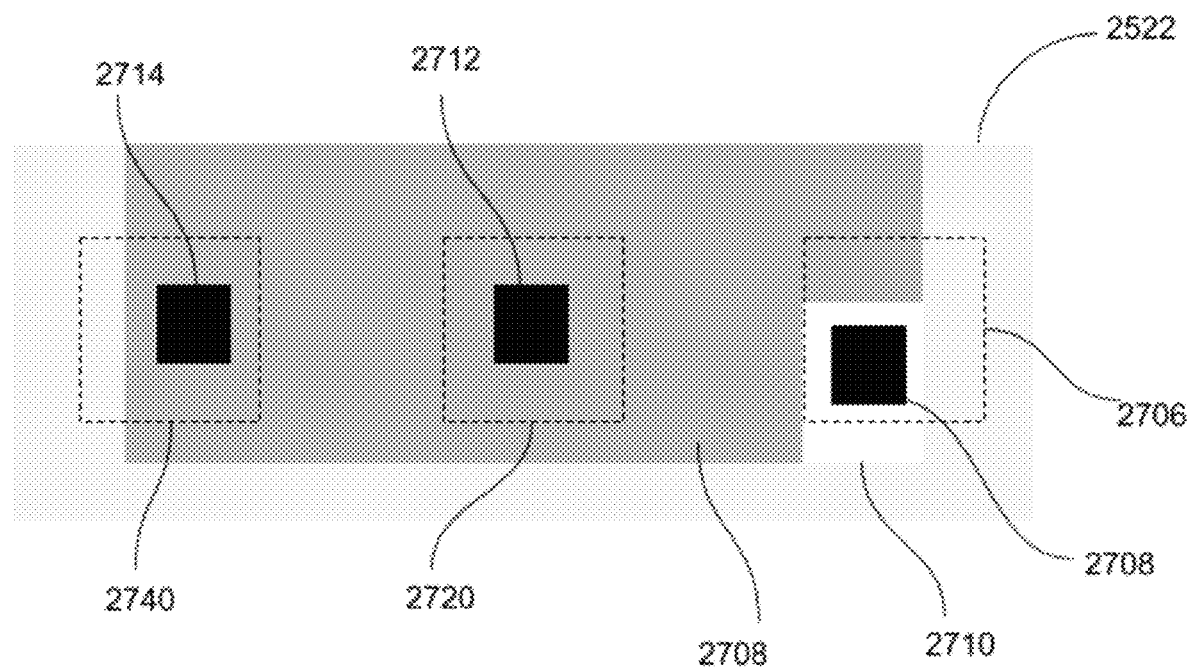
FIG. 27B shows an exemplary top view of the structure in FIG. 27A, in accordance with an embodiment of the invention.

FIG. 27B shows an exemplary top view of the structure in FIG. 27A. Here, the extension layers 2522 cover at least one side of the trench 2710 to the lower level contact 2708. The pad 2706 for that connection extends to at least one area of the extension layer 2522. Here, other contacts 2712, 2714 are connected to the device 2708 through other contact pads 2720, 2740. The other contact 2714 on the other side of the device 2708 is connected to another pad 2740 that is extended to at least another area of the extension layers 2522.

Figure 28A:
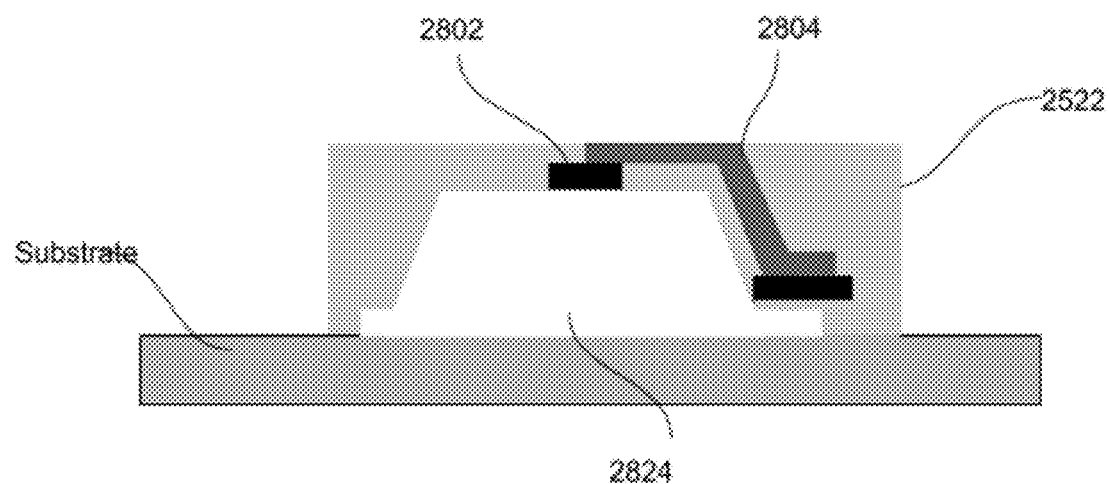
FIG. 28A is a schematic cross-sectional diagram illustrating a top contact is extended to a bottom side of the microdevice, in accordance with an embodiment of the invention.

FIG. 28A shows an embodiment where the top contact 2802 is extended to the bottom side of the device 2824. The traces of the bonding pad 2804 is covered by the extension layers 2522. After that a via through the extension layers 2522 or part of device area provide access to the device from the other side of the device. The top contact 2802 may be connected to the trace through the via.

Figure 28B:
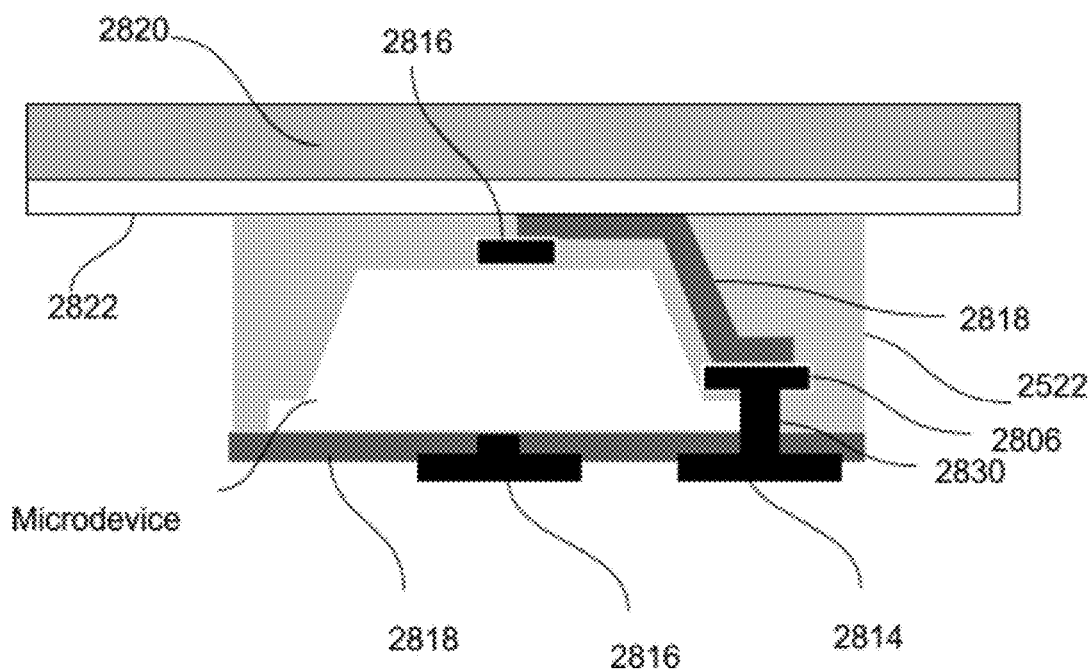
FIG. 28B is a schematic cross-sectional diagram illustrating a pad is extended to the extension layers, in accordance with an embodiment of the invention.

FIG. 28B shows an embodiment wherein the top contact 2816 can be extended to the other side of the microdevice through a trace 2818. The trace 2818 is covered by the extension layers 2522. The extension layers 2522 can be the planarization layers. A temporary substrate 2820 can be bonded on a top surface of the micro device. The extension layers 2522 can be formed on a buffer layer 2822 deposited on the substrate 2820. In one case, there can be an intermediate layer 2806 that get connected to the pad 2814 through a via 2830. In another case, it can be connected to the pad 2814 directly. The pad 2814 can be extended to the extension layers 2522.

Figure 29:
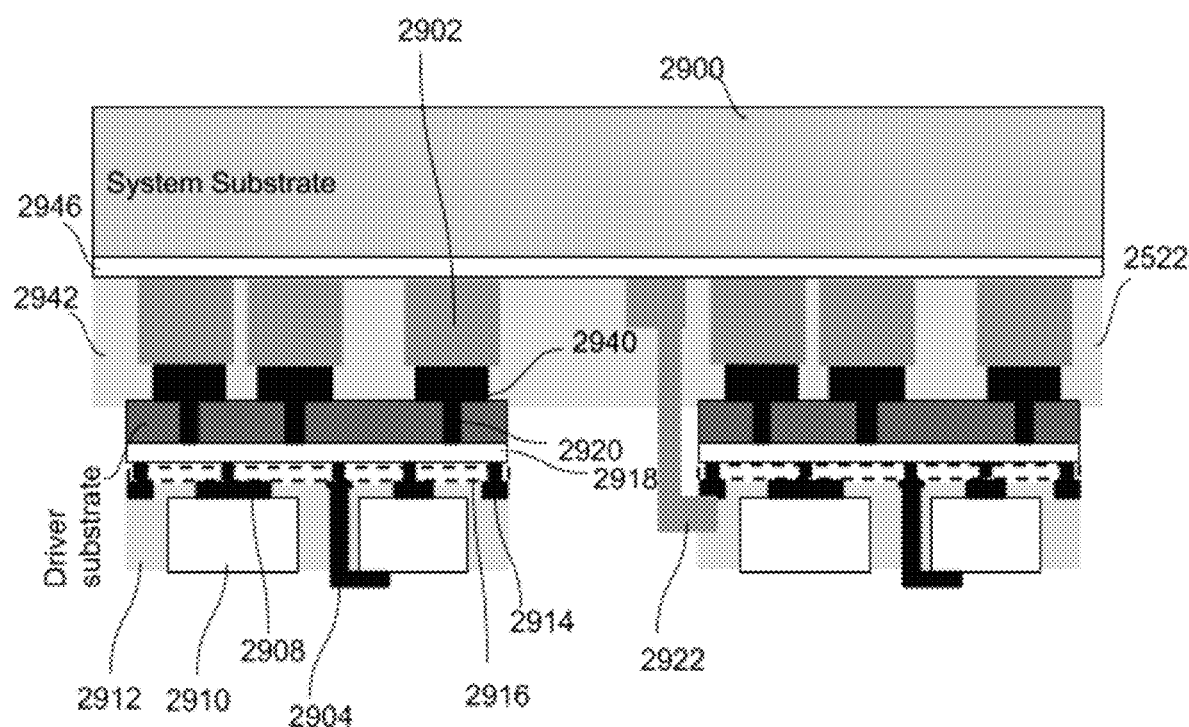
FIG. 29 is a schematic cross-sectional diagram illustrating a device substrate in accordance with an embodiment, in accordance with an embodiment of the invention.

FIG. 29 shows an embodiment having plurality of micro devices connected to a driver substrate according to one embodiment of the invention. The driver substrate can include pixel circuits 2918. The micro devices 2910 coupled to the pixel circuits either through bonding pads 2908 or through traces 2904 deposited to cover at least one contact point in the device and one contact point in the driver substrate coupled to the pixel circuit. The driver substrate can have contact pads 2940 on a side different from the side where the microdevices 2910 are located. These contact pads 2940 are either coupled to the pixel circuits 2918 or to the microdevices through a via 2920 in the substrate. There can be a polarization/dielectric layer 2916 between a part of microdevice and part of the driver substrate. There can be further planarization/encapsulation layer 2912 after the microdevices 2910 are integrated in the driver substrate. The driver substrate is then coupled to the system substrate either through the bonding pads 2940 on the driver substrate and the pads 2902 on system substrate 2900 or through traces 2922 deposited to cover at least one contact point in the driver substrate and one contact point in the system substrate 2900. The system substrate 2900, can have extra circuitry or contact layers 2946 that enable accessing the driver substrate. The bonding agent 2942 provide mechanical reliability and can also be used as a coupling agent as well. In one case, the bonding agent 2942 can be patterned to be only in selected areas. There can be planarization and bonding agent 2940 between system substrate 2900 and driver substrate. Here, a plurality of micro devices 2910 such as red, green and blue can be provided. The plurality of micro devices can be connected together to a driver substrate forming a cell.

According to one embodiment, a method to integrate one or more microdevices to a system substrate is provided. The method comprising transferring the one or more microdevices to the system substrate, forming a protective layer to cover the one or more microdevices, extended beyond the edges of the one or more microdevices, patterning the protective layer to receive conductive electrodes and connecting backplane elements to the one or more microdevices through the conductive electrodes. The conductive electrodes include individual electrodes for each micro device.

According to another embodiment, the protective layer comprises a planarization layer, wherein the planarization layer is one of: a continuous planarization layer or a patterned planarization layer.

According to yet other embodiments, the method may further comprising forming a plurality of another planarizing layers over the protective layer covering each micro device. The plurality of another planarizing layers is one of: an extension of the protective layer, a passivation layer, another protective layer or any other separate layer. The protective layer is removed before formation of the conductive electrodes that connects the one or more microdevices to the backplane elements.

According to some embodiment, patterning the protective layer comprising forming a plurality of vias in the protective layer before the formation of the conductive electrodes that connects the one or more microdevices to the backplane elements. The plurality of vias are provided at different locations of the microdevices to provide connection to the backplane elements and a metallization layer or a common electrode is directly deposited to the one or more microdevices.

According to further embodiments, the method may further comprising forming a buffer layer between the one or more microdevices and the system substrate, forming a plurality of other layers on top of the backplane elements, wherein the plurality of other layers comprises one of: a passivation layer, a color conversion layer, an optical enhancement layer, a touch electrode, or a common electrode, performing post processing steps on a surface of the plurality of other layers separated from the system substrate, wherein the post processing steps include at least one of: opening of one or more of the plurality of other layers, removing one or more of the plurality of other layers, forming different electrodes, forming optical layers, forming color conversion/filter layers, or forming passivation layer, integrating a secondary system substrate to the plurality of other layers; and removing the system substrate after integration of the secondary system substrate.

According to some embodiments, the buffer layer comprises another protective layer to protect the micro devices during separation process and a plurality of another vias are formed in the buffer layer to a side opposite to a first side of microdevices to provide coupling options to the micro devices.

According to further embodiments, the method may further comprising providing one or more color conversion layers disposed on the substrate surface or buffer layer surface opposite to the surface of the micro device and providing one or more additional layers on the color conversion layers underside the microdevices, wherein the additional layers comprise one of: a color filter, a black matrix, a bank layer, a blocking layer, a reflective layer, a passivation layer and a planarization layer. The planarization layer is a support layer comprises one of: a continuous planarization layer or a patterned planarization layers, and wherein another patterned planarization layer is provided over the microdevices and backplane.

According to another embodiment, a display system is provided. The display system comprising: a substrate, a buffer layer deposited over the substrate, a bonding pad formed on a top surface of the buffer layer, at least one micro device transferred on top of the bonding pad; and one or more color conversion layers disposed on the substrate surface or buffer layer surface opposite to the surface of the micro device. The buffer layer is modified to separate the substrate from the display system, wherein the buffer layer is thinned or removed.

According to one embodiment, the display may further comprising: a first reflective layer formed over the buffer layer before the bonding pad, one or more planarization layers formed on or over the at least one microdevice, a second reflective layer that covers the one or more planarization layers; and a backplane formed and extended over the one or more planarization layers. the bonding pad is transparent to allow light gets inside or outside of the micro device.

According to another embodiment, the display may further comprising: a black matrix deposited between the color conversion layers, opposite to the surface of the micro device, to reduce ambient reflection and color mixing of the micro device; and a bank layer formed for the color conversion layers to separate different color conversion layers.

According to some embodiments, the display may further comprising at least one contact deposited over the micro device, through a via in the one or more planarization layers, to provide an electrode to connect the micro device to the backplane.

According to another embodiment, a method of manufacturing a display system may be provided. The method may comprising providing a substrate, depositing a buffer layer over the substrate, forming a bonding pad on a top surface of the buffer layer, transferring at least one micro device on top of the bonding pad; disposing one or more color conversion layers on the substrate surface opposite to the surface of the micro device, and forming a reflective layer over the buffer layer on the surface of the bonding pad opposite to the micro device.

According to one embodiment, a display system may be provided. The display system may comprising: a substrate, one or more planarization layers formed over the substrate, a bonding pad formed on a top surface of the one or more planarization layers, at least one micro device transferred on top of the bonding pad; and one or more color conversion layers disposed on or over the micro device. The bonding pad comprises a light distribution structure and a bonding layer, the light distribution structure is one of: a part of the bank layer with a reflective layer or fills the entire bank layer and the reflective layer is formed over the planarization layer before the bonding pad to direct light through the light distribution pad.

According to some embodiments, an optoelectronic device may be provided. The optoelectronic device may comprising a plurality of semiconductor layers, disposed on a substrate, forming a top surface and a bottom surface, wherein the plurality of semiconductor layers having isolated areas forming at least one side surface, at least one conductive pad coupled to the optoelectronic device on at least one of the top or the bottom surface; and one or more extension layers formed around the optoelectronic device at the at least one side surface, wherein the at least one conductive pad is extended to the one or more extension layers. The one or more extension layers covers at least one side of the optoelectronic device and the at least one contact layer provided through an opening in the one or more extension layers.

According to another embodiment, the one or more extension layers covers at least one side of the optoelectronic device and the at least one contact layer provided through an opening in the one or more extension layers.

According to one embodiment, the device may further comprising a dielectric layer formed around the at least one contact and extended over the one or more extension layers. The at least one conductive pad deposited over the at least one contact layer and extended over the dielectric layer. The one or more extension layers comprises at least one of: another dielectric layer, a reflective layer and a color conversion layer. The one or more extension layers formed on a buffer layer. The one or more extension layers expand an area of the optoelectronic device, where at least one of the one or more extension layers is a polymer. Also, the width of the at least one of the one or more extension layers is between 100 nm to a few micrometers.

In summary, the present disclosure relates to the integration of circuits and systems into a microdevice substrate by providing protective layers on the donor substrate, integrating color conversion layer(s) into the micro device substrate opposite to a surface of microdevices. Some embodiments of the present disclosure also relate to expanding an area of micro devices or a bonding area of micro devices.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A display system comprising:
   micro light emitting diodes on a top surface of a buffer layer;
   at least one passivation or planarization layer covering the micro light emitting diodes;
   a reflective layer covering the at least one passivation or planarization layer coupling light from the micro light emitting diodes to the buffer layer; and
   a color conversion layer or a color filter layer contacting a bottom surface of the buffer layer, opposite from the top surface of the buffer layer with the micro light emitting diodes.

2. The display system of claim 1, further comprising contacts deposited over the micro light emitting diodes, through vias in the at least one passivation or planarization layer, to connect the micro light emitting diodes to a backplane.

* * * * *